(12) United States Patent
Eisenstadt

(10) Patent No.: US 8,549,447 B2
(45) Date of Patent: Oct. 1, 2013

(54) INTEGRATED CIRCUITS WITH MULTIPLE I/O REGIONS

(75) Inventor: Robert Eisenstadt, Los Altos, CA (US)

(73) Assignee: Robert Eisenstadt, Los Altos, CA (US)

( * ) Notice: Subject to any disclaimer, the term of this patent is extended or adjusted under 35 U.S.C. 154(b) by 417 days.

(21) Appl. No.: 12/766,880

(22) Filed: Apr. 24, 2010

(65) Prior Publication Data
US 2011/0260318 A1 Oct. 27, 2011

(51) Int. Cl.
G06F 17/50 (2006.01)

(52) U.S. Cl.
USPC ........... 716/100; 716/110; 716/119; 716/120; 716/126; 716/133

(58) Field of Classification Search
USPC .................. 716/100–105, 110, 118–127, 133
See application file for complete search history.

(56) References Cited

U.S. PATENT DOCUMENTS

| | | | |
|---|---|---|---|
| 6,222,213 B1 | 4/2001 | Fujiwara | |
| 6,550,047 B1 * | 4/2003 | Becker | 716/122 |
| 6,823,501 B1 * | 11/2004 | Dahl | 716/122 |
| 6,836,026 B1 | 12/2004 | Ali et al. | |
| 7,080,341 B2 | 7/2006 | Eisenstadt et al. | |
| 7,117,469 B1 * | 10/2006 | Dahl | 716/122 |
| 7,165,232 B2 | 1/2007 | Chen et al. | |
| 7,196,363 B2 | 3/2007 | Montagnana | |
| 7,528,484 B2 | 5/2009 | Rakshani | |
| 7,663,175 B2 | 2/2010 | Komura et al. | |
| 2005/0160389 A1 * | 7/2005 | Arai et al. | 716/9 |
| 2007/0090401 A1 * | 4/2007 | Baumann et al. | 257/203 |

\* cited by examiner

*Primary Examiner* — Paul Dinh
(74) *Attorney, Agent, or Firm* — Quine Intellectual Property Law Group, P.C.

(57) ABSTRACT

Methods and/or associated devices and/or systems for creating integrated circuits (IC's) that have multiple connected I/O regions that can be designed and implemented using commonly available standard I/O libraries in conjunction with standard IC design flows and tools and in combination with one or more novel standardized I/O region interconnect cells for interconnecting between or through otherwise separated I/O regions. Specific embodiments support a wide variety of IC's that can be developed using standard libraries and design flows including: application specific integrated circuits (ASIC's), programmable logic devices (PLDs), custom IC's, analog IC's, CPU's, GPU's, and other IC's that require large numbers of input/ouput (IO) circuits while having relatively small core circuitry areas. Specific embodiments may involve innovative I/O cell functions, innovative IC topologies, and innovative IC packaging solutions for single die packages and multiple die packages.

27 Claims, 58 Drawing Sheets

(Example IC with 2 I/O rings that use Feed-through Filler (FTF) cells to pass signals to and from the IC's core)

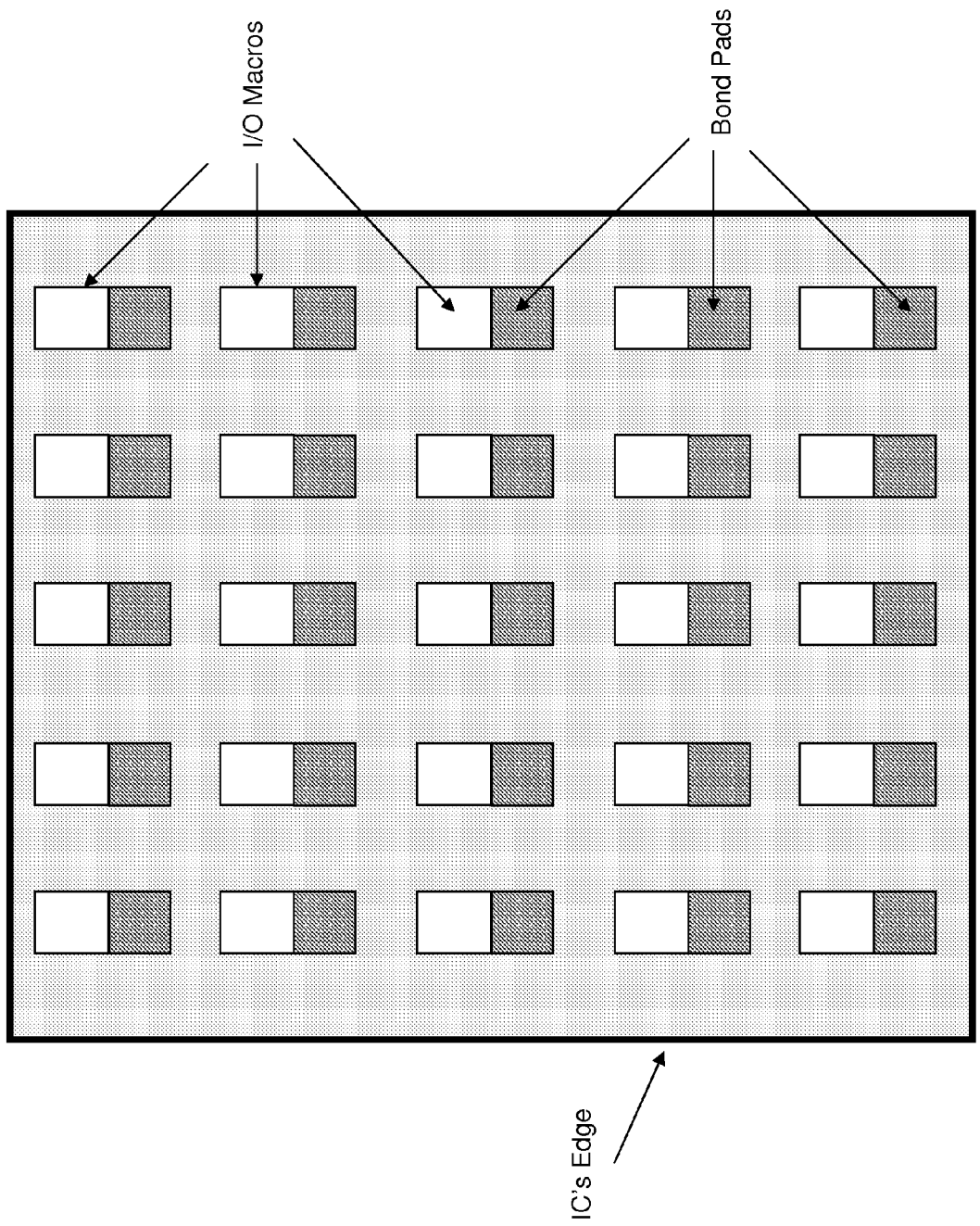
FIG. 6 (PRIOR ART, Flip Chip with I/O macros with bond pads distributed across the IC)

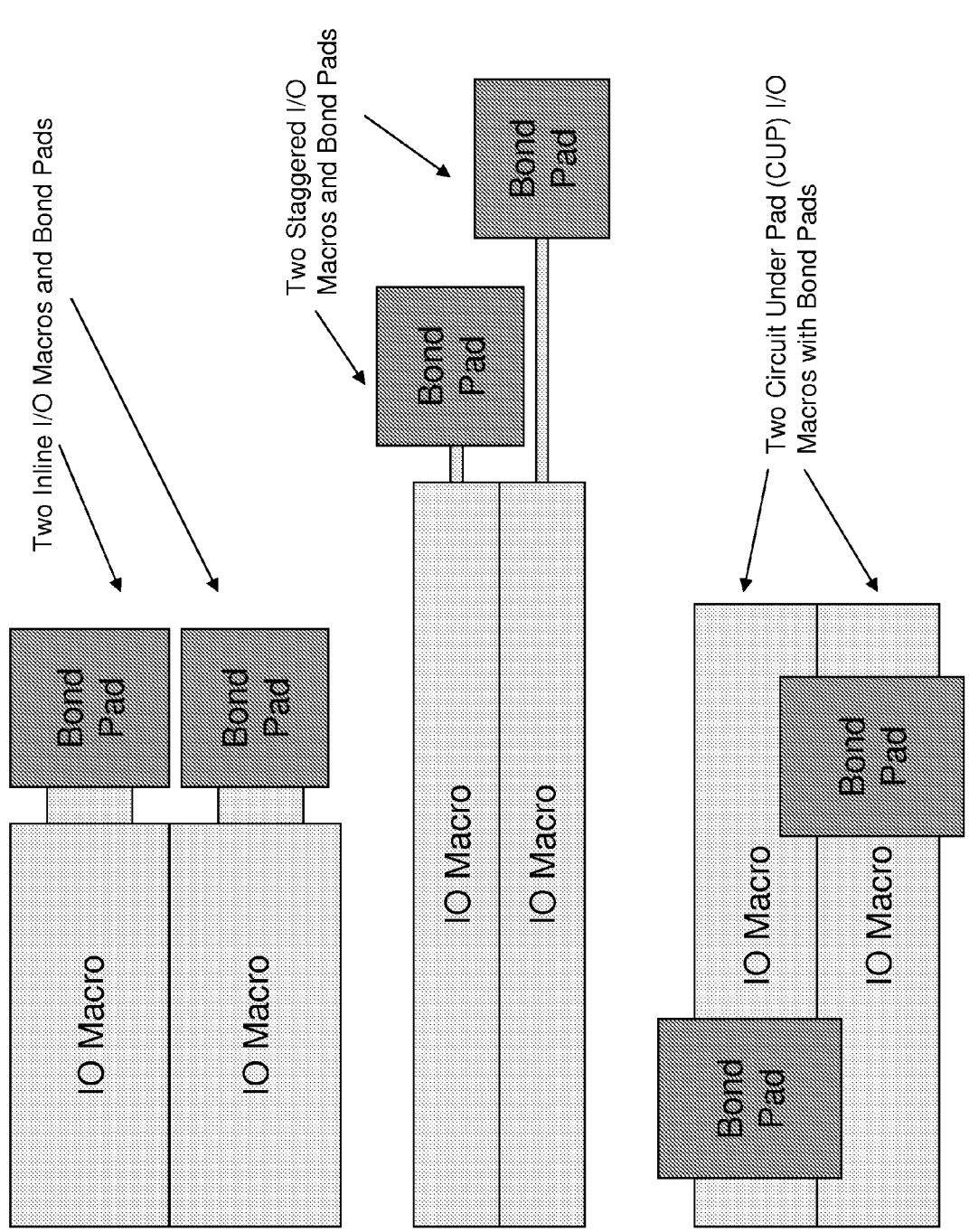
Fig 7. (Prior Art, IO Macro Bond Pad Implementation Examples of InLine, Staggered and CUP implementations)

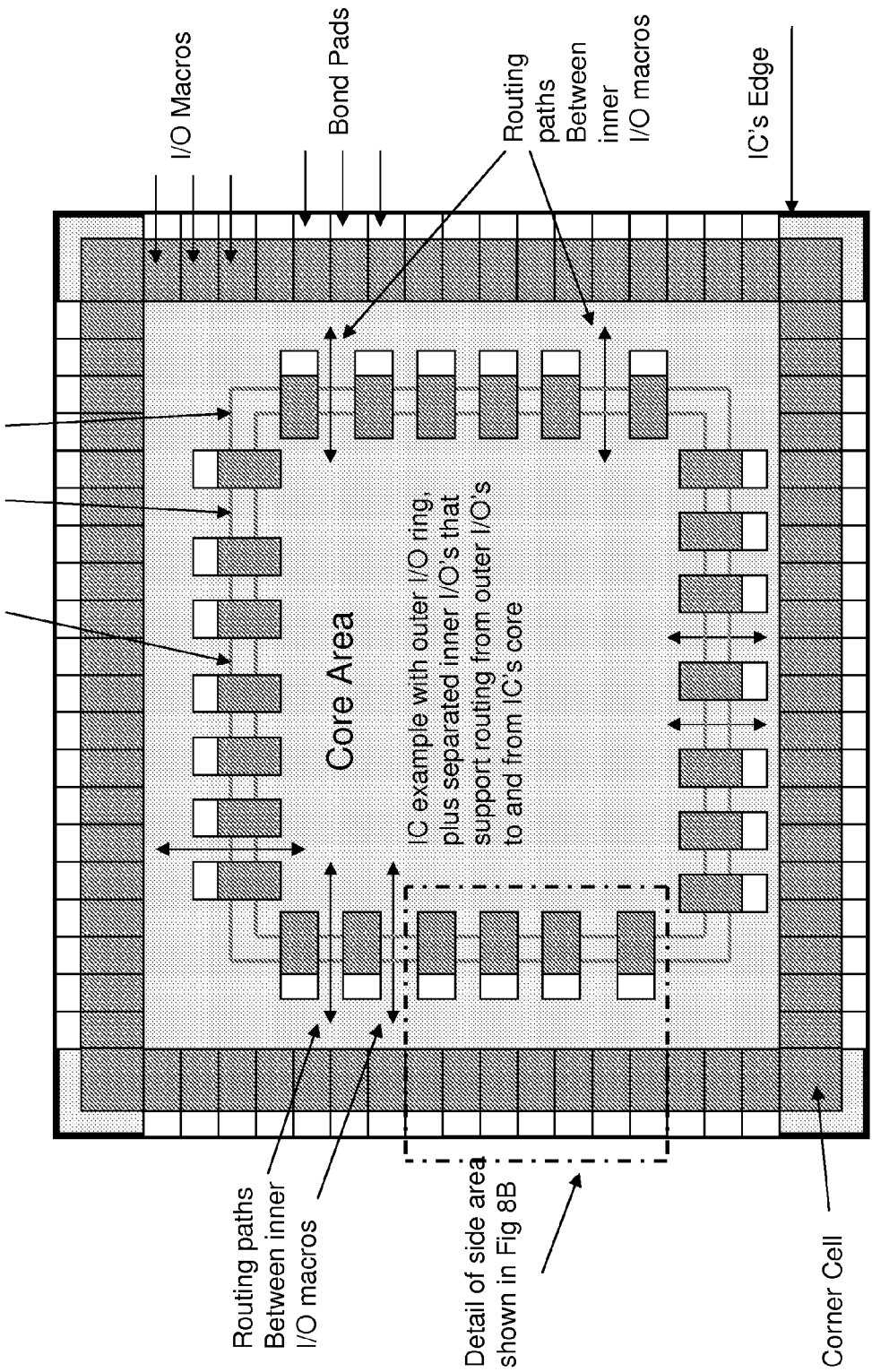
FIG. 8A (PRIOR ART, Flip Chip with outer I/O ring plus inner I/O's that are separated so signals can route between them), US Patent 6222213

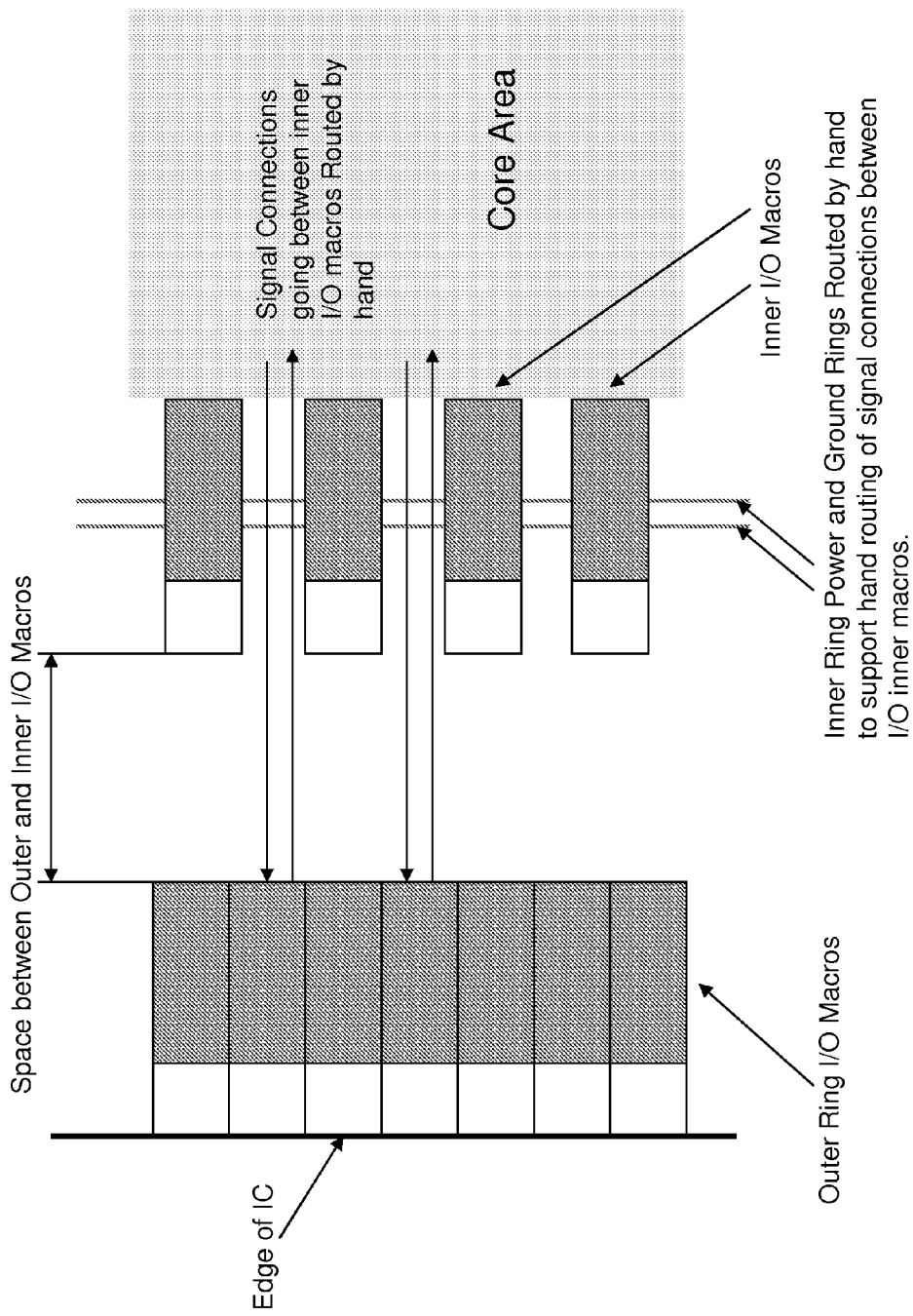
FIG. 8B (Detailed View PRIOR ART FIG 8, Flip Chip with portion of left outer I/O ring plus 4 inner I/O's) US Patent 6222213

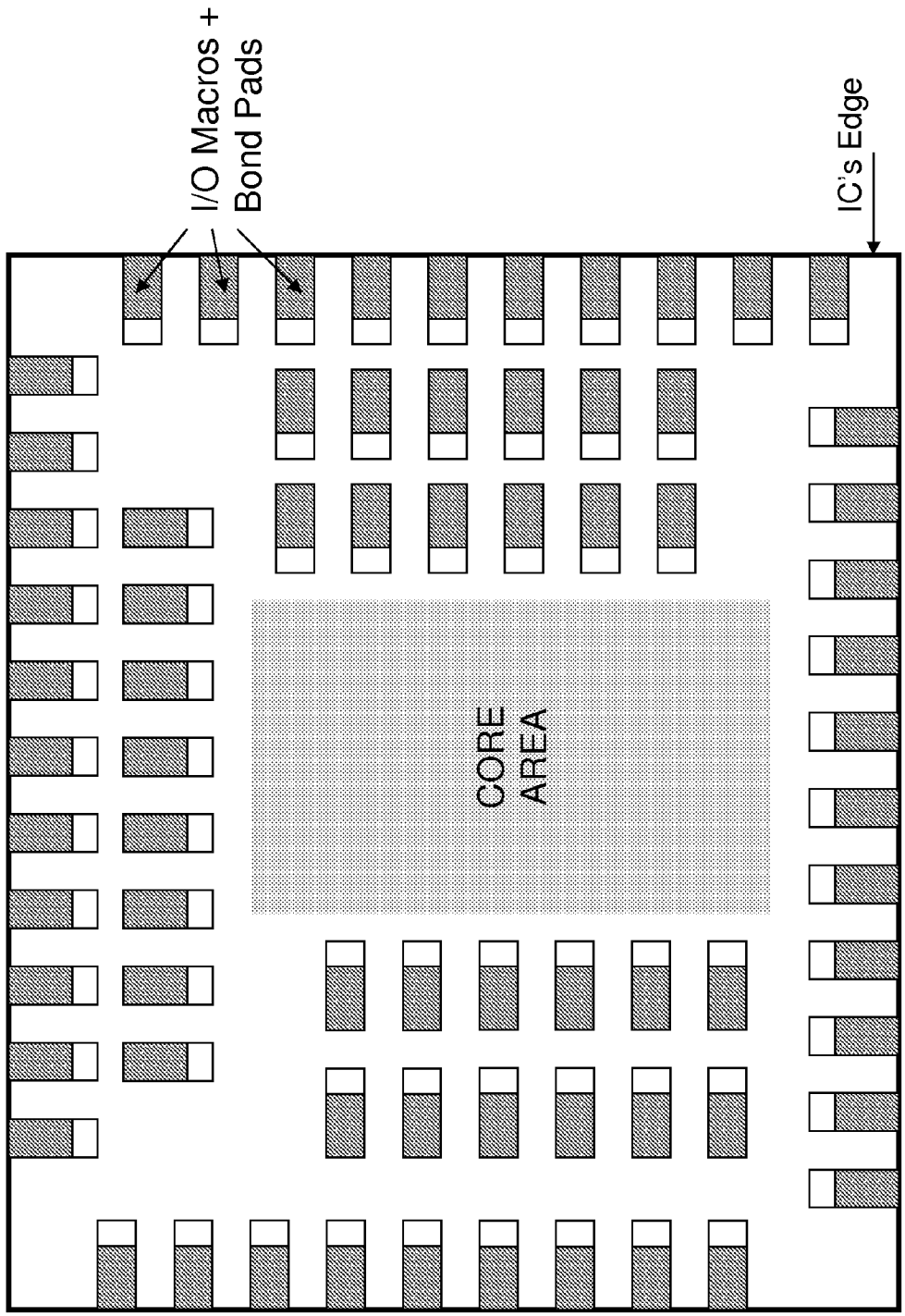
FIG. 9 (PRIOR ART) Ref US Patent 7165232

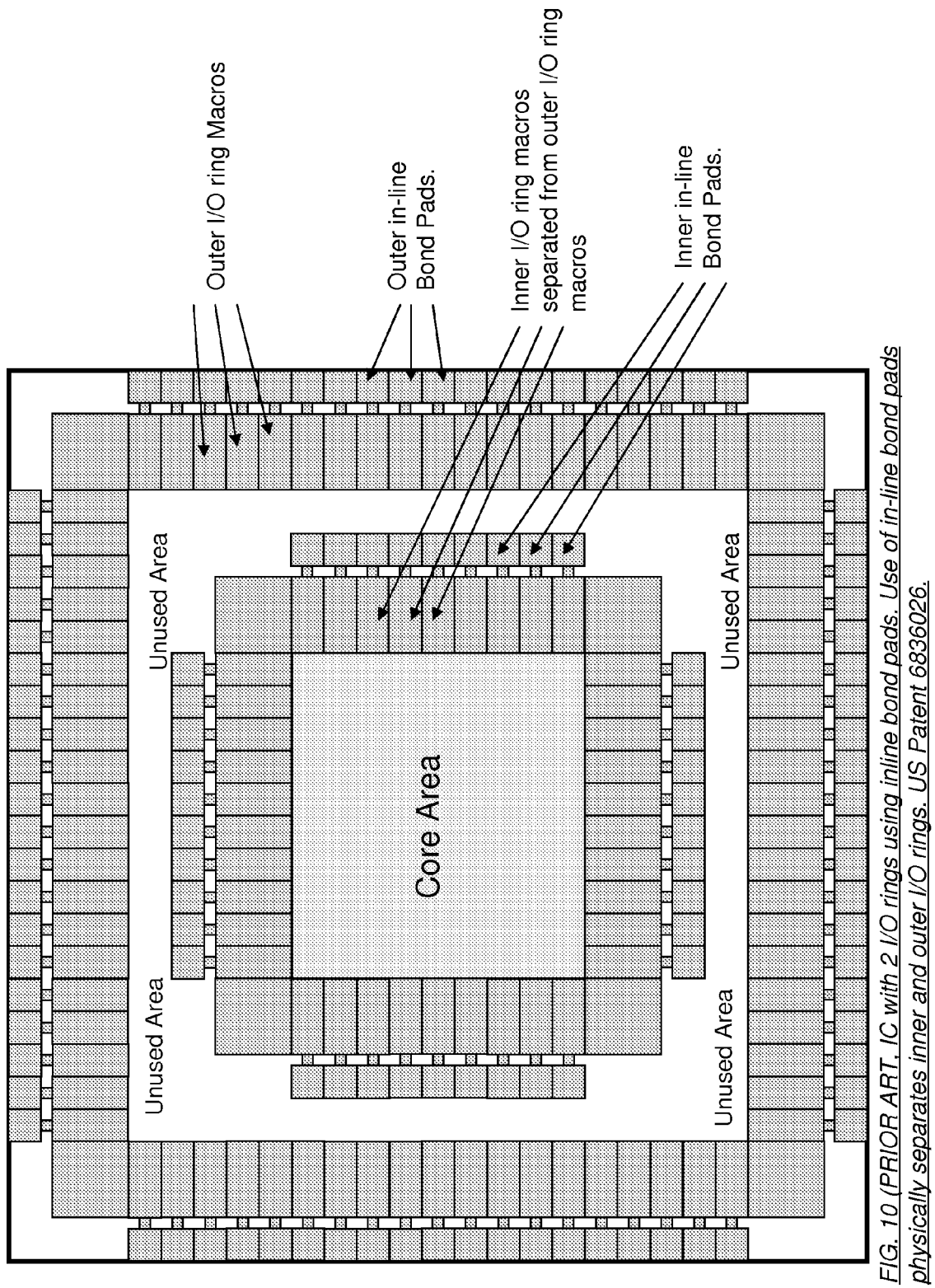
FIG. 10 (PRIOR ART, IC with 2 I/O rings using inline bond pads. Use of in-line bond pads physically separates inner and outer I/O rings. US Patent 6836026.

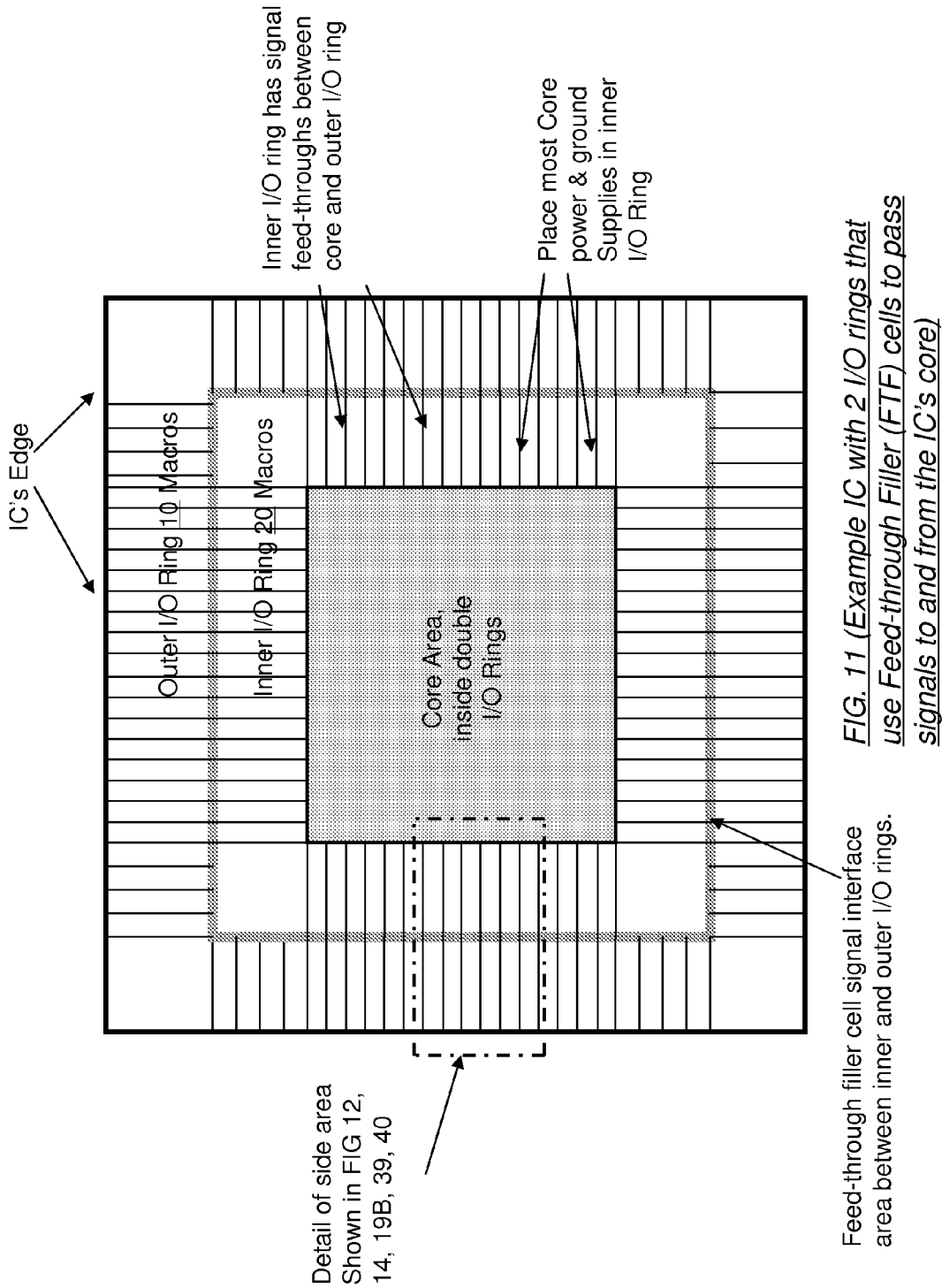
FIG. 11 (Example IC with 2 I/O rings that use Feed-through Filler (FTF) cells to pass signals to and from the IC's core)

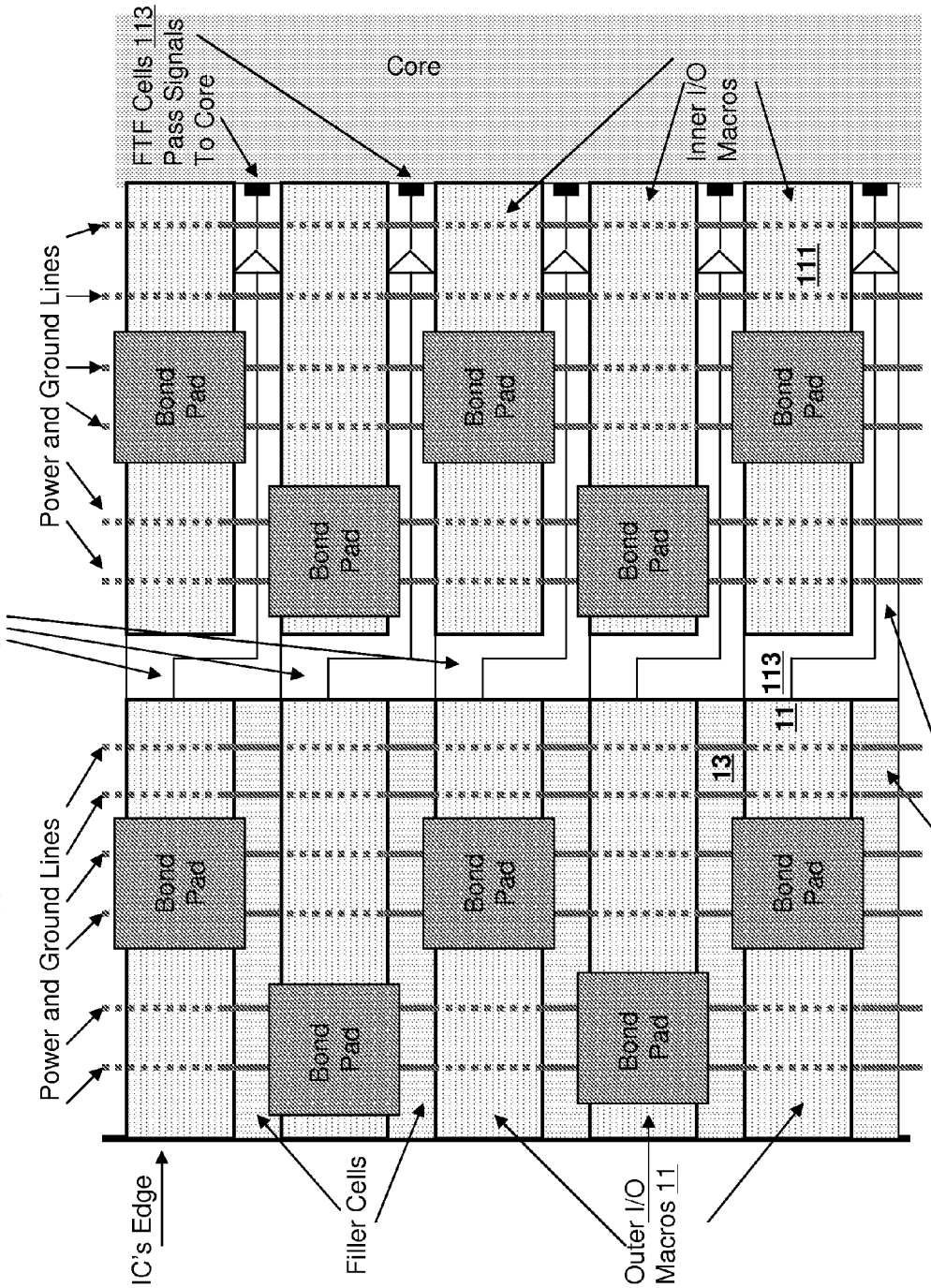
FIG. 12 (Detailed example with 2 I/O Rings)

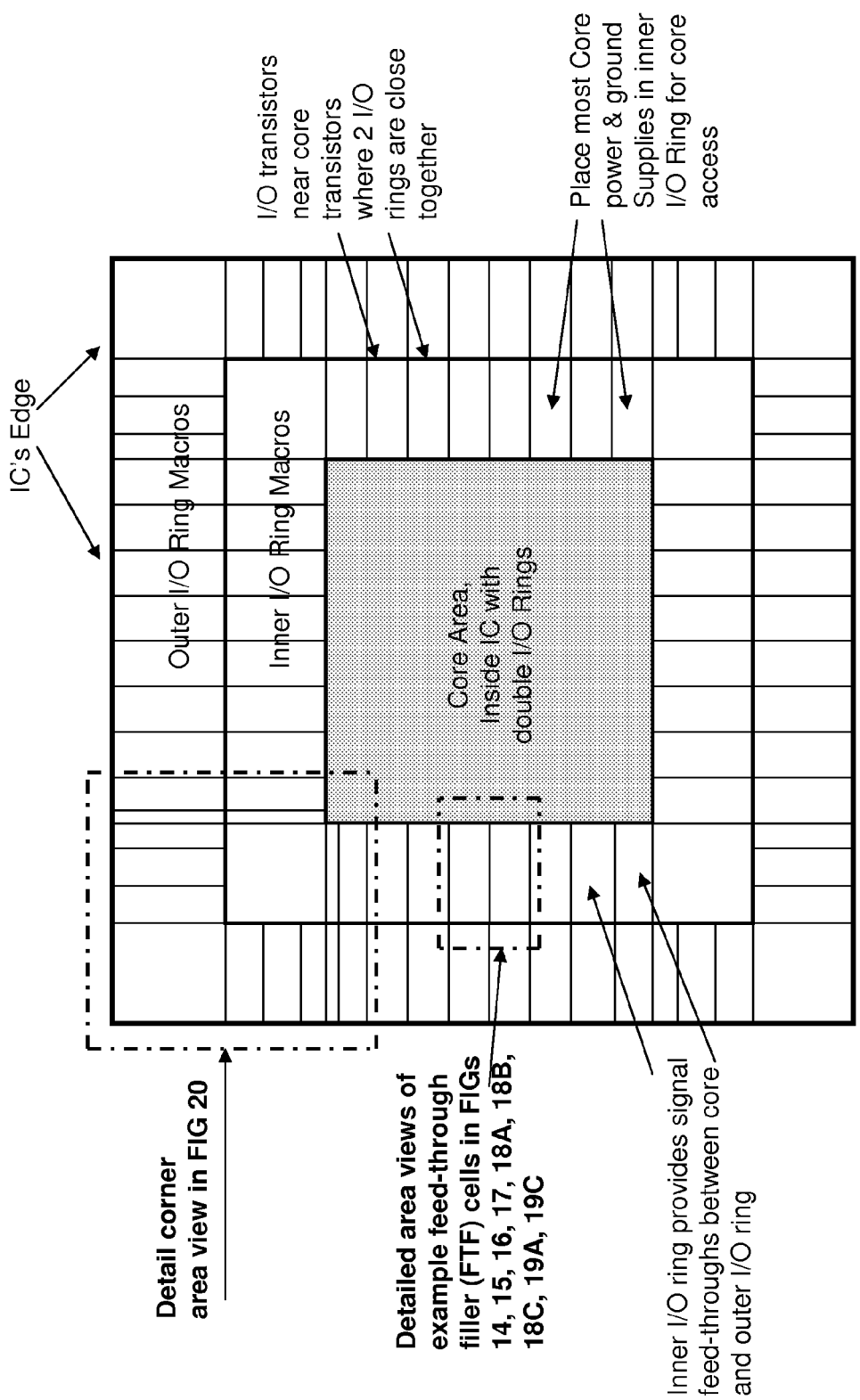
FIG. 13 (Example IC with 2 I/O rings that uses Feed-through Filler (FTF) Cells)

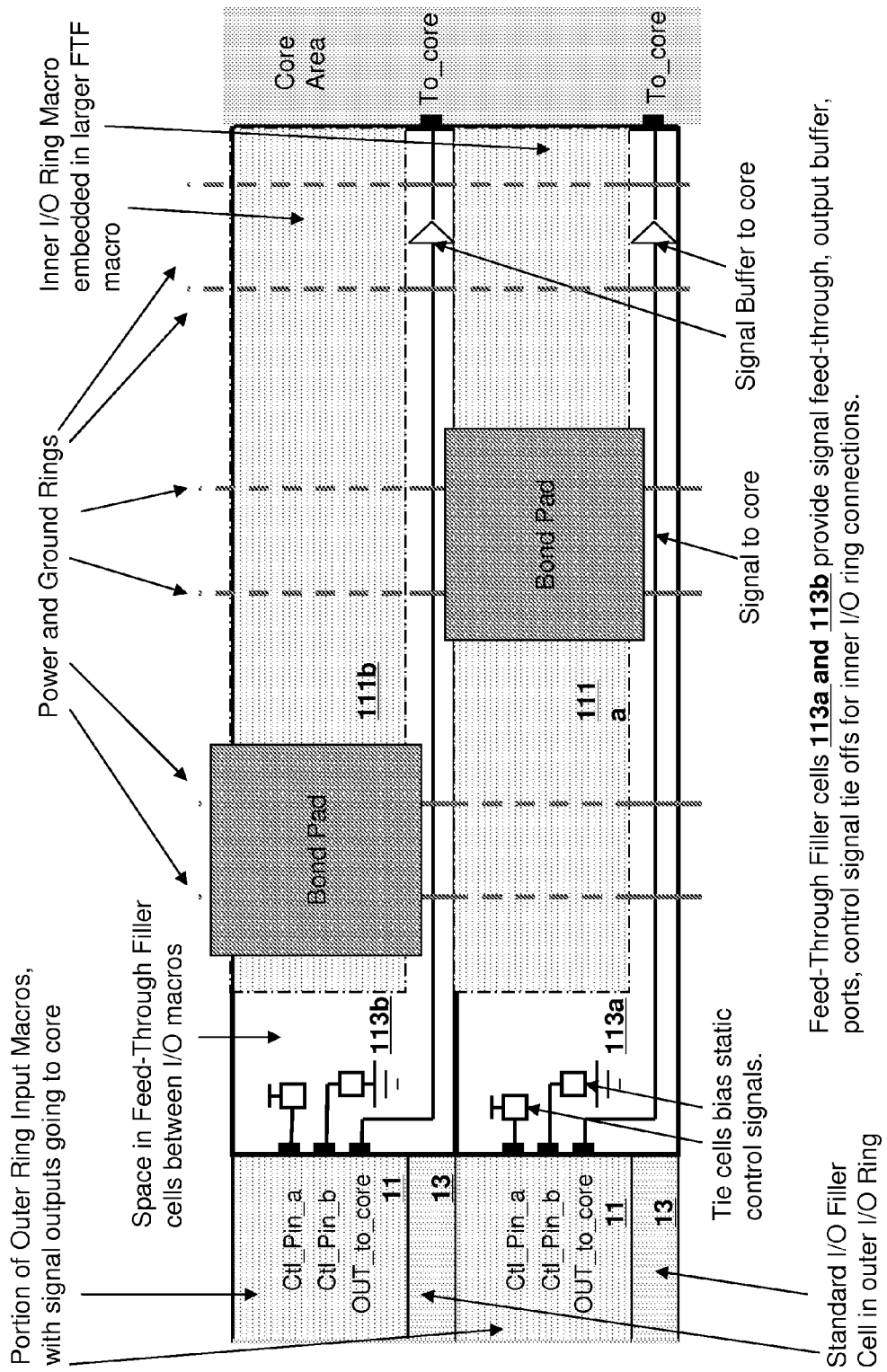
FIG. 14 (Detailed Example with 2 Input Feed-through Filler Cells)

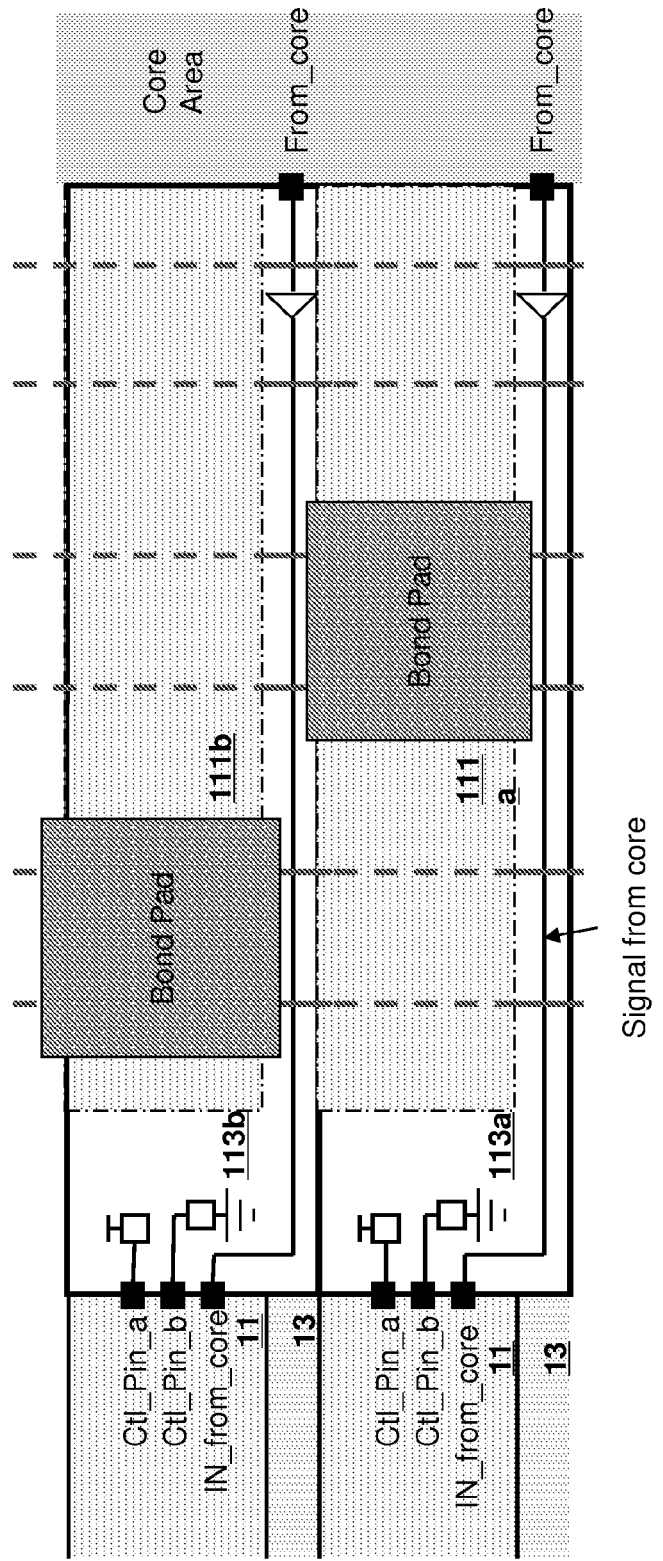
FIG. 15 (Detailed Example with 2 Output Feed-through Filler Cells)

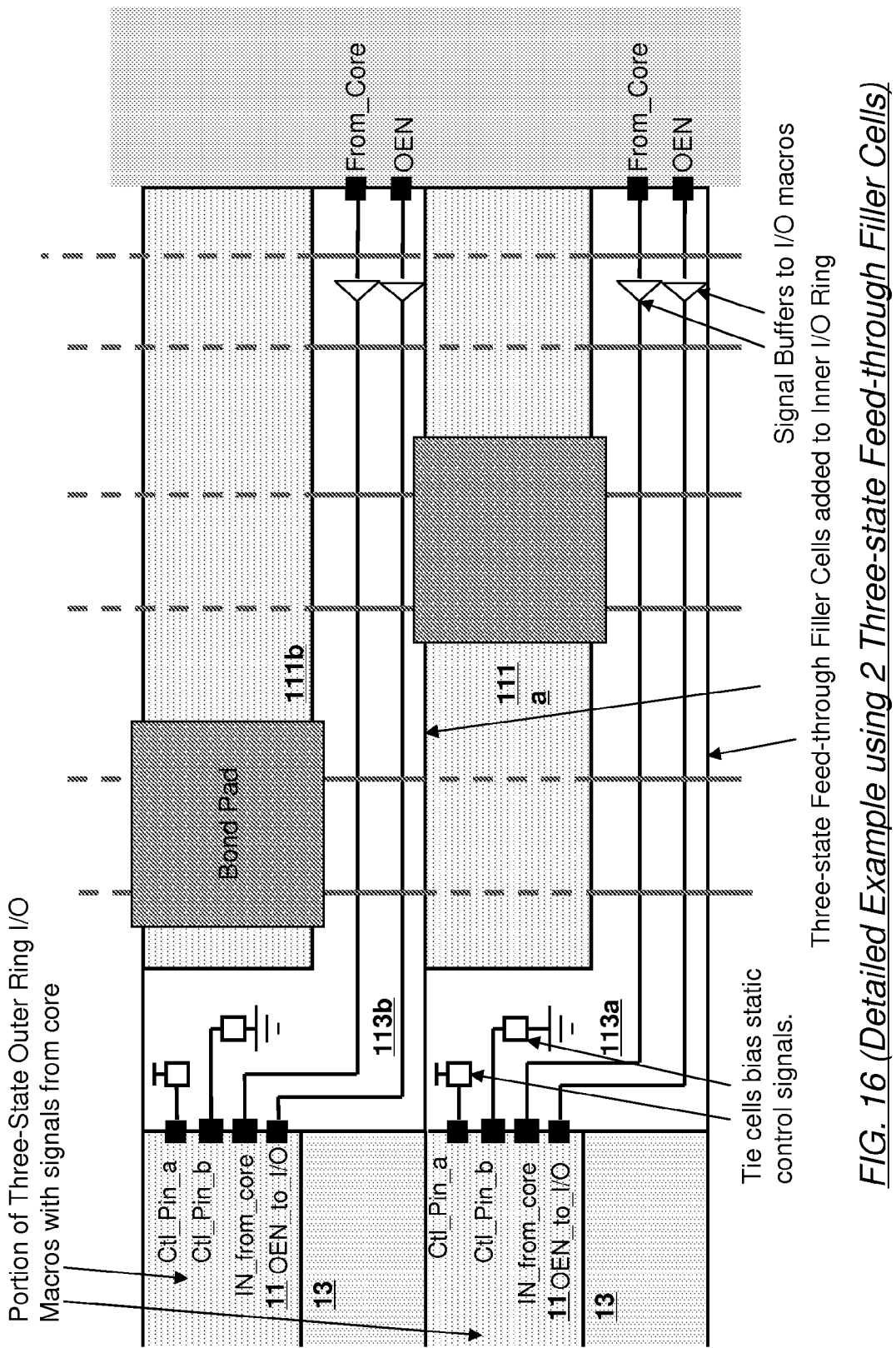
FIG. 16 (Detailed Example using 2 Three-state Feed-through Filler Cells)

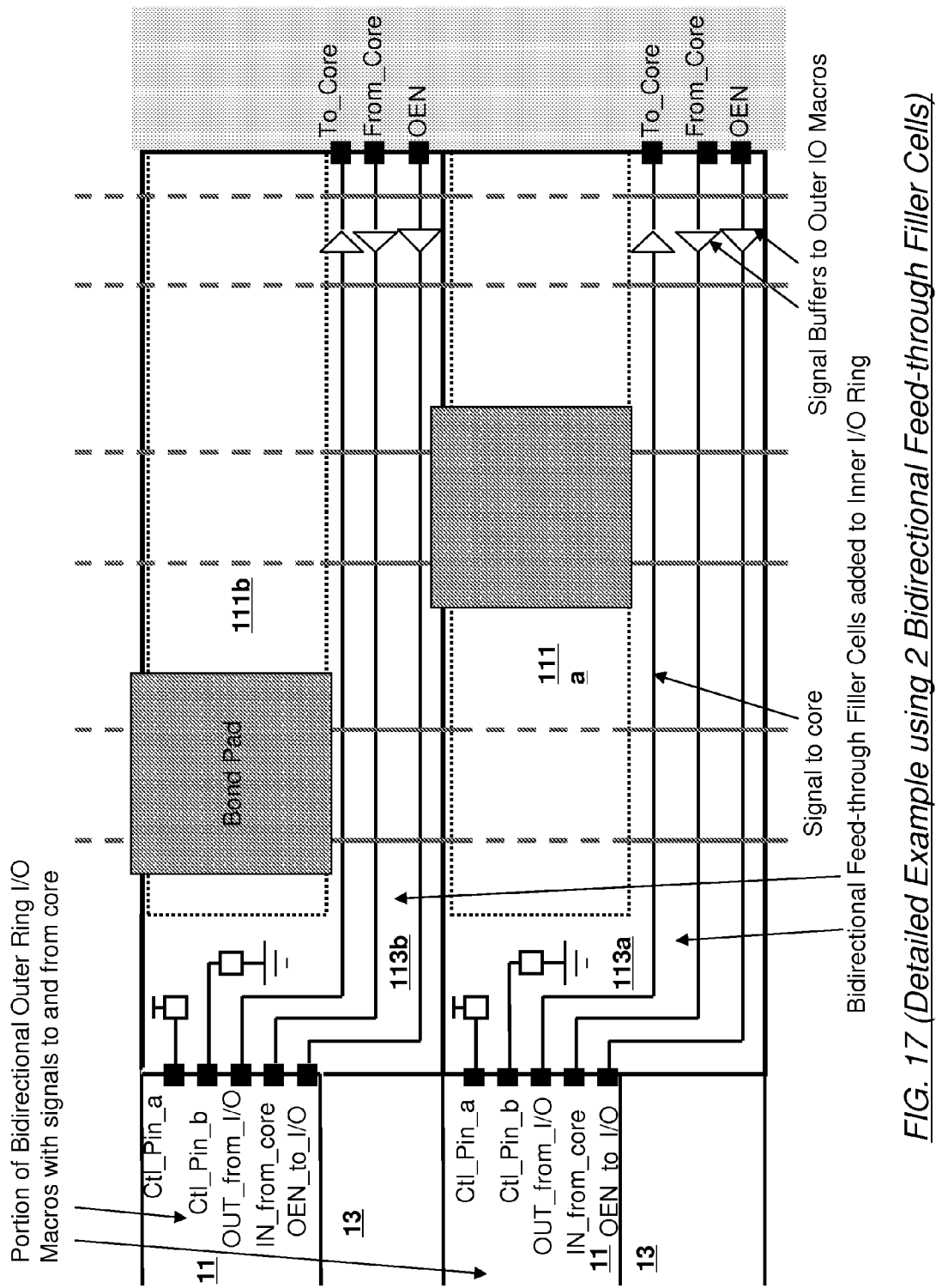
FIG. 17 (Detailed Example using 2 Bidirectional Feed-through Filler Cells)

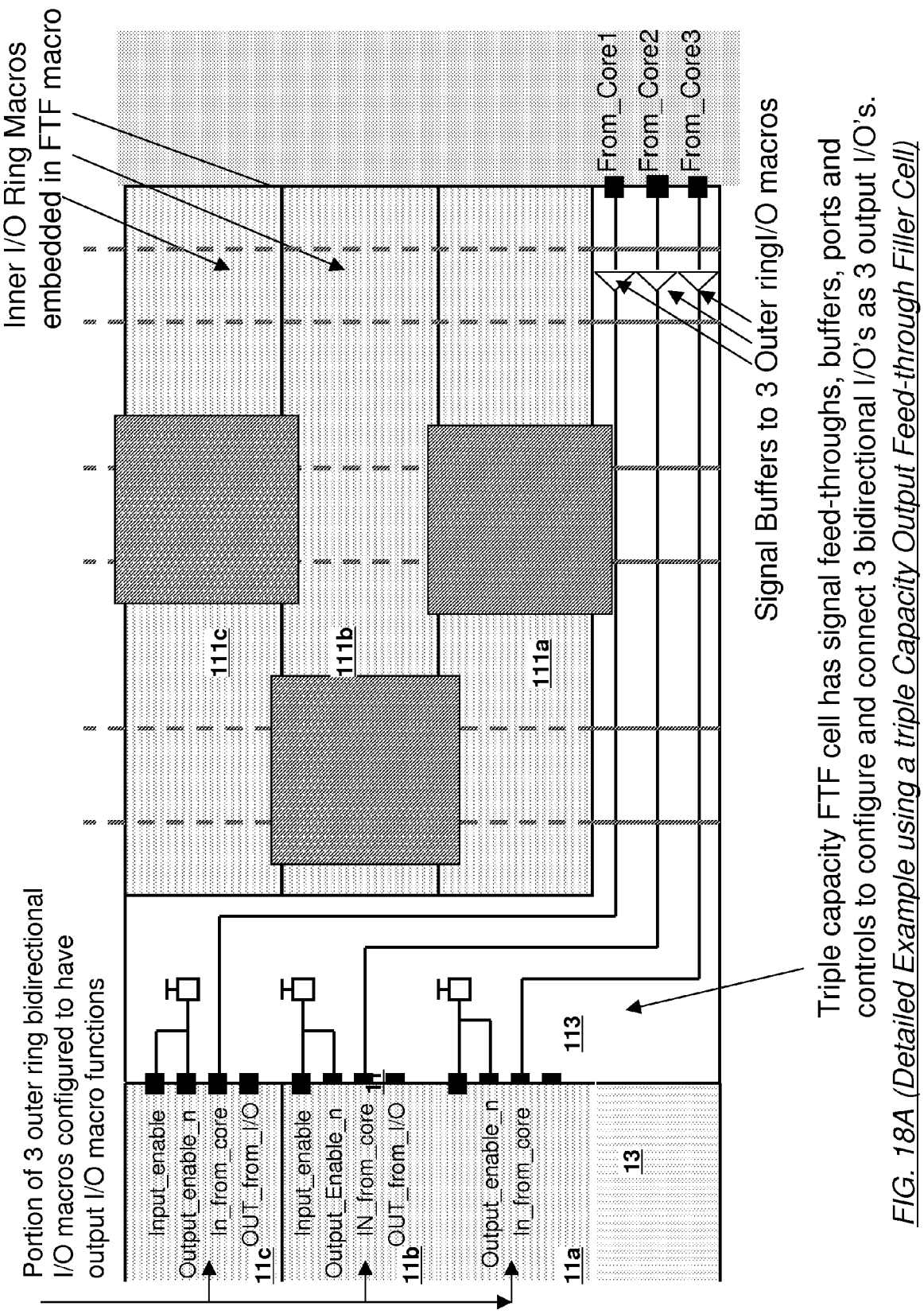
FIG. 18A (Detailed Example using a triple Capacity Output Feed-through Filler Cell)

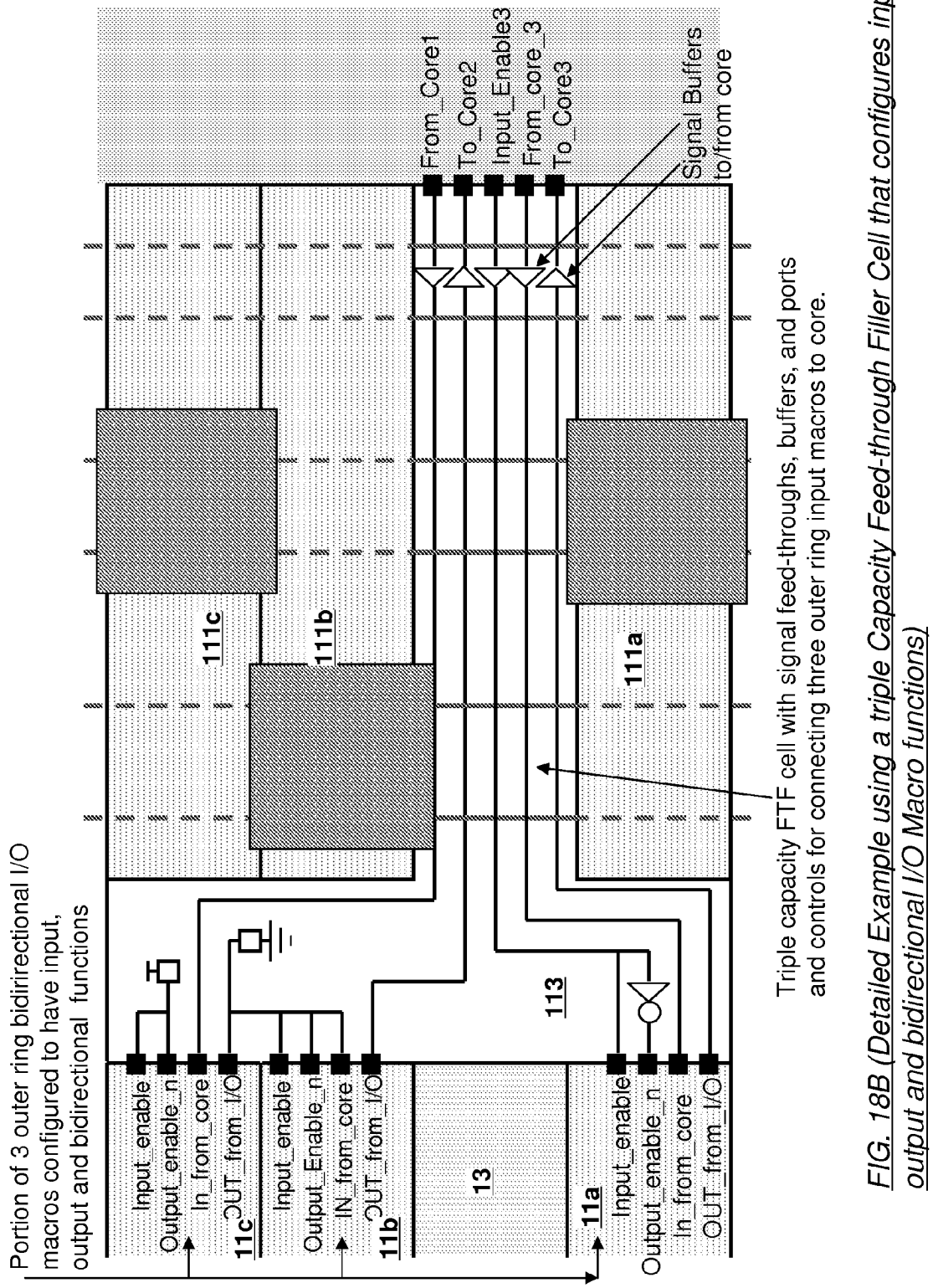
FIG. 18B (Detailed Example using a triple Capacity Feed-through Filler Cell that configures input, output and bidirectional I/O Macro functions)

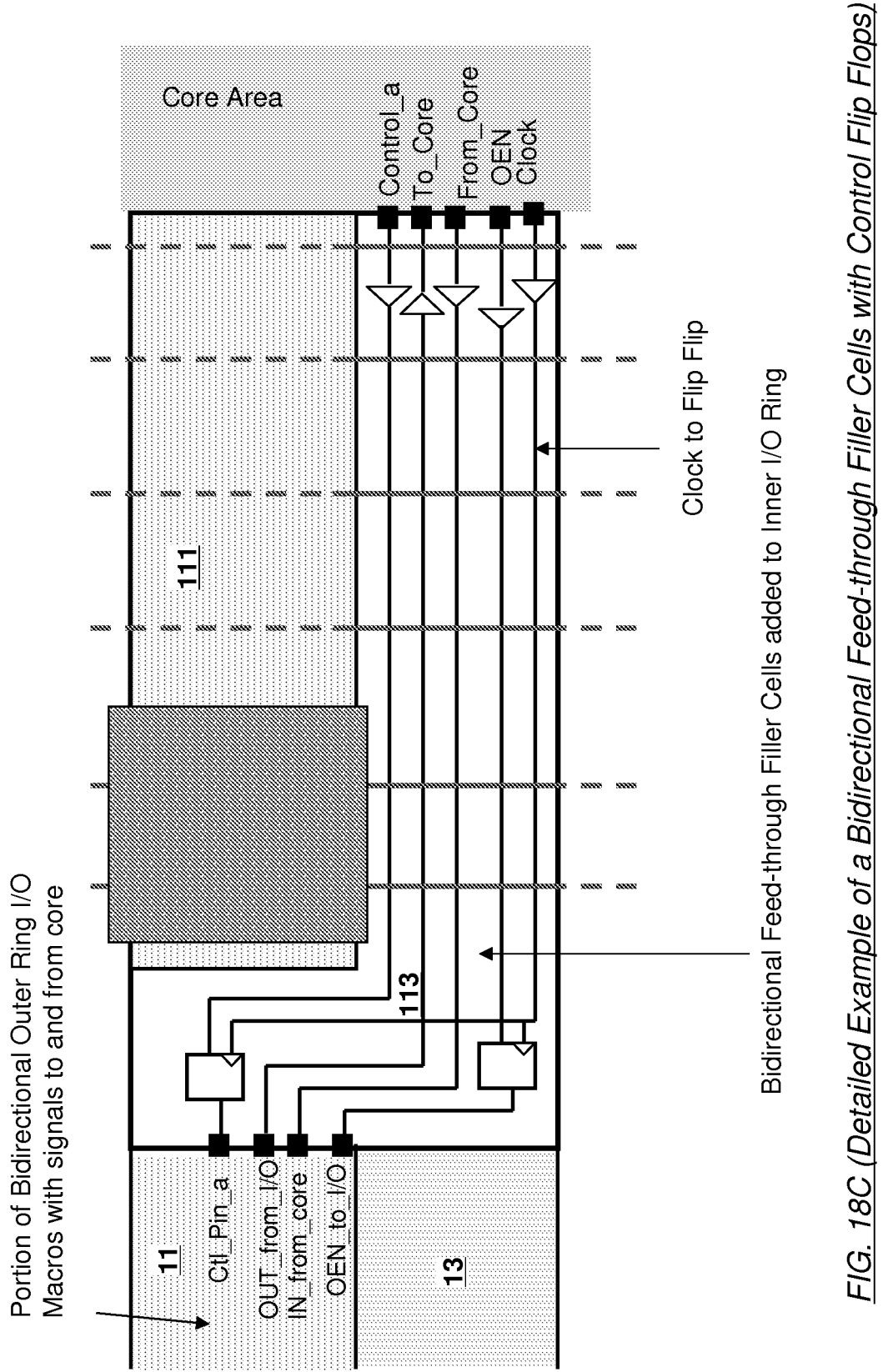
FIG. 18C (Detailed Example of a Bidirectional Feed-through Filler Cells with Control Flip Flops)

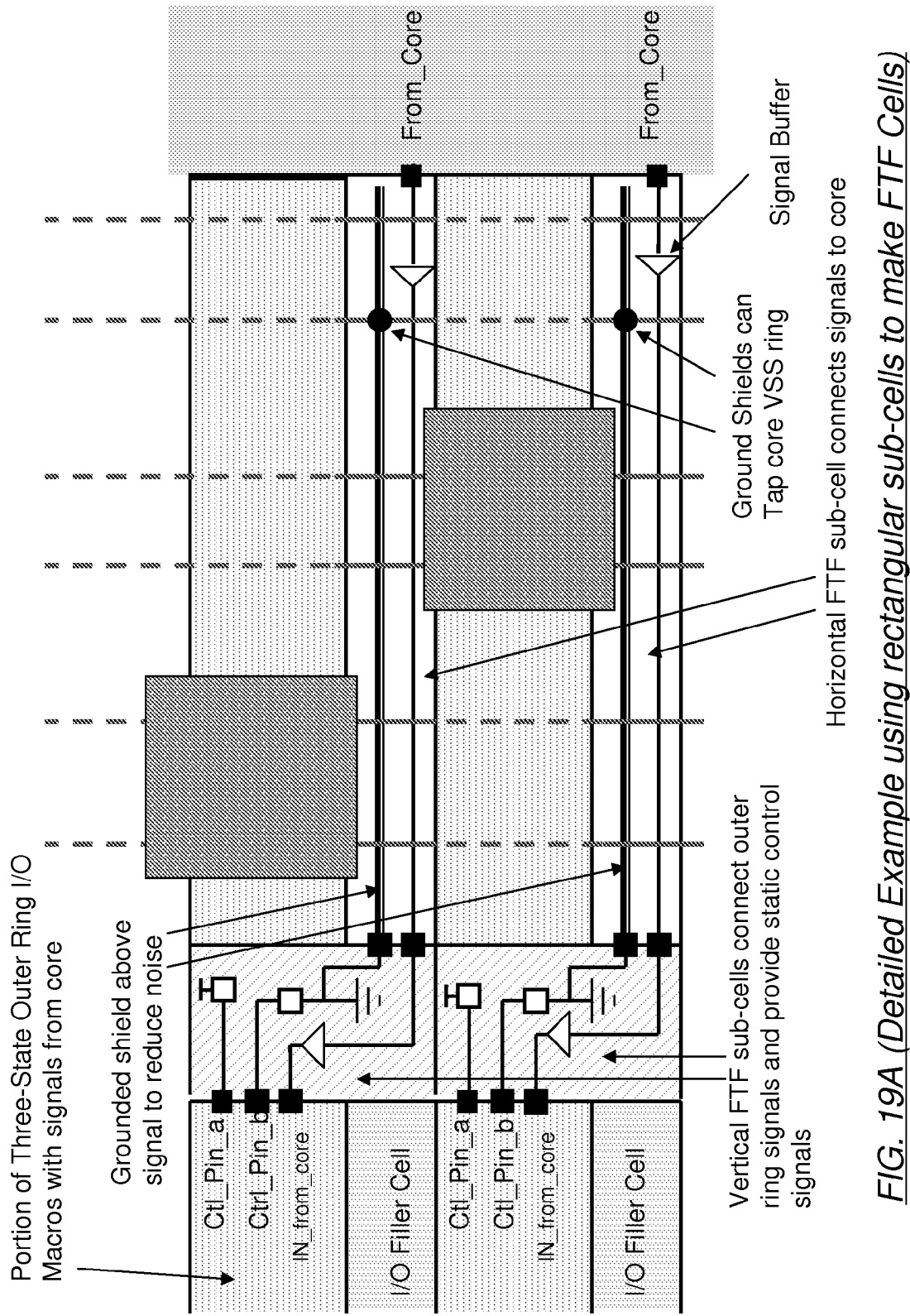
FIG. 19A (Detailed Example using rectangular sub-cells to make FTF Cells)

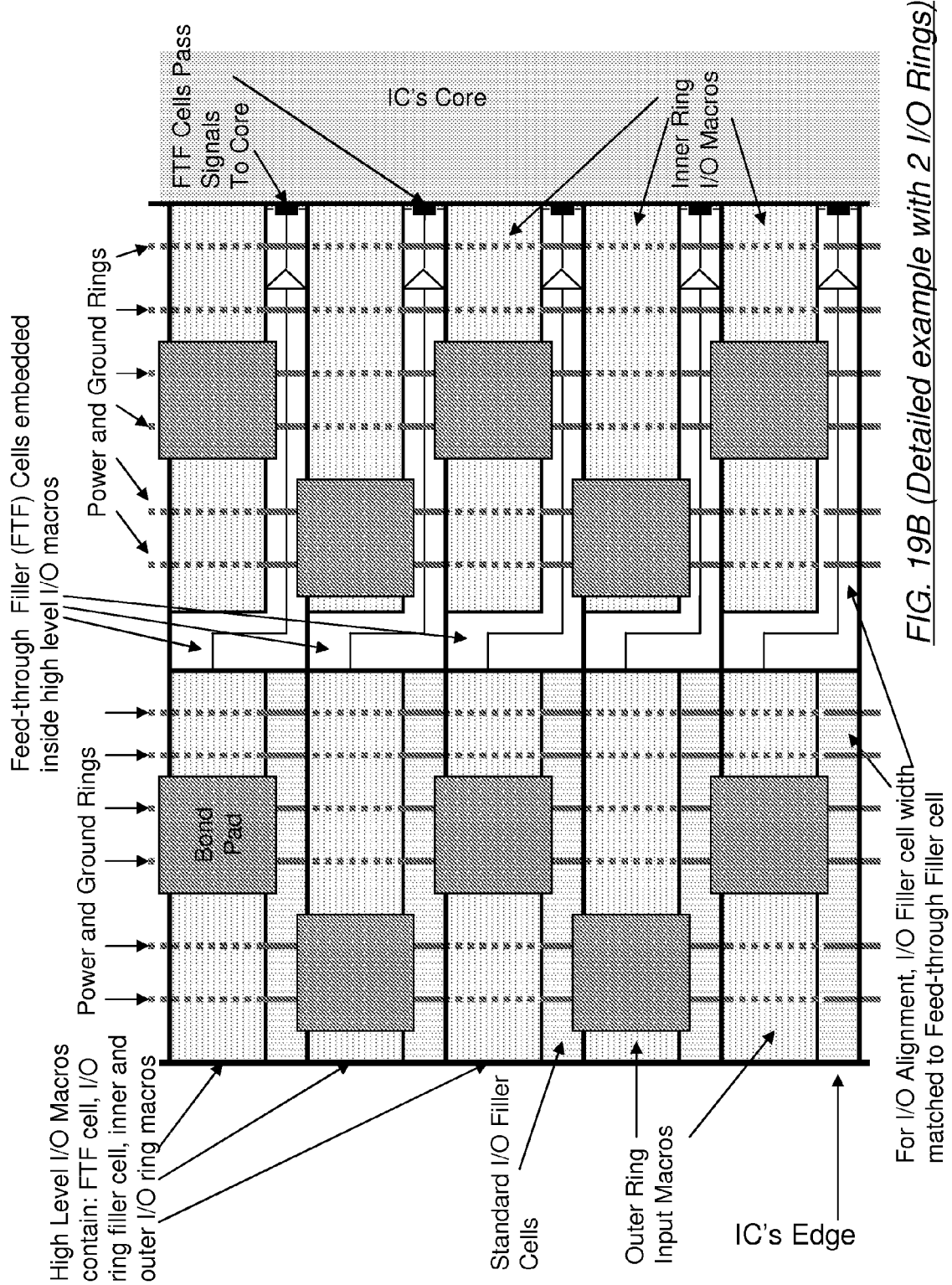
FIG. 19B (Detailed example with 2 I/O Rings)

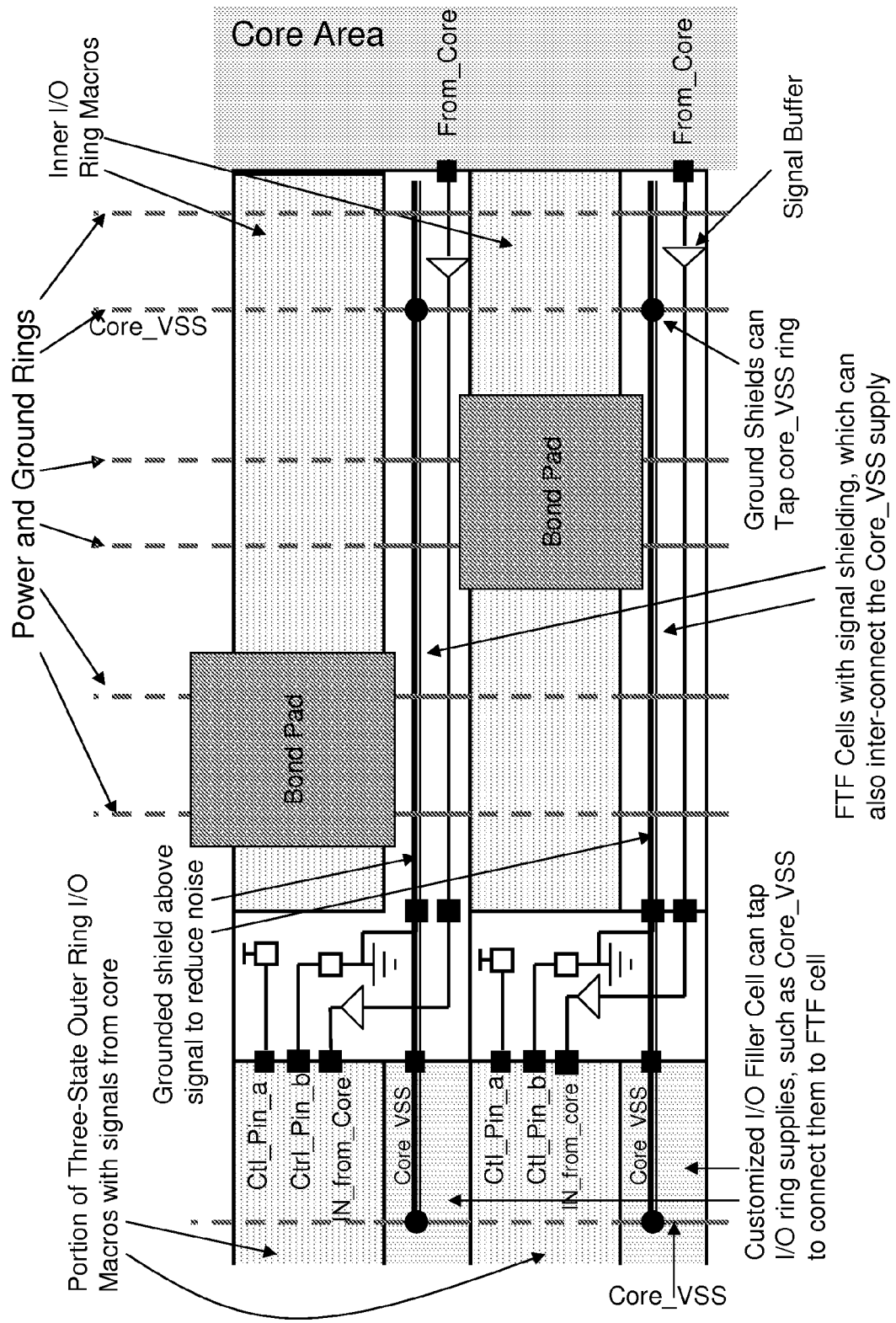
FIG. 19C (Detailed Example Showing Ground Connections to outer ring I/O Filler Cells)

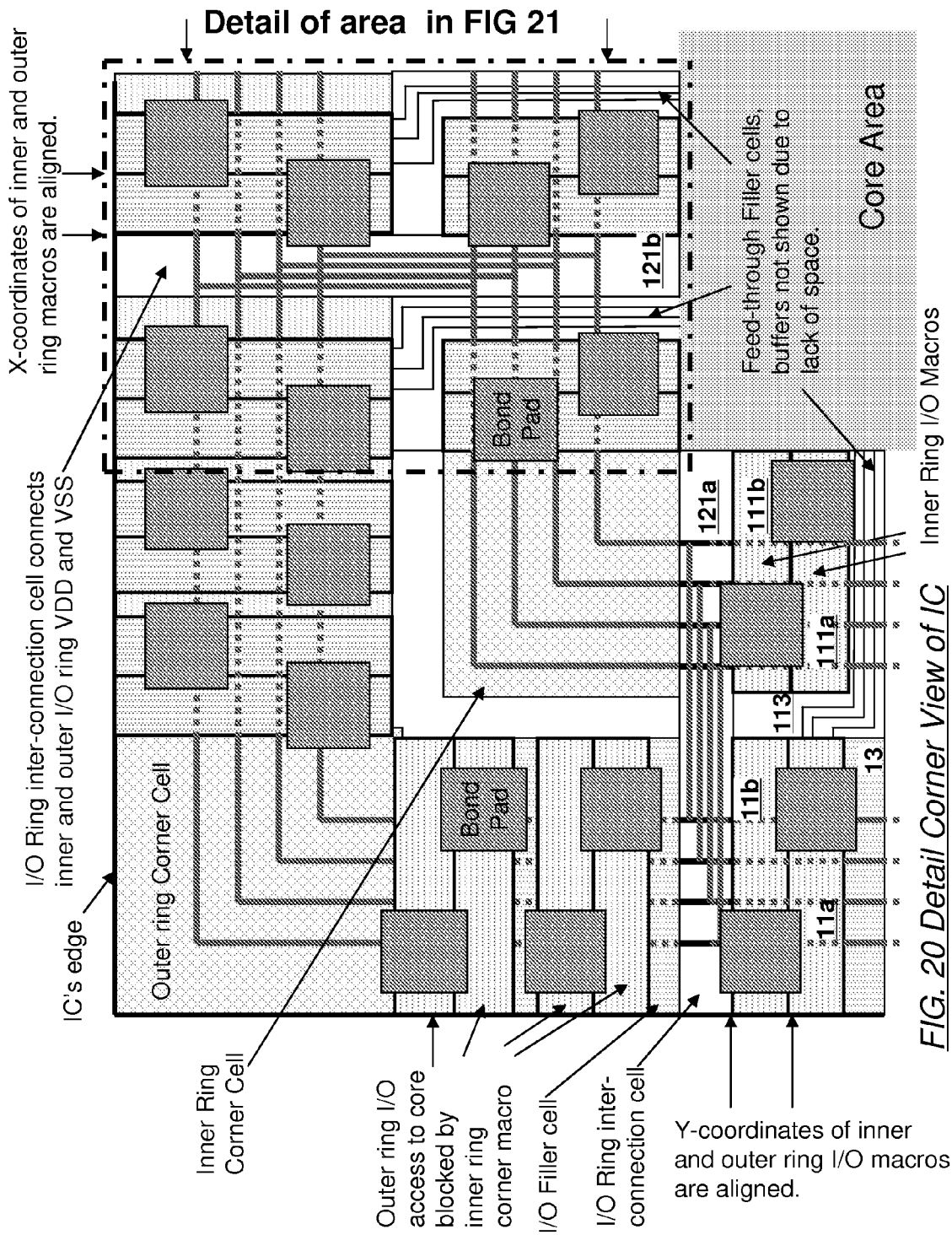
FIG. 20 Detail Corner View of IC

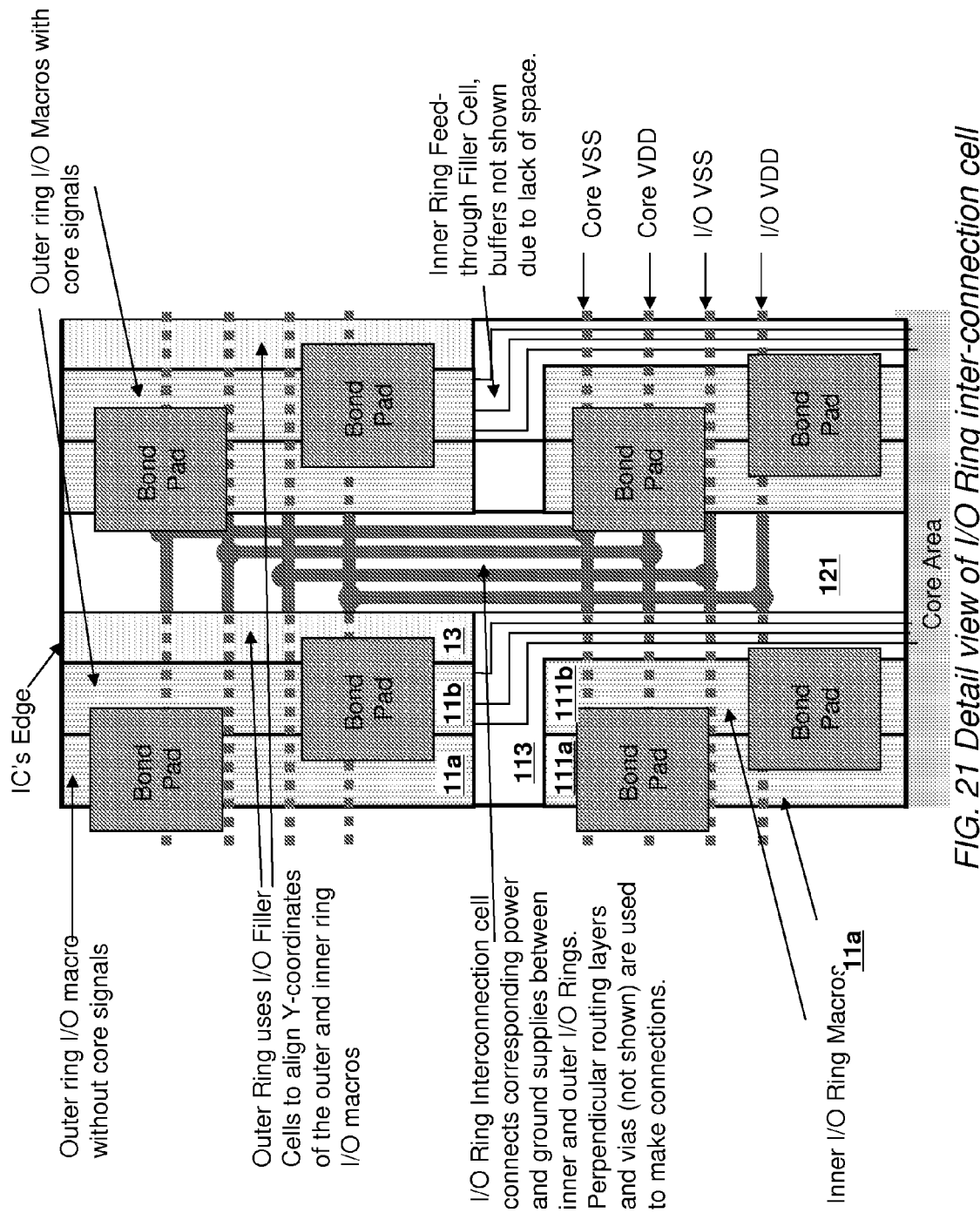
FIG. 21 Detail view of I/O Ring inter-connection cell

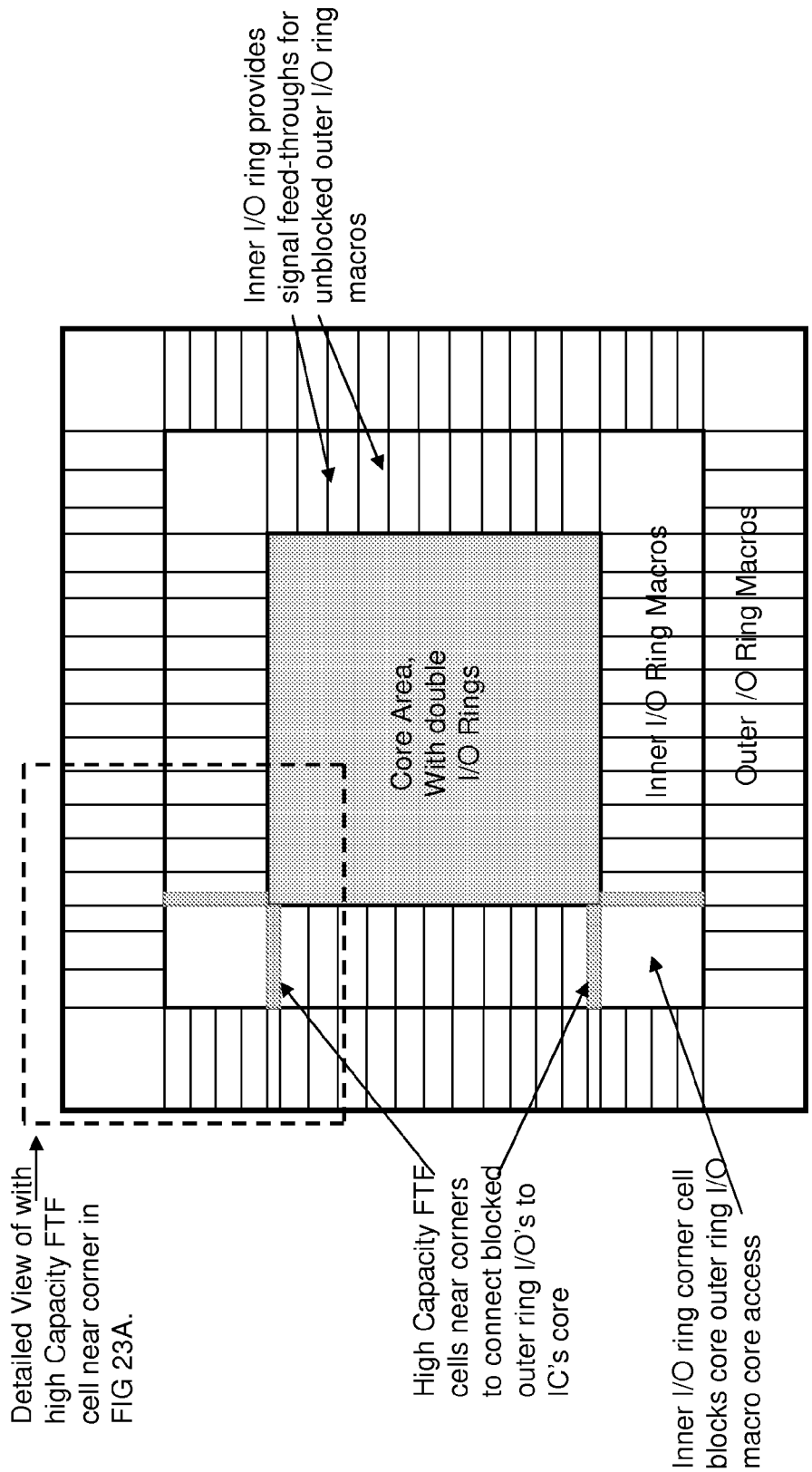
FIG. 22 Example of an IC using High capacity FTF Cells near left side corners

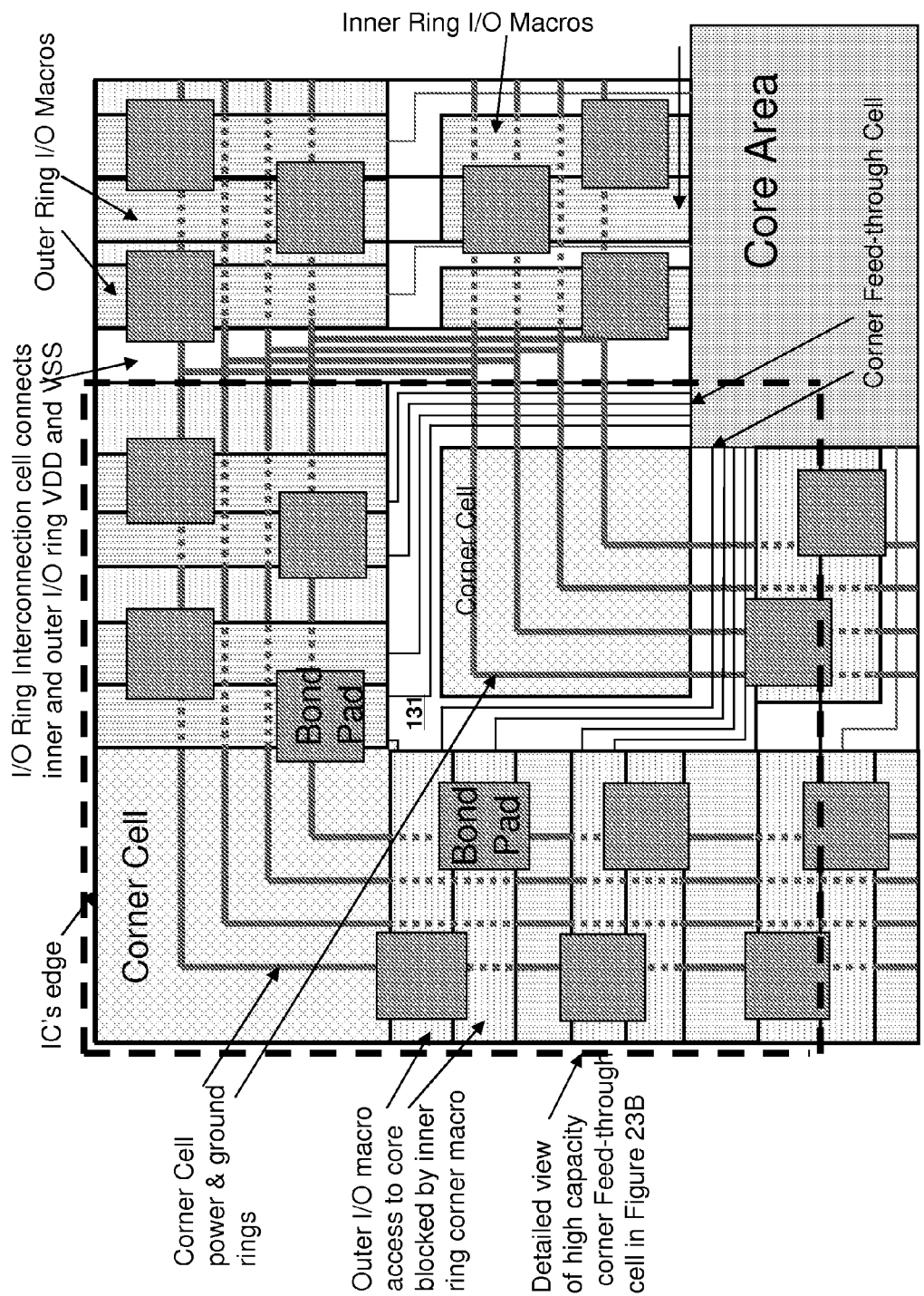
FIG. 23A Corner View of an IC with High Capacity Corner Feed-through Cell

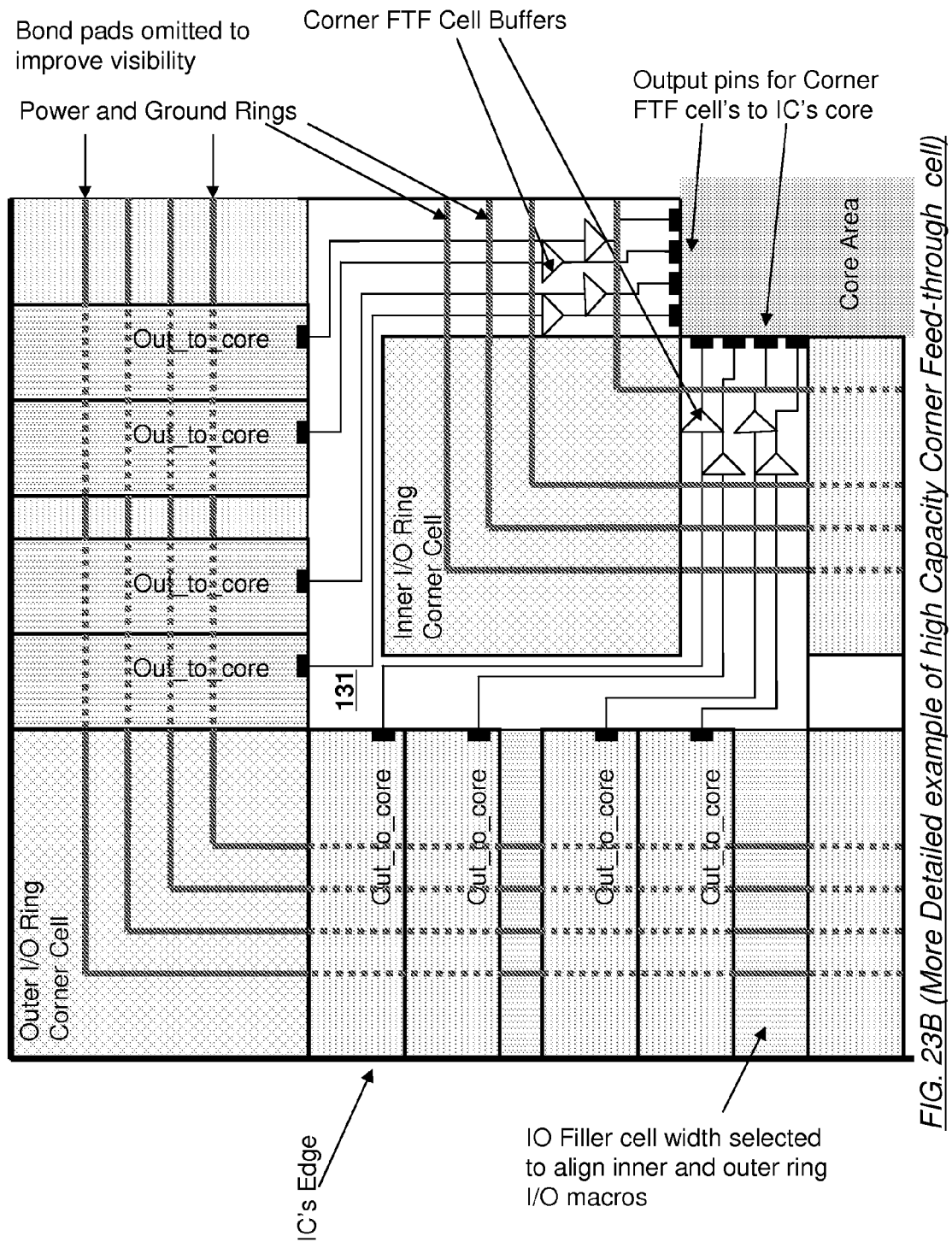
FIG. 23B (More Detailed example of high Capacity Corner Feed-through cell)

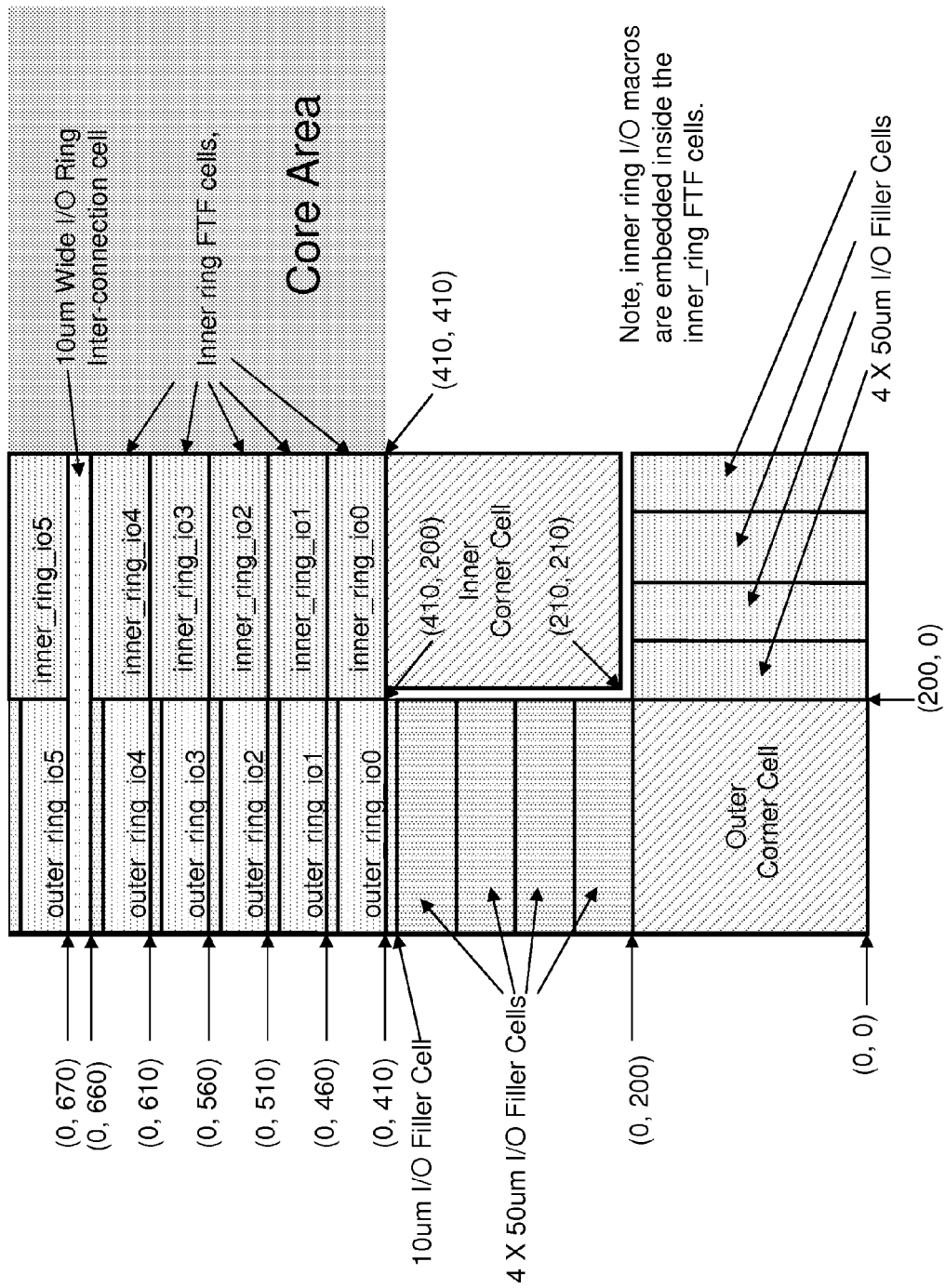
FIG. 23C Example showing coordinates of I/O's placed by the reference script along the lower left side of an IC.

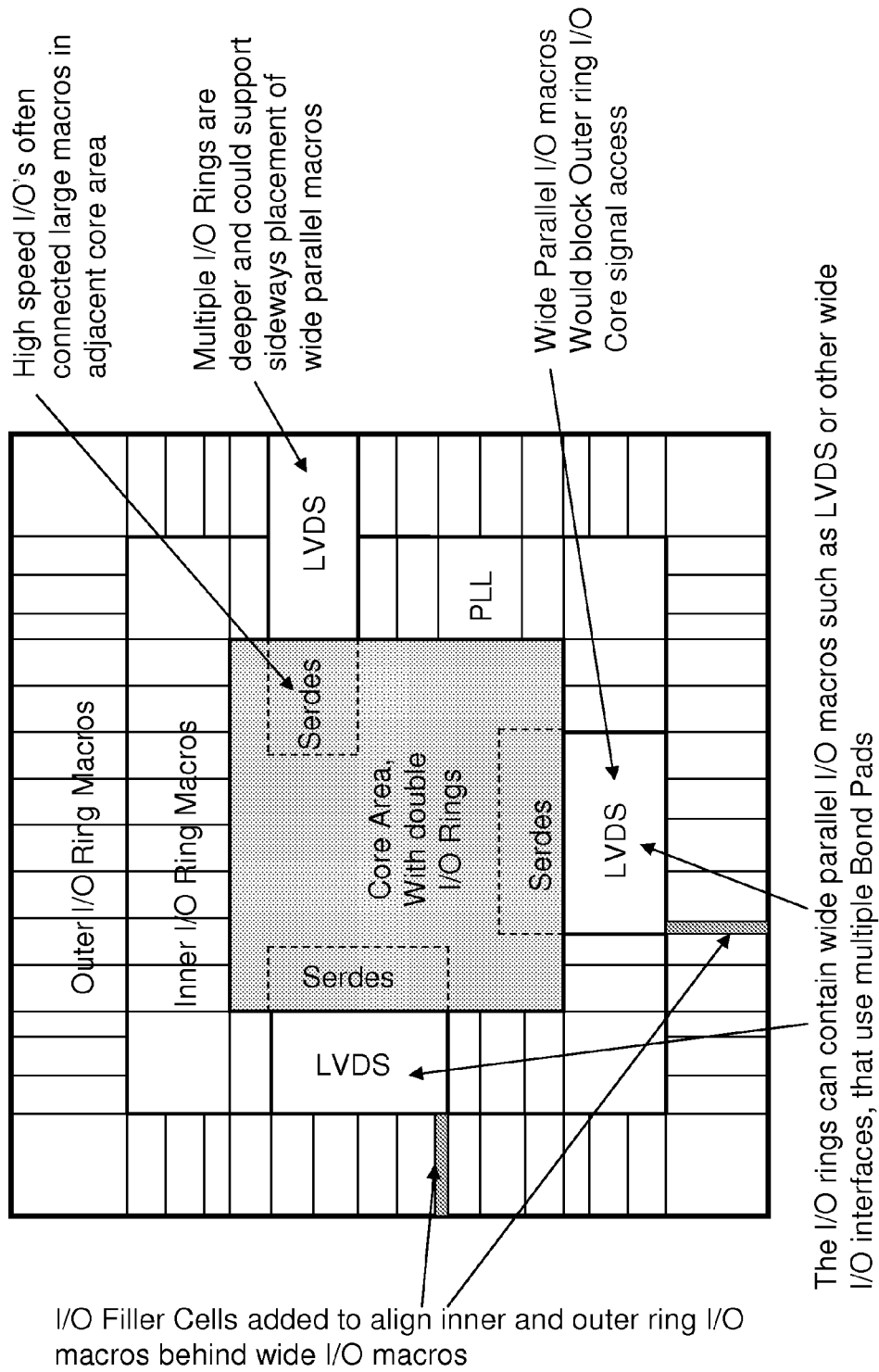
FIG. 24 (Example showing Inner I/O ring with 3 Large Serdes I/O Macros)

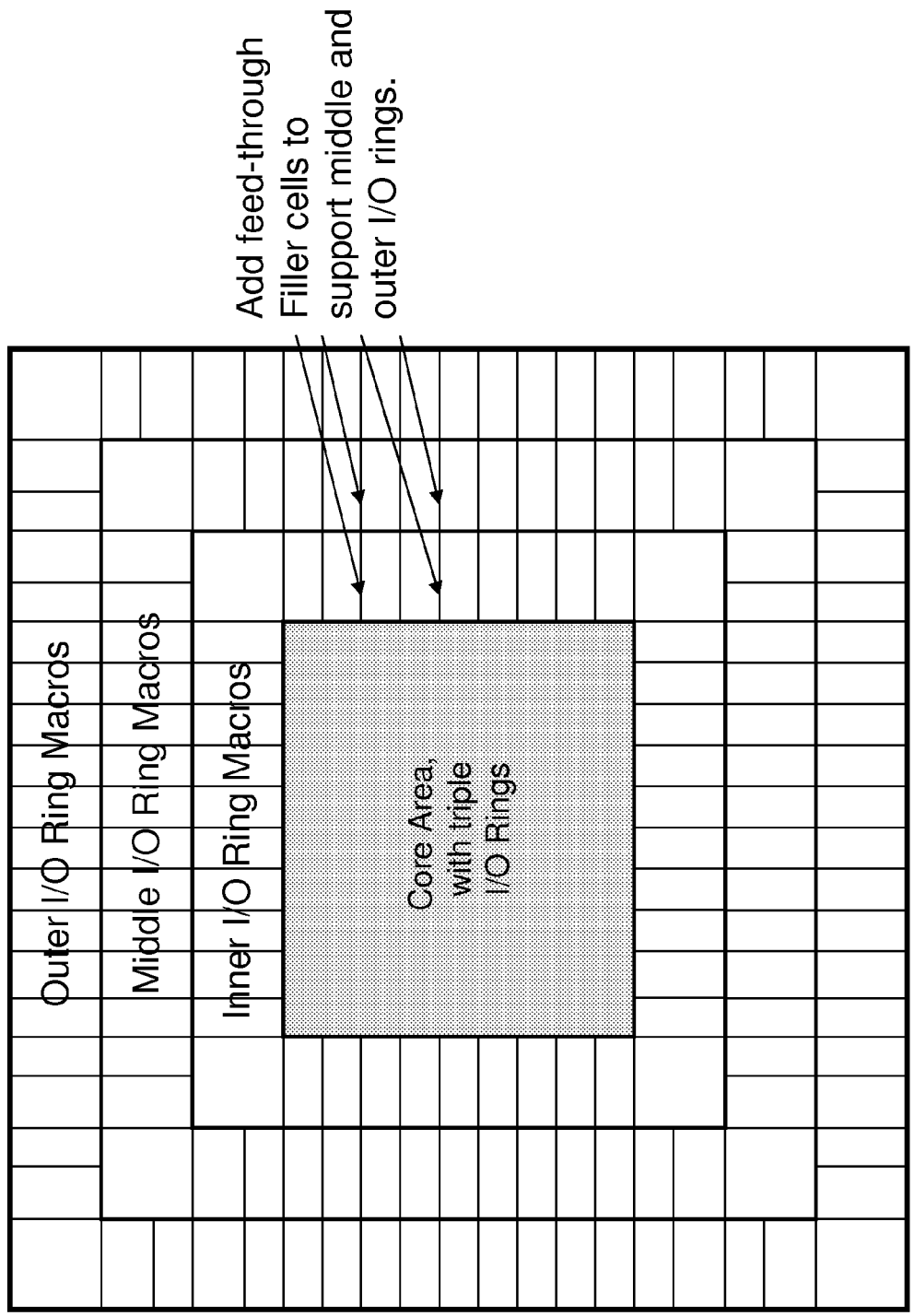
FIG. 25 (Example IC showing 3 I/O Rings)

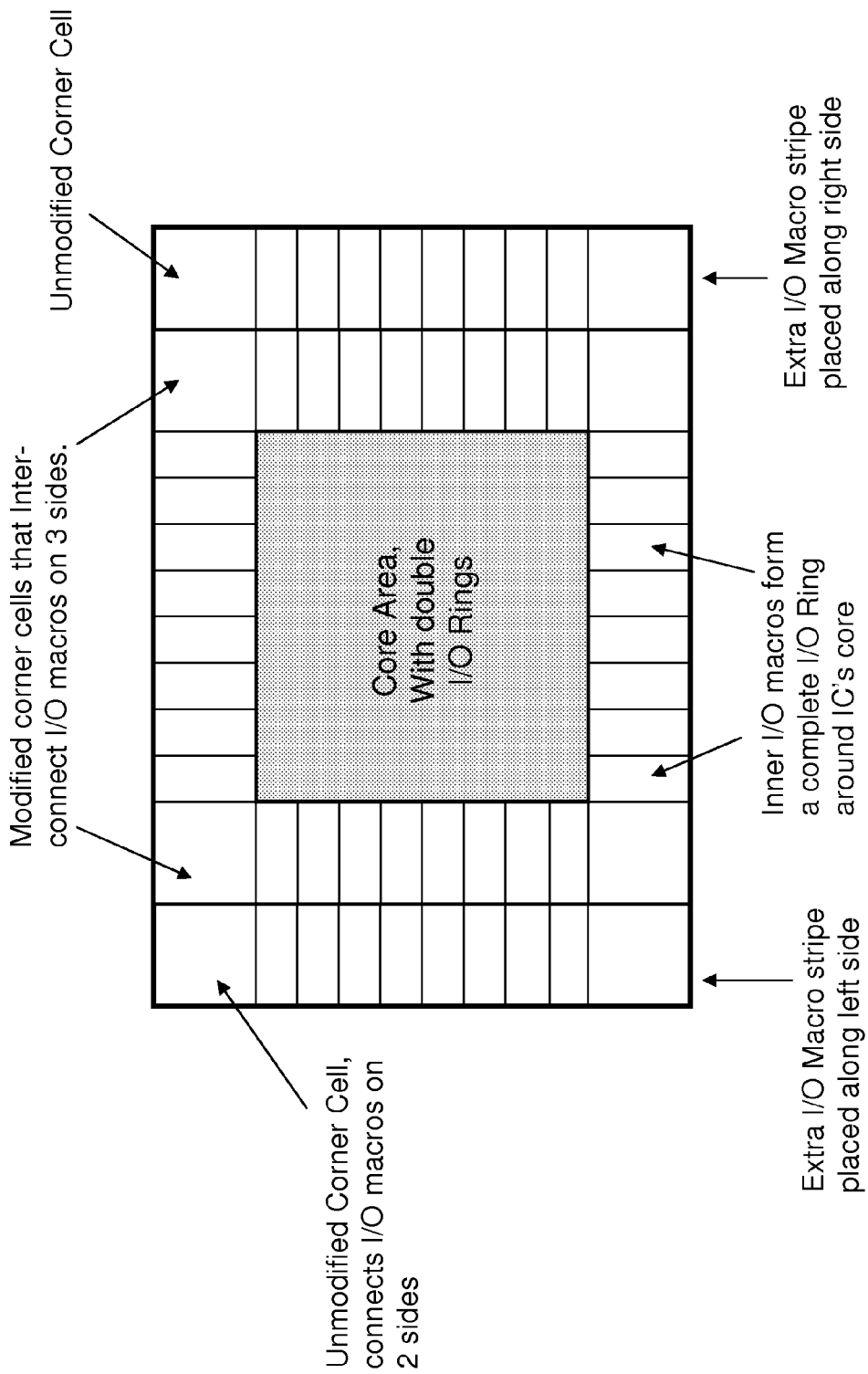
FIG. 26 (Example of I/O Ring plus Vertical I/O Macro Stripes on the left and right sides)

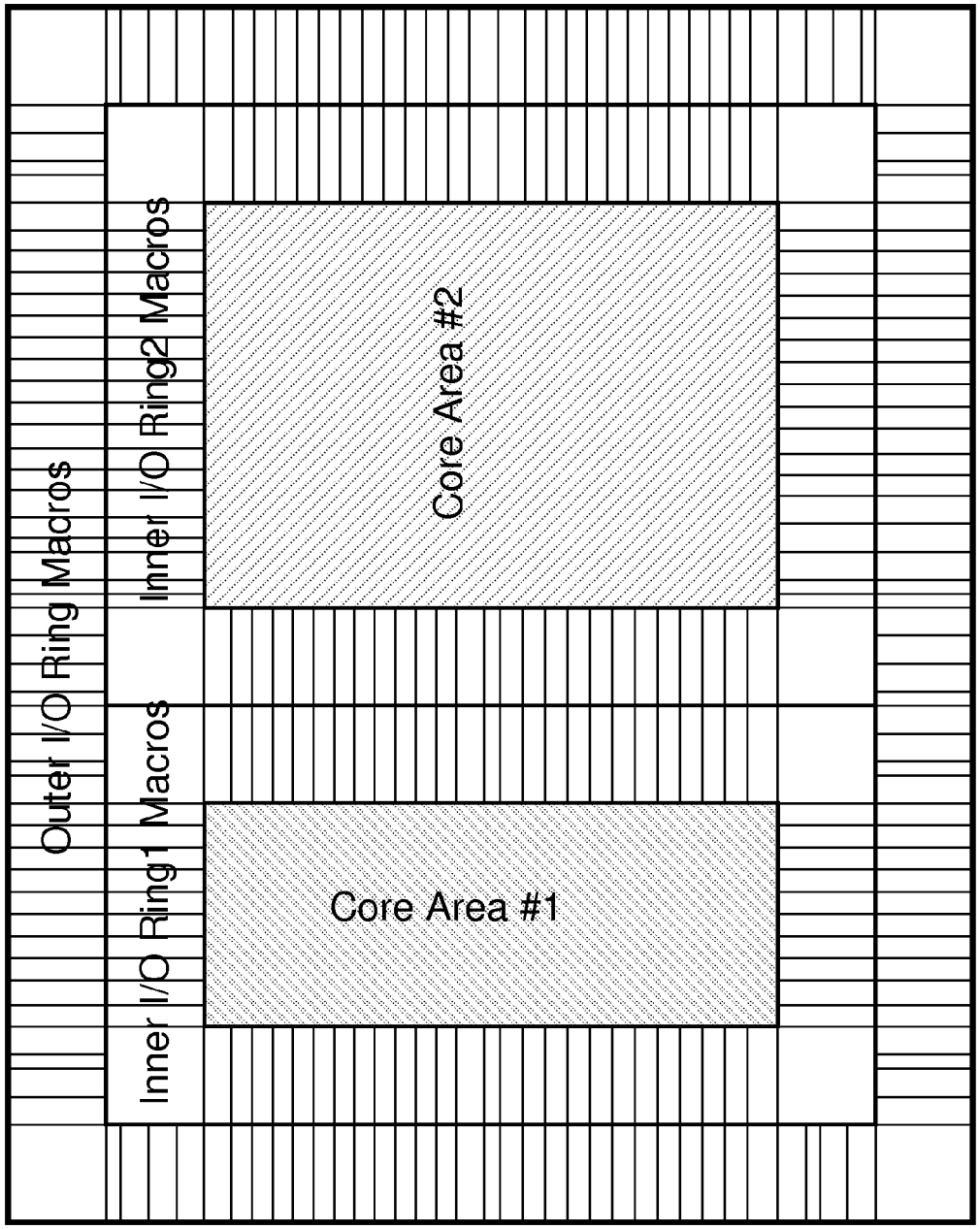
FIG. 27 (Example of IC with an outer ring enclosing 2 inner I/O rings that enclose 2 separate core areas)

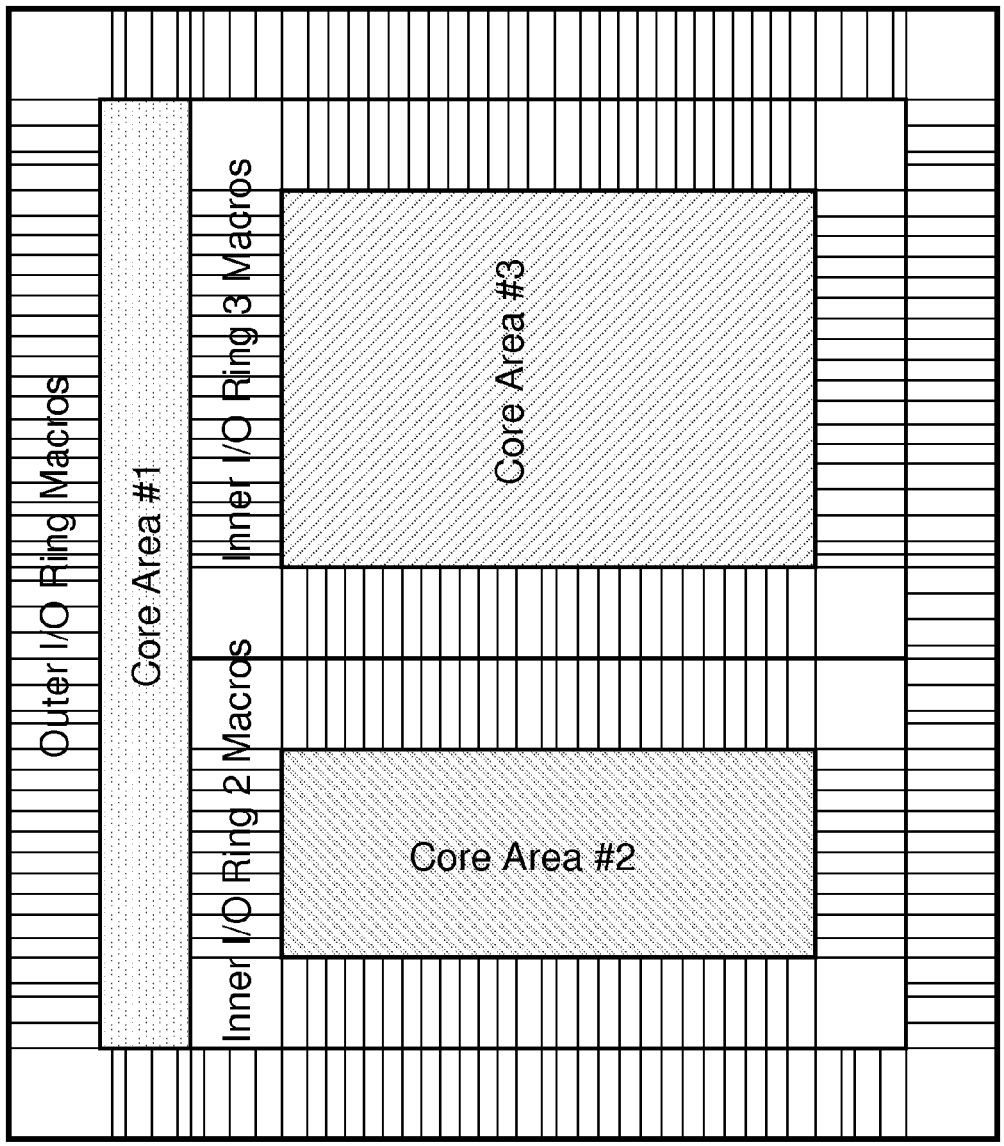
FIG. 28 (Example of IC with an outer ring enclosing: core area #1, inner ring #2 enclosing core area #2, and inner ring #3 enclosing core area #3).

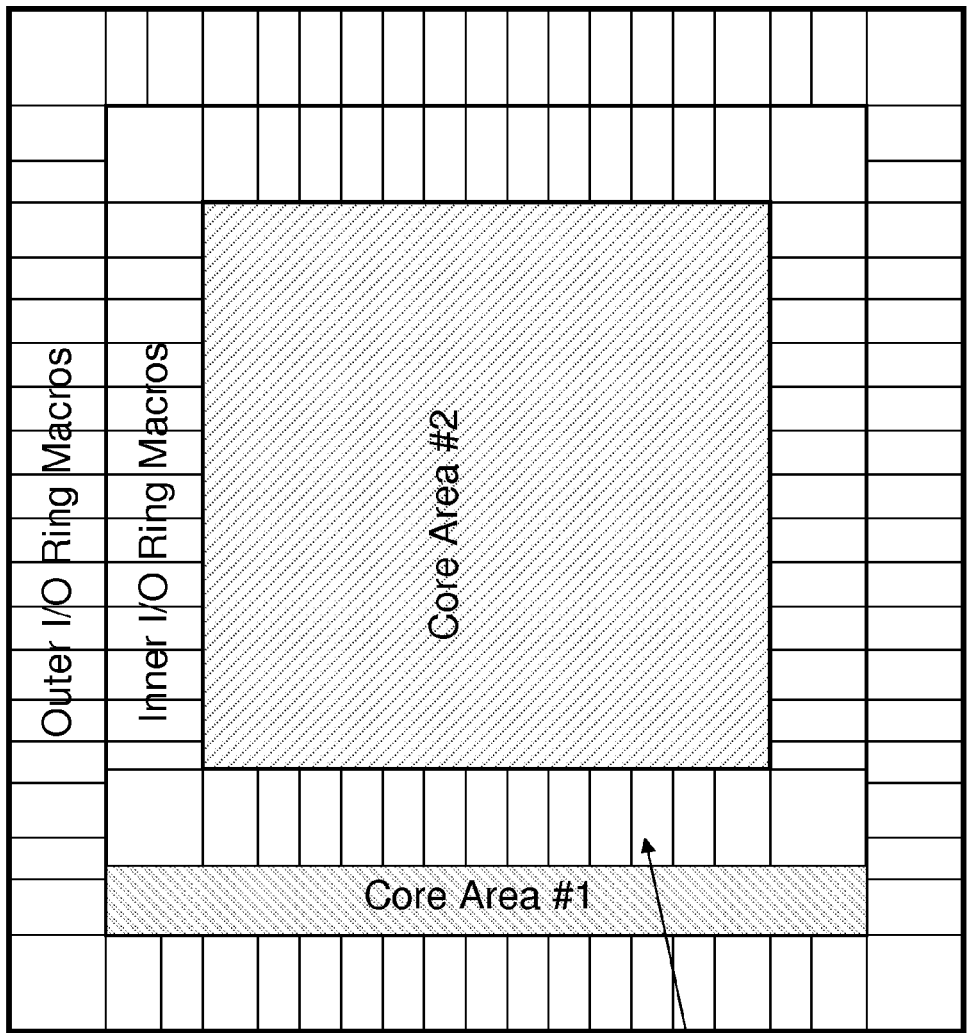
FIG. 29 (Example of IC with an outer I/O ring surrounding narrow core area #1 plus an inner ring I/O ring surrounding core area #2)

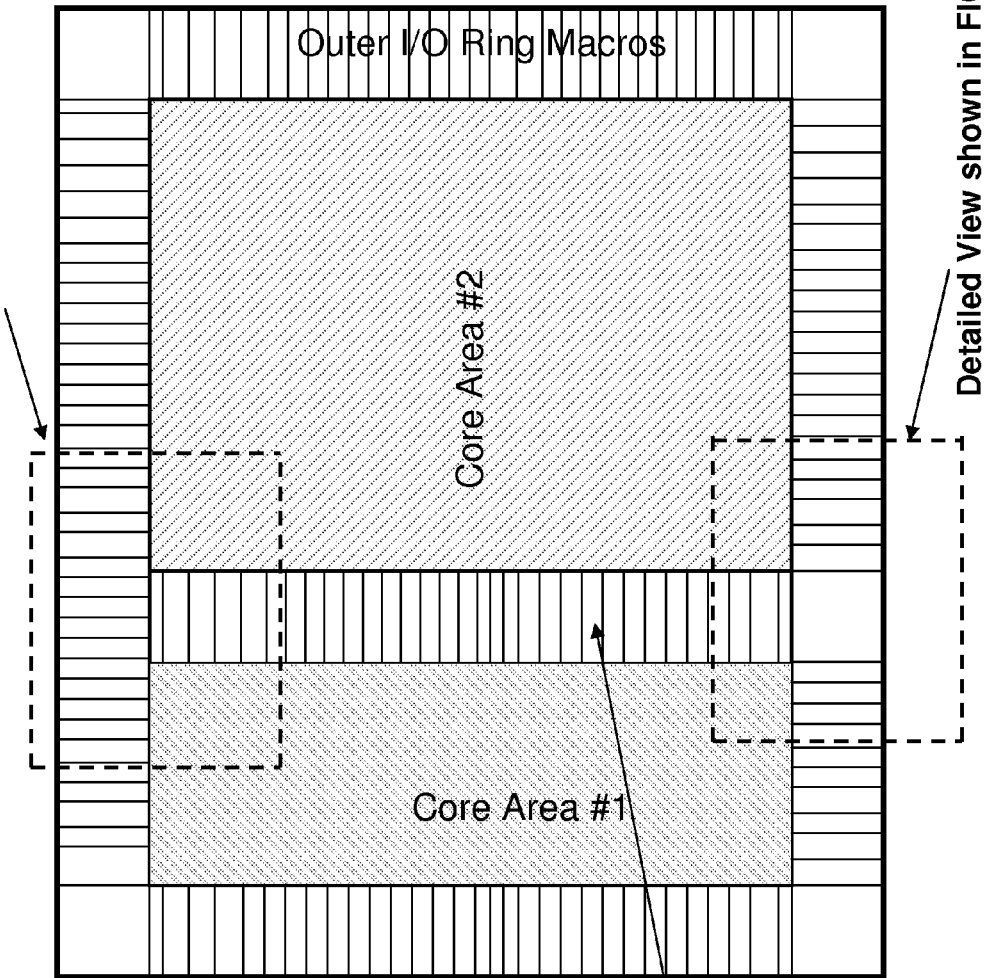
FIG. 30 (Example of IC using an I/O stripe to partition the Core area)

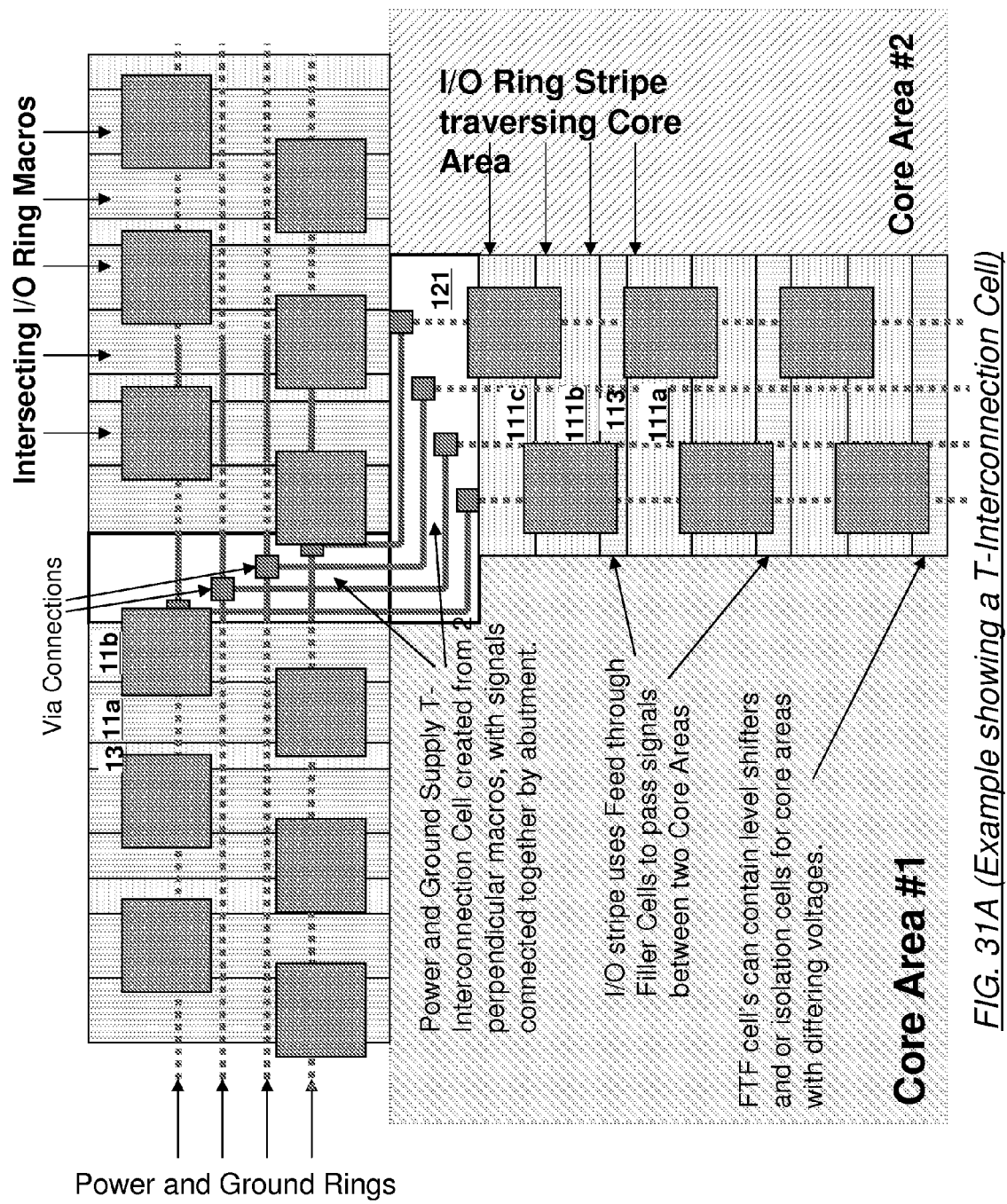
FIG. 31A (Example showing a T-Interconnection Cell)

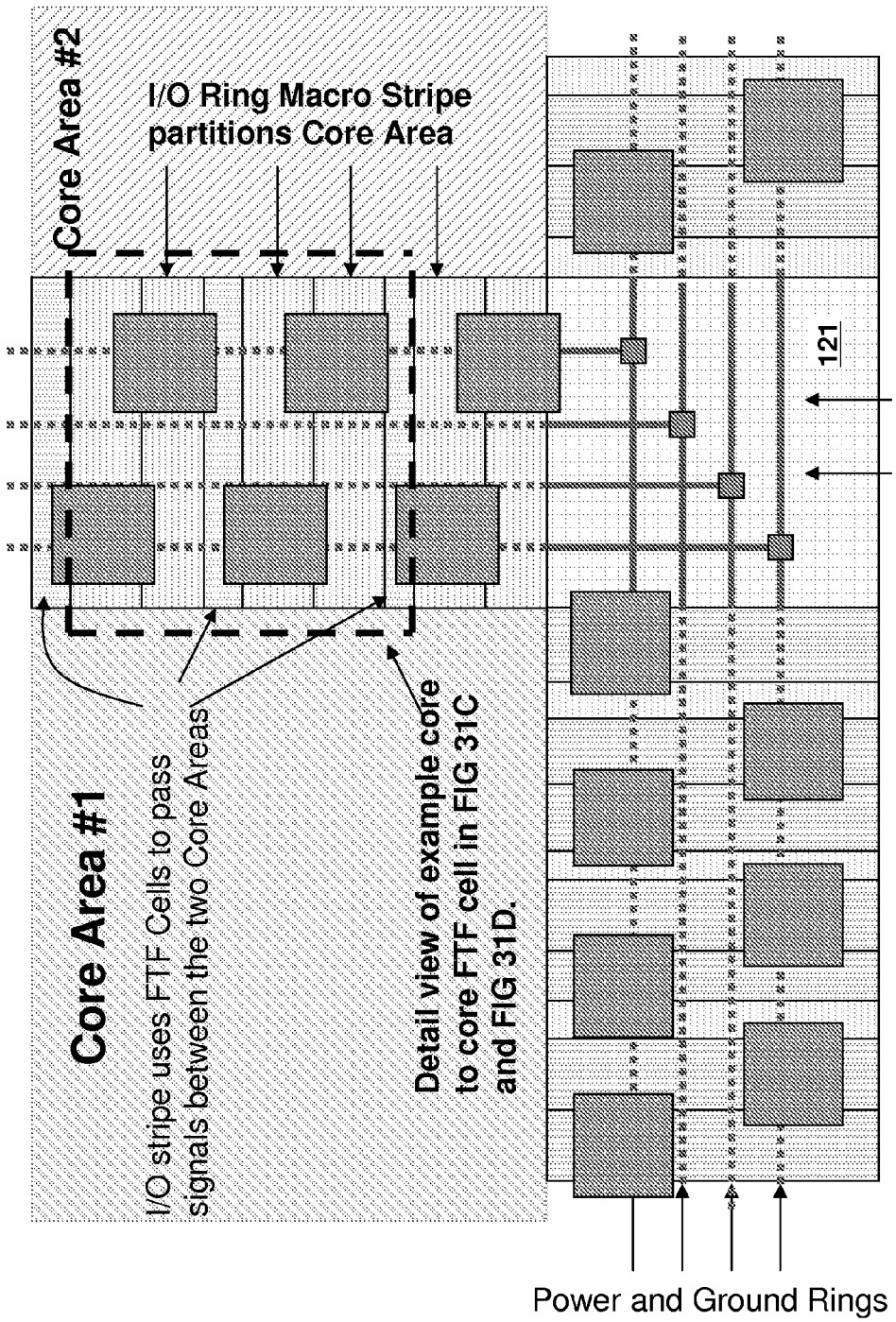
FIG. 31B (Example showing a Three Way Corner Cell based on a modified corner cell)

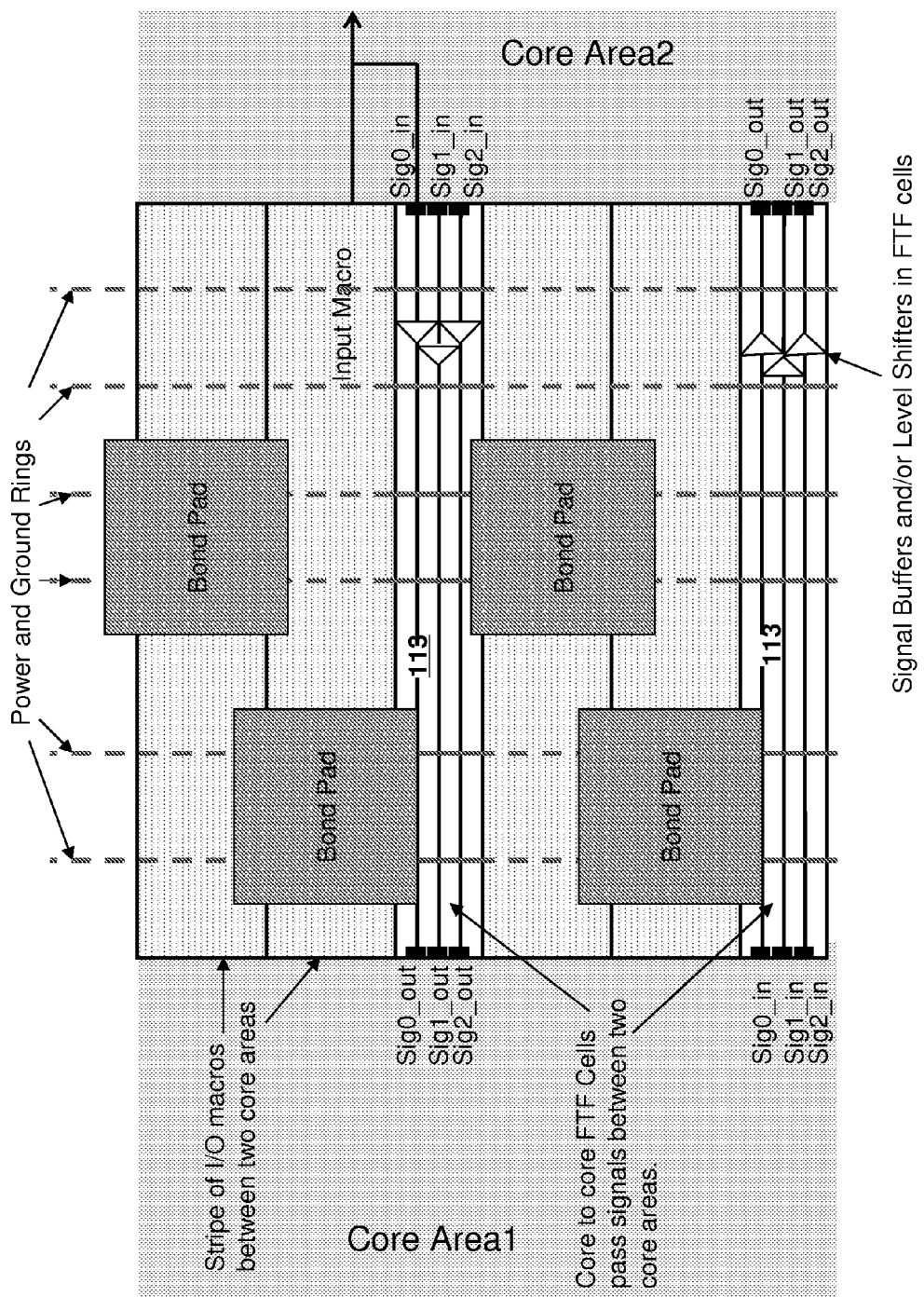
FIG. 31C (Detailed Example of core to core Feed-through Filler Cells)

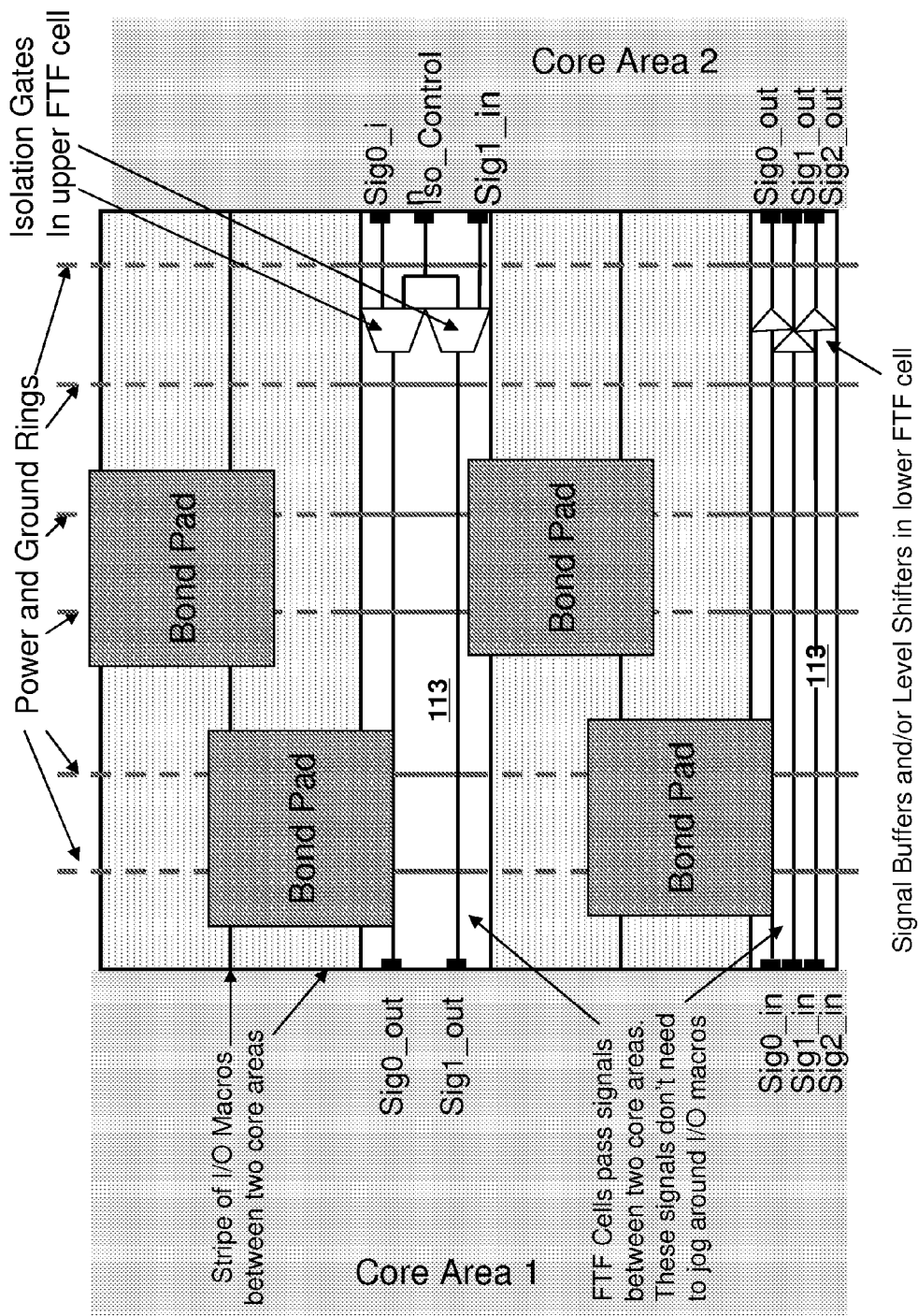
FIG. 31D (Detailed Example of core to core Feed-through Filler Cells)

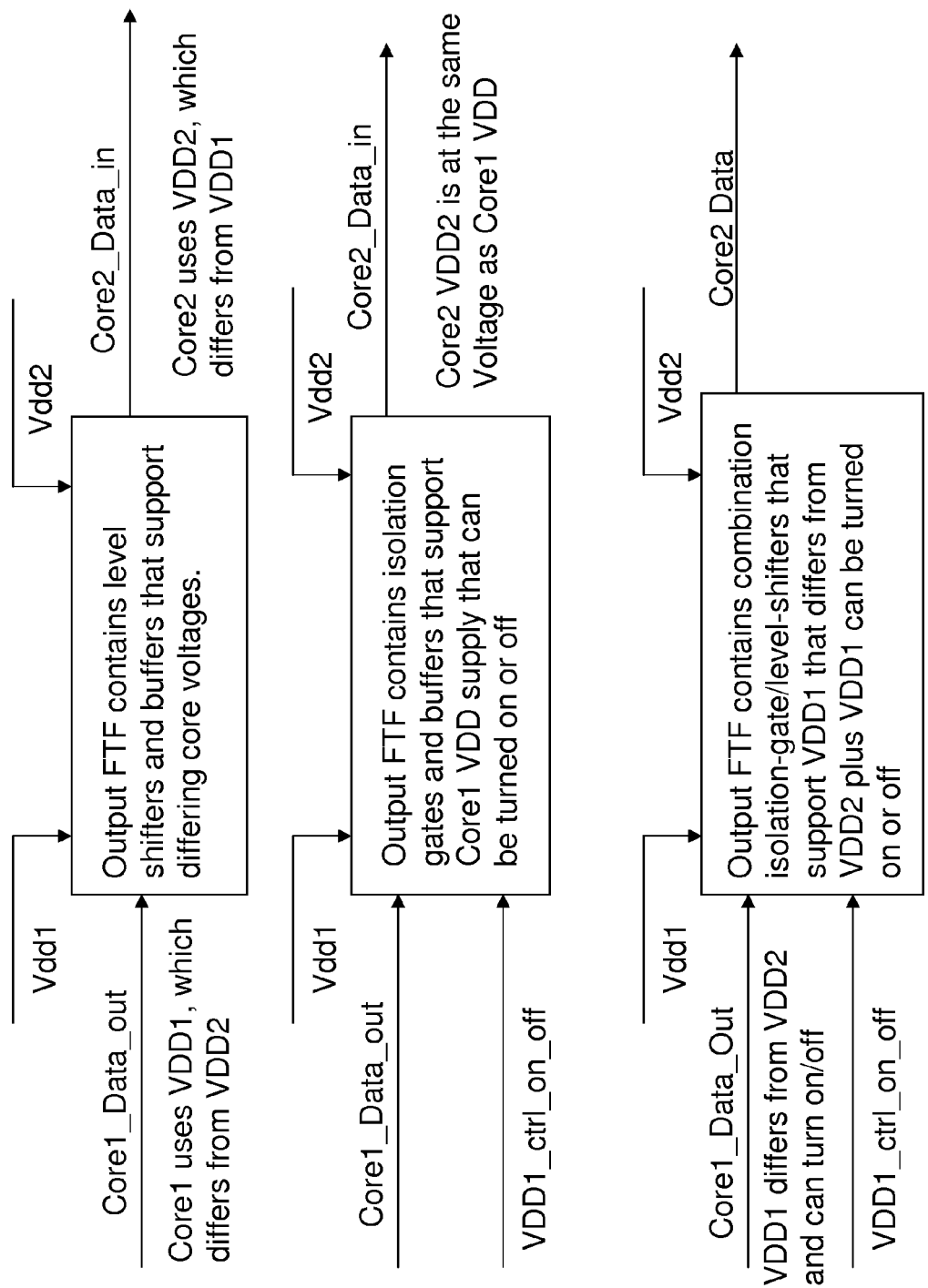
FIG. 32A (Examples of FTF Cell Core to Core Functions)

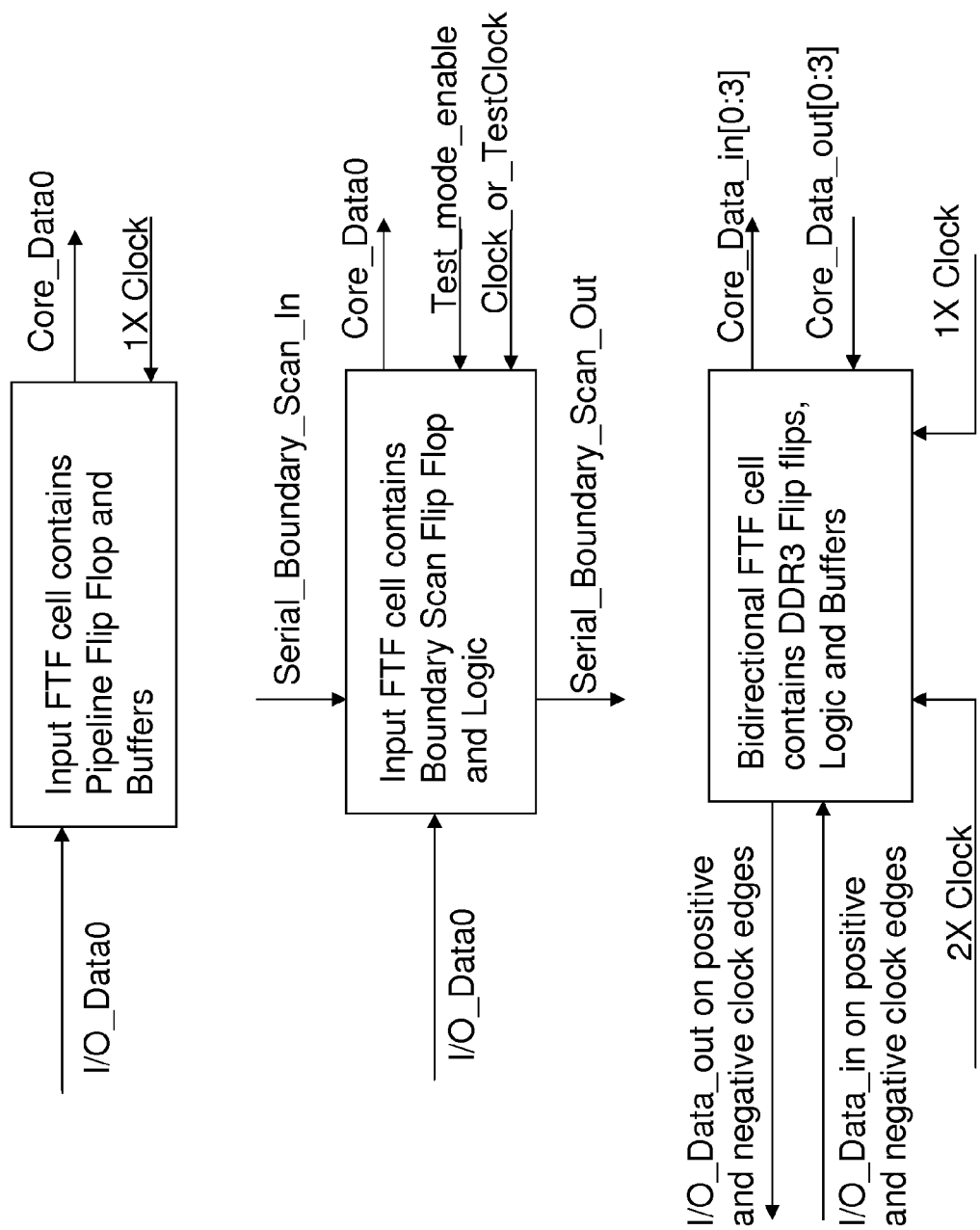
FIG. 32B (Examples of FTF Cell I/O to Core Functions)

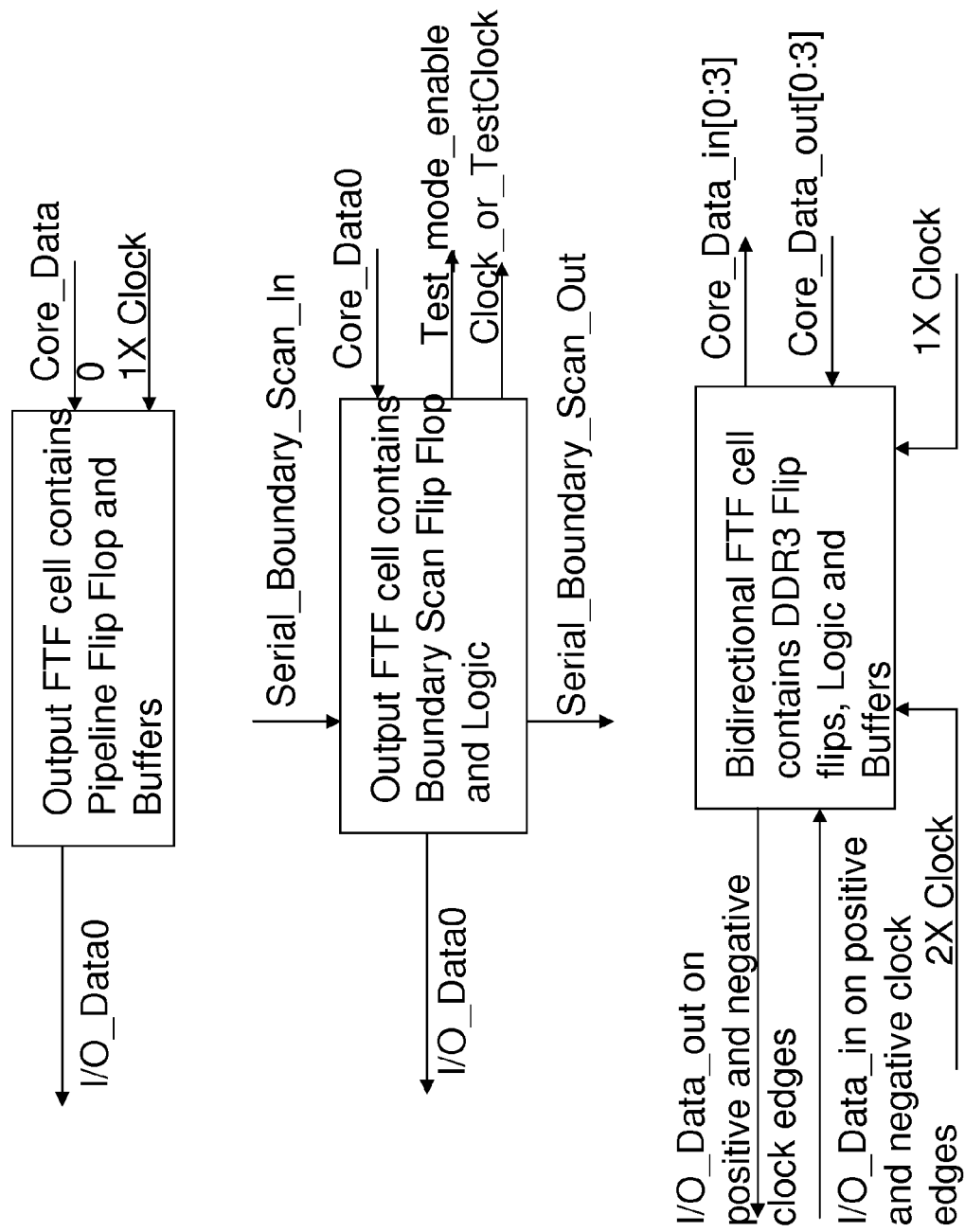
FIG. 32C (Examples of FTF Cell Core to I/O Functions)

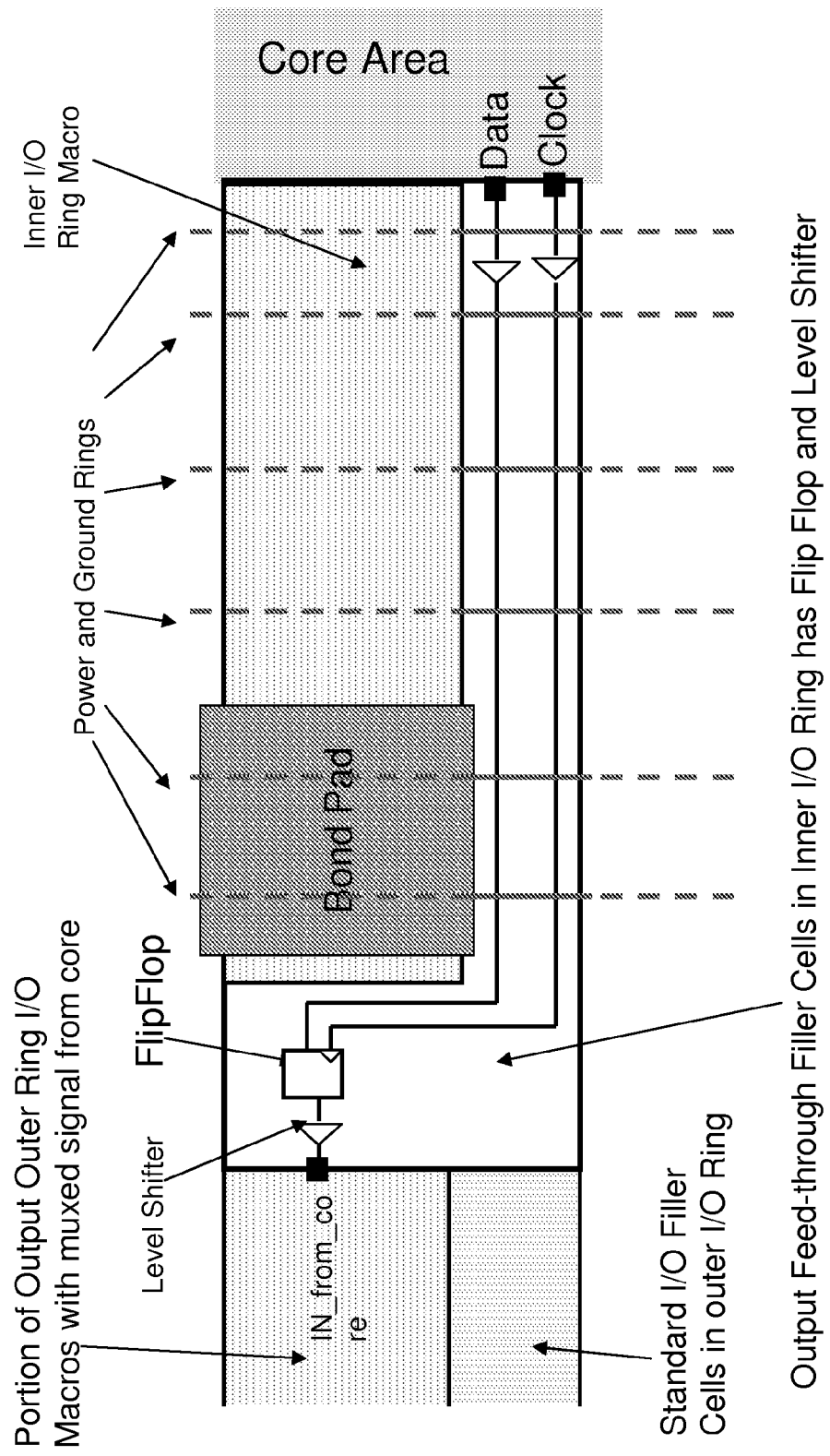
FIG. 33A (Detailed Example of Core to I/O Feed-through Filler Cell with Flip Flop and Level Shifter)

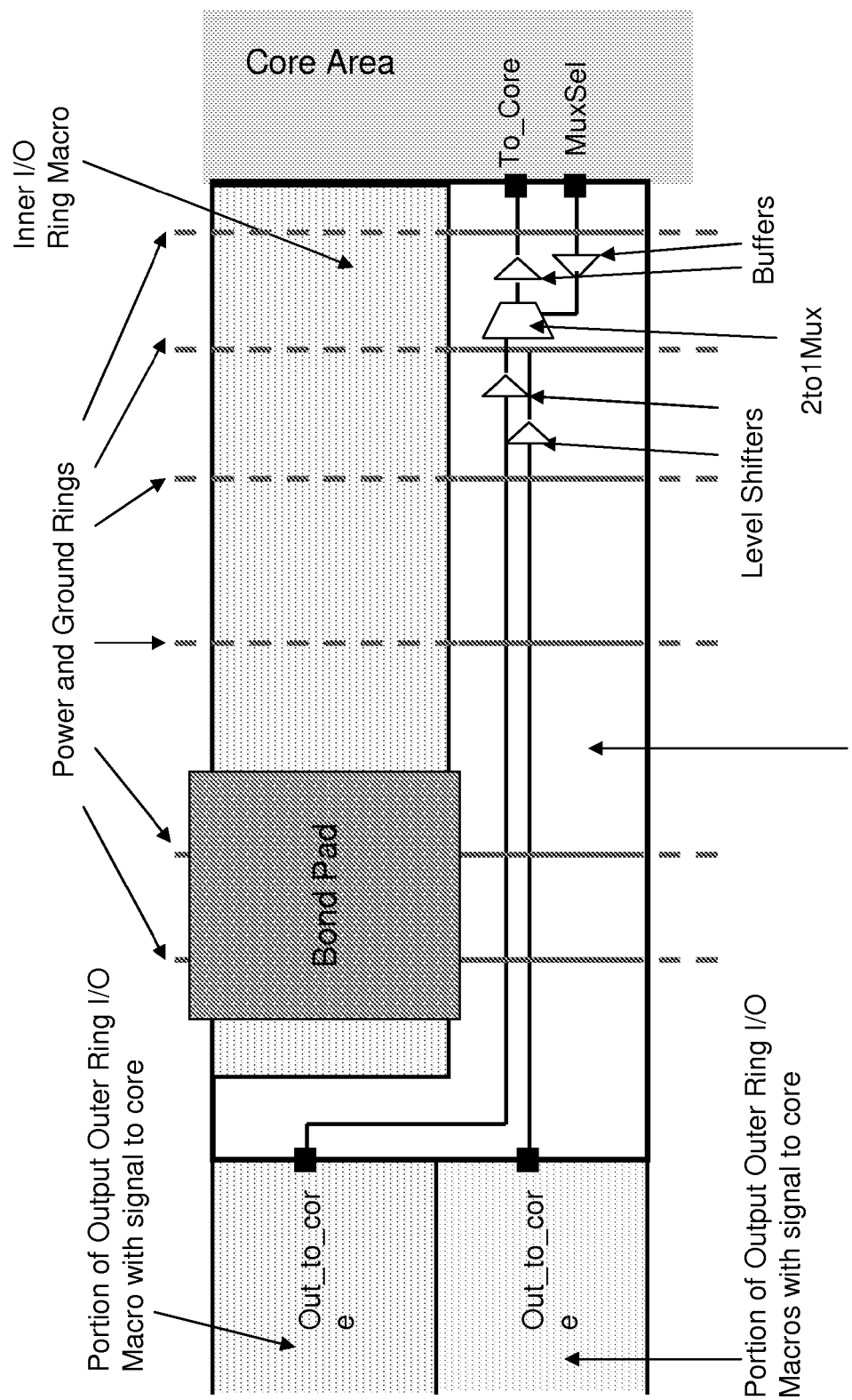
FIG. 33B (Detailed Example of I/O to Core Feed-through Filler Cell with Mux and Level Shifter)

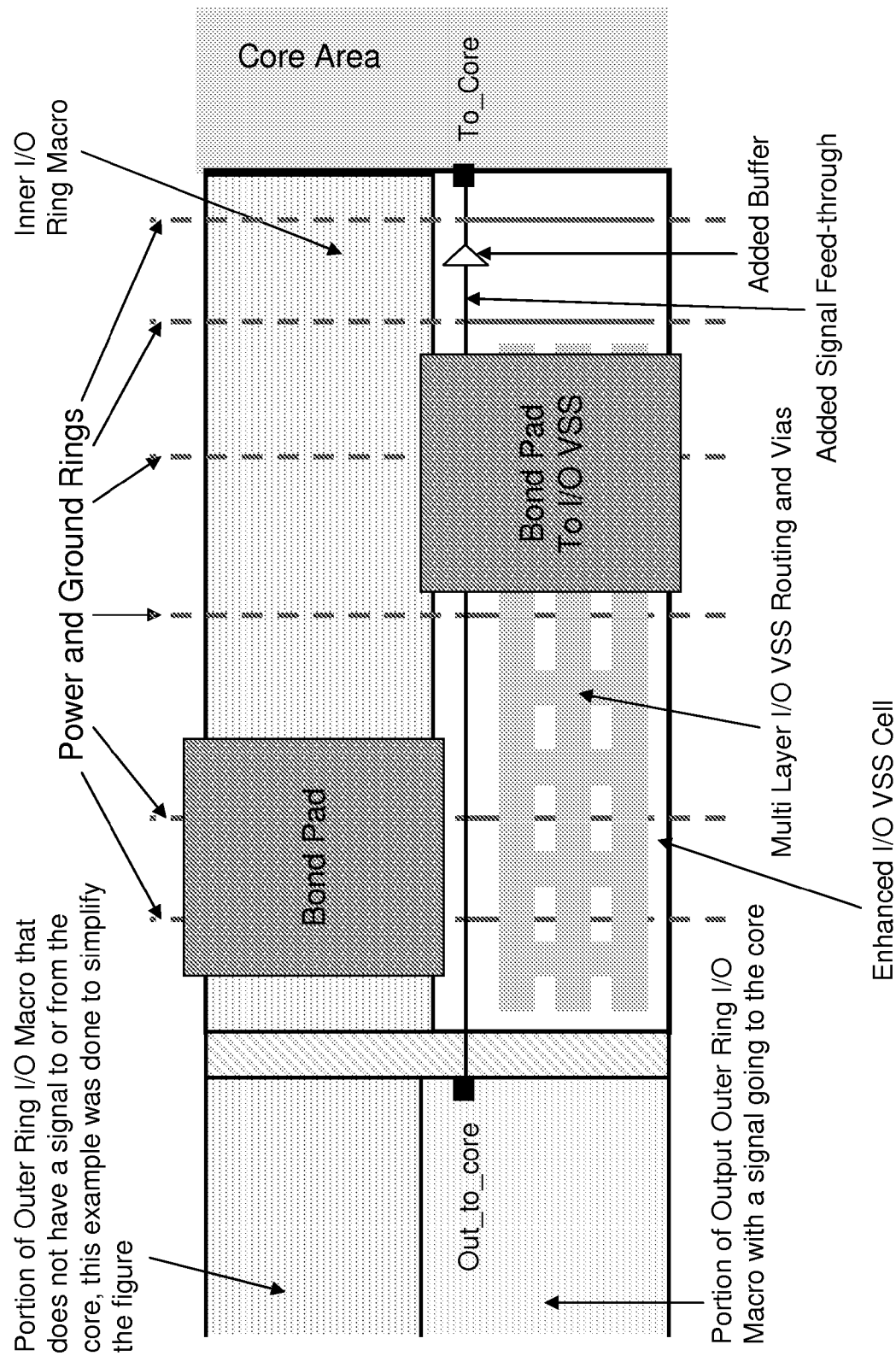
FIG. 34 (Detailed Example a modified I/O VSS Supply cell that has an input signal feed-through)

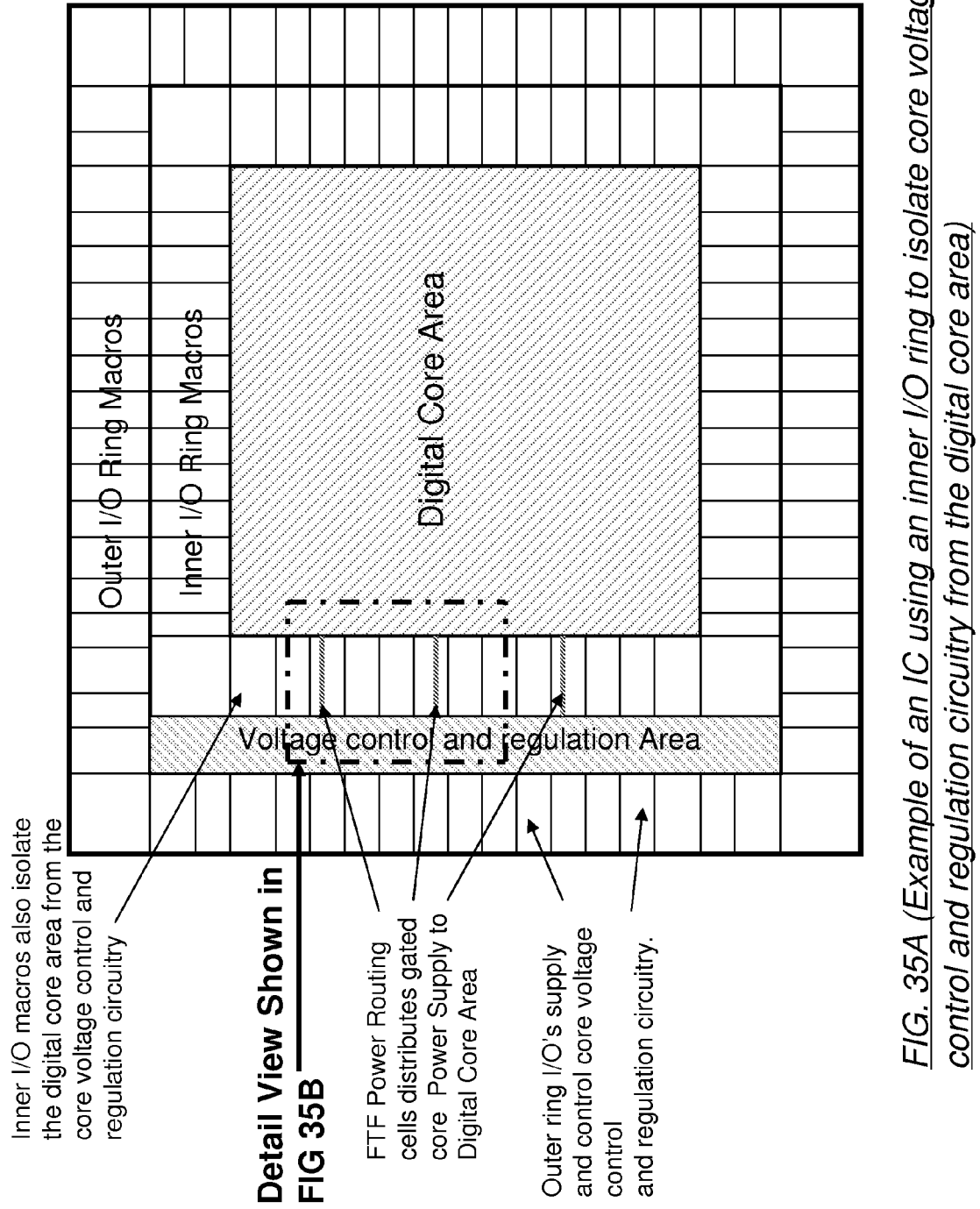
FIG. 35A (Example of an IC using an inner I/O ring to isolate core voltage control and regulation circuitry from the digital core area)

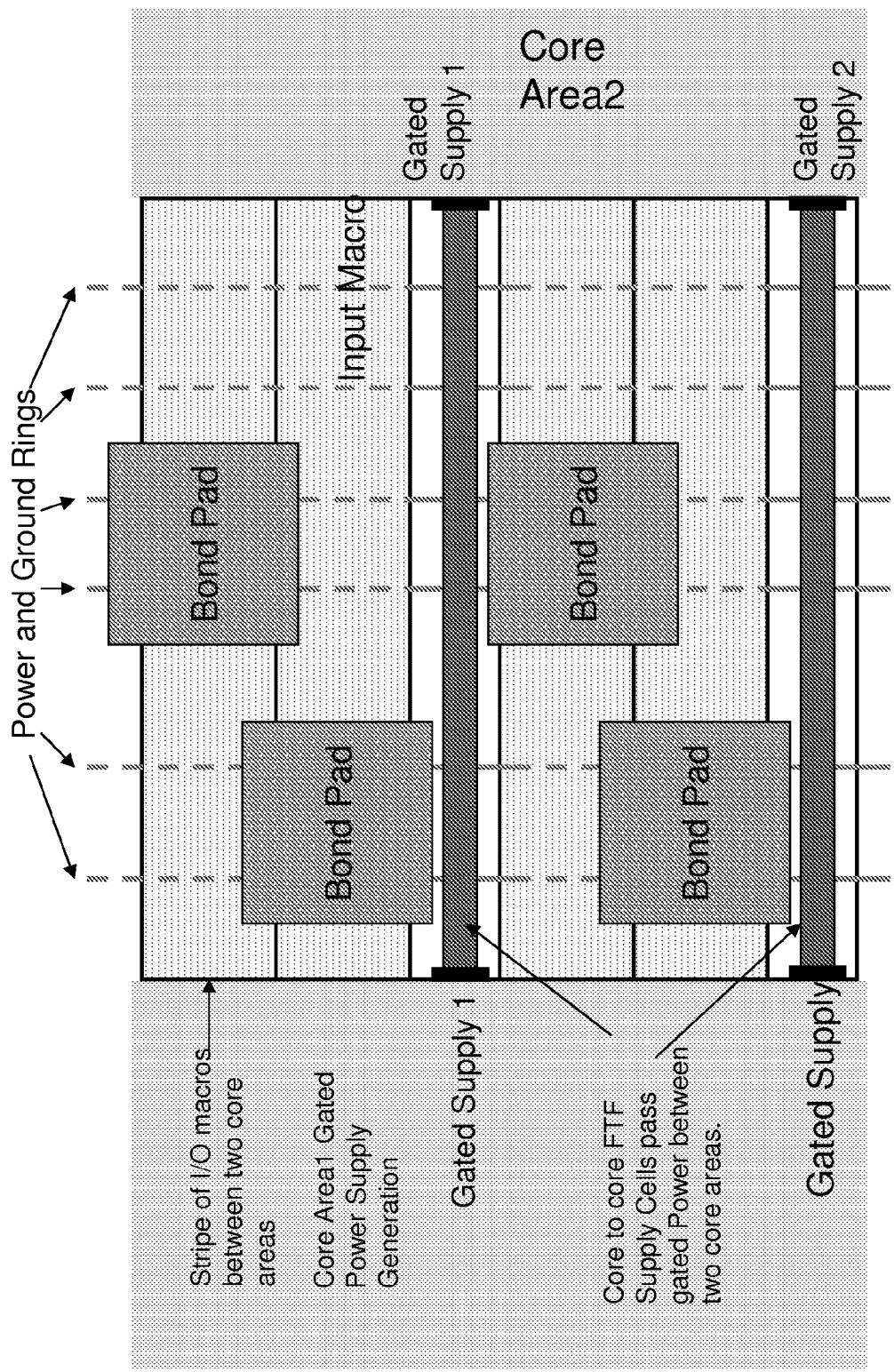
FIG. 35B (Detailed Example Feed-through Filler Power Supply Cell)

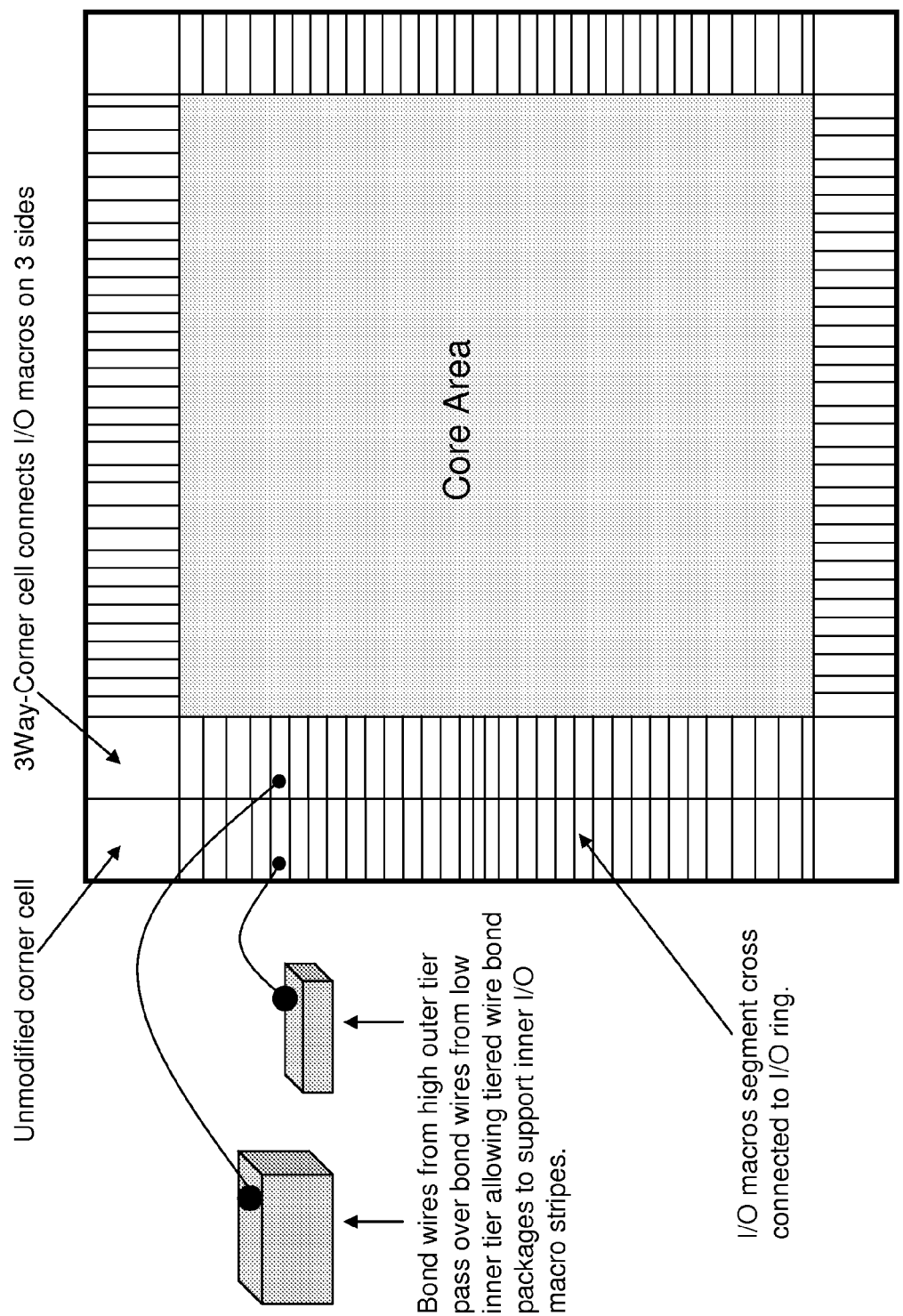
FIG. 36A (Example of a tiered wire bond IC, with a stripe of inner I/O macros)

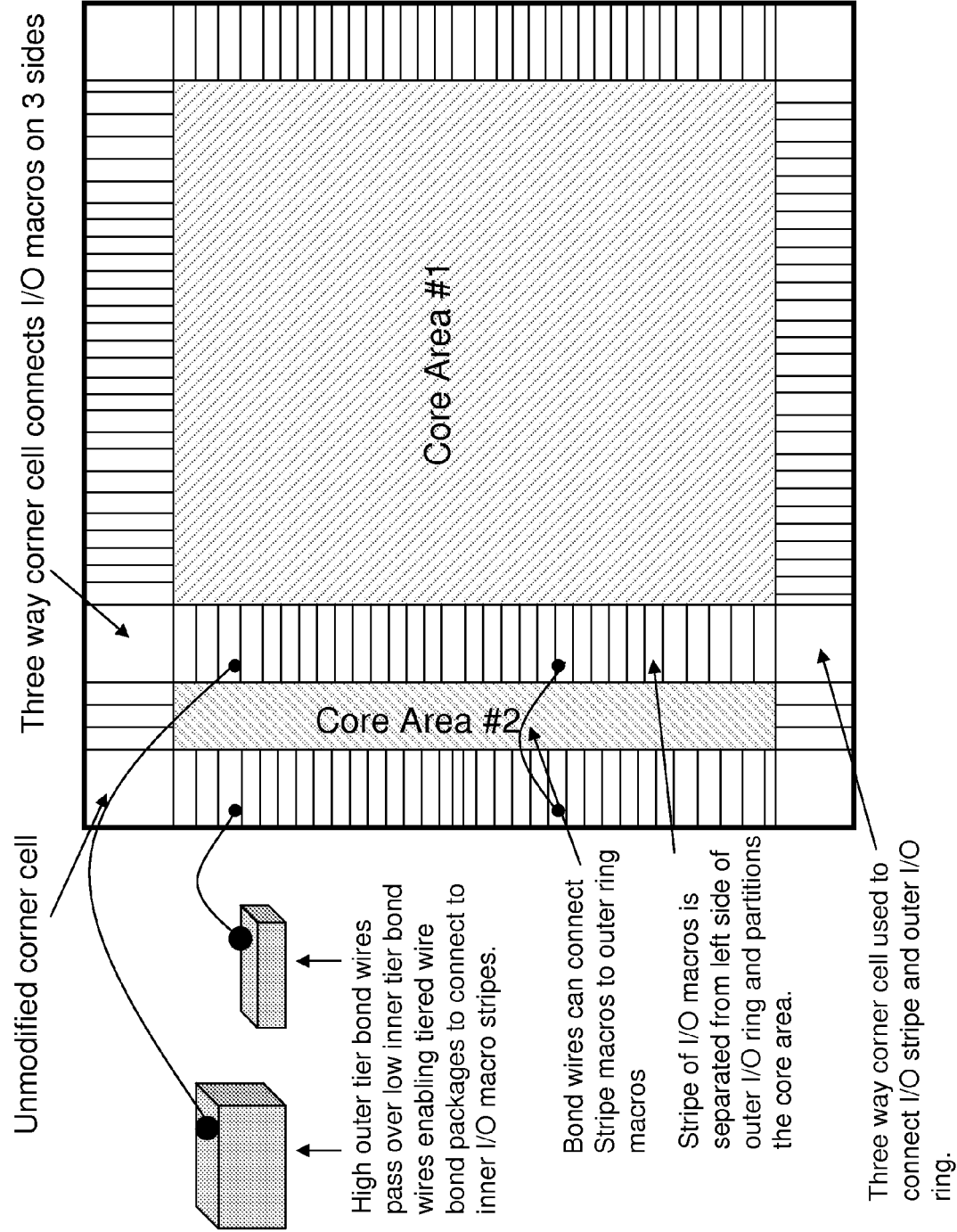
FIG. 36B (Example of a tiered wire bond IC, with a stripe of inner I/O macros)

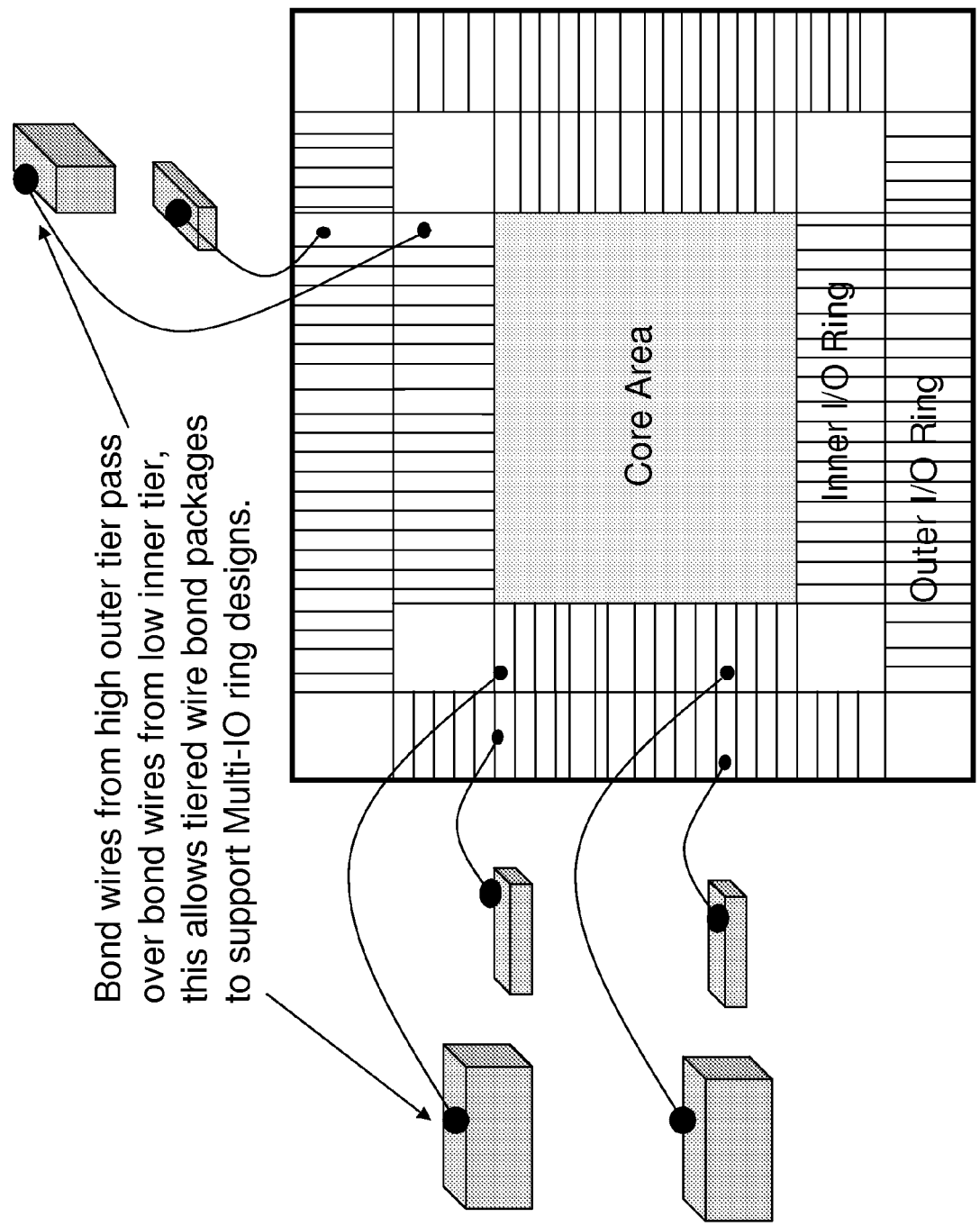
FIG. 37 (Example of a tiered wire bond IC with inner and outer I/O rings)

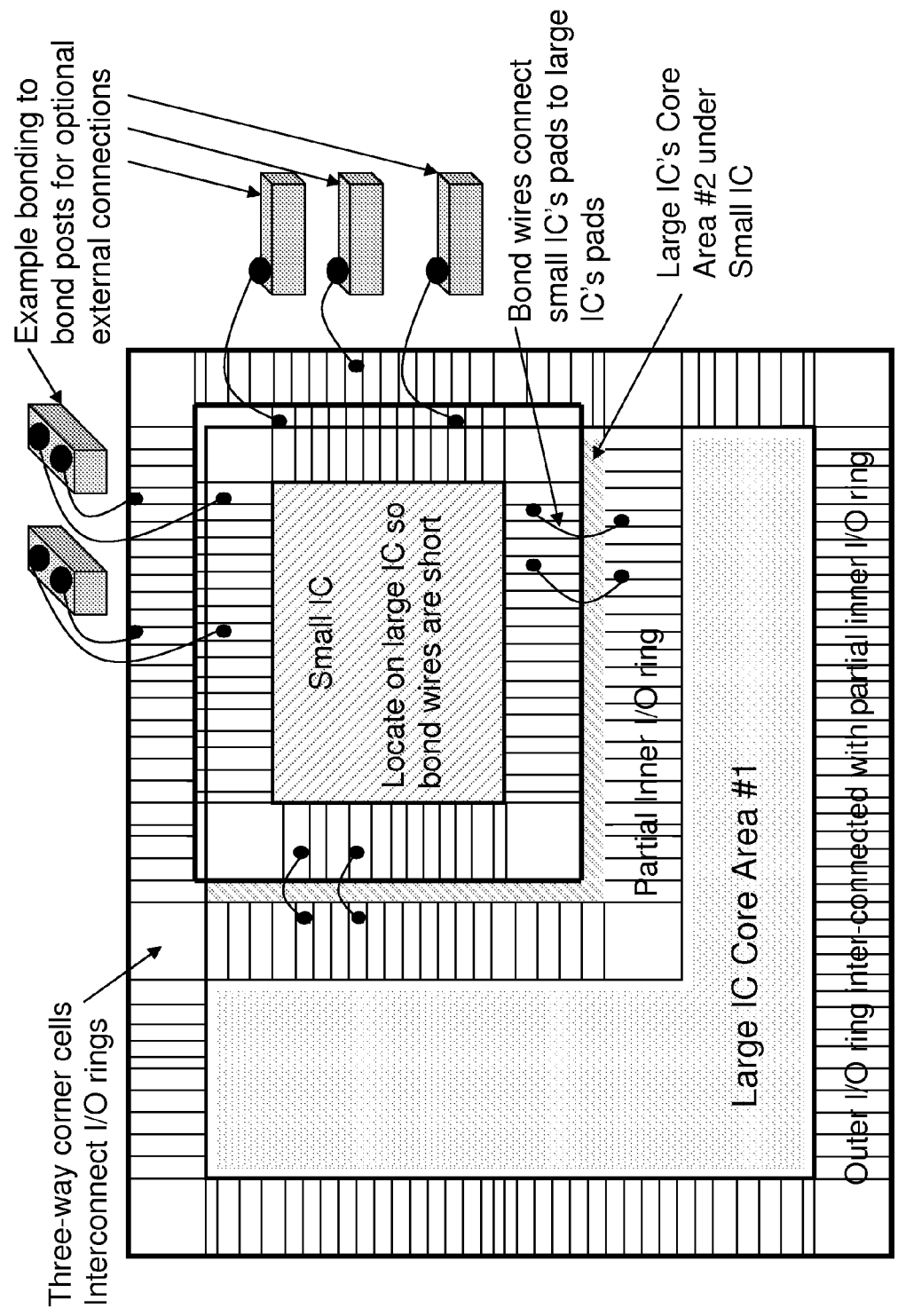
FIG. 38A (Example of stacked IC die that makes bond wire connections to inner I/O ring stripes and package bond posts)

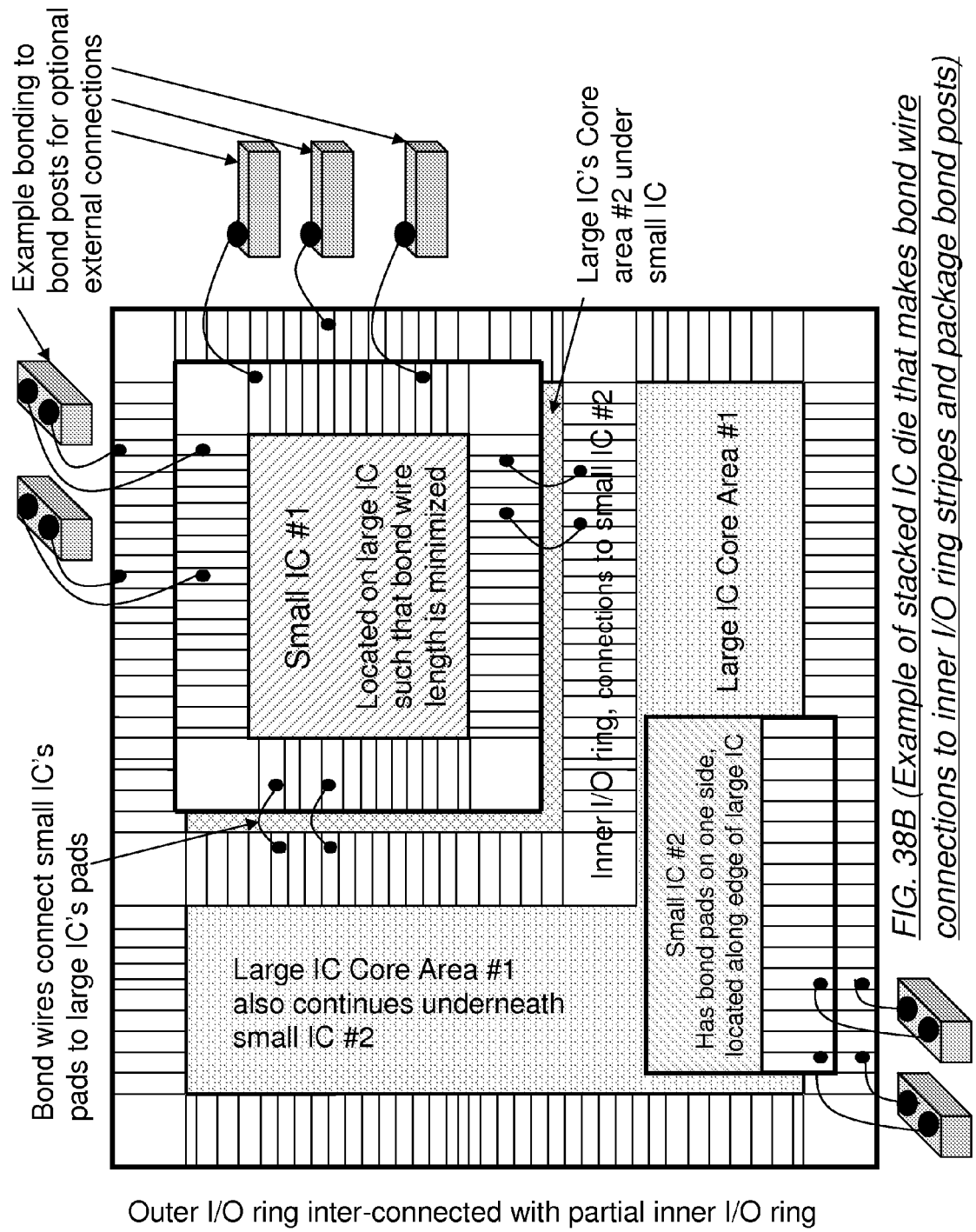

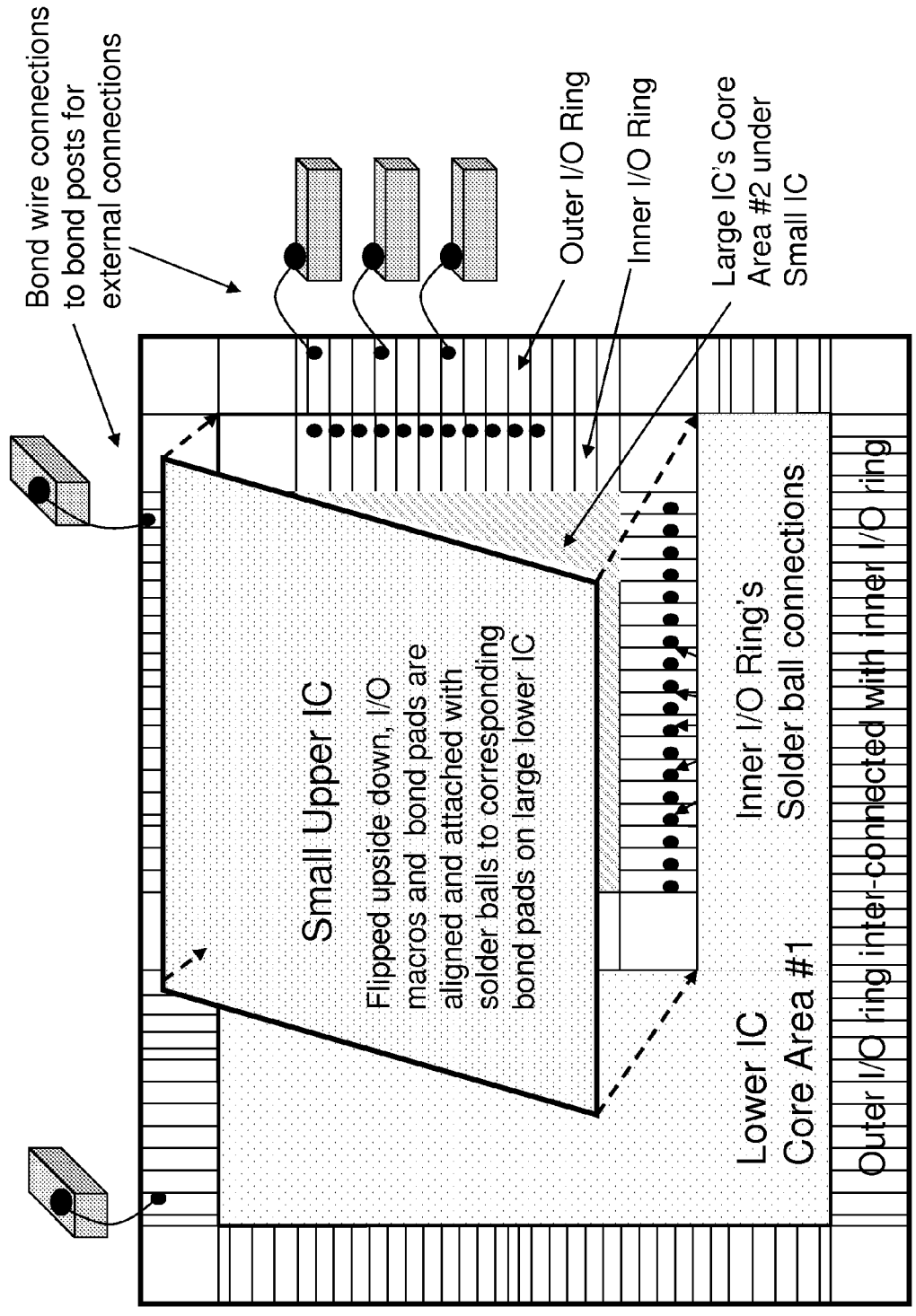
FIG. 38C (Example of stacked IC die using Chip on Chip technology with Solder bumps)

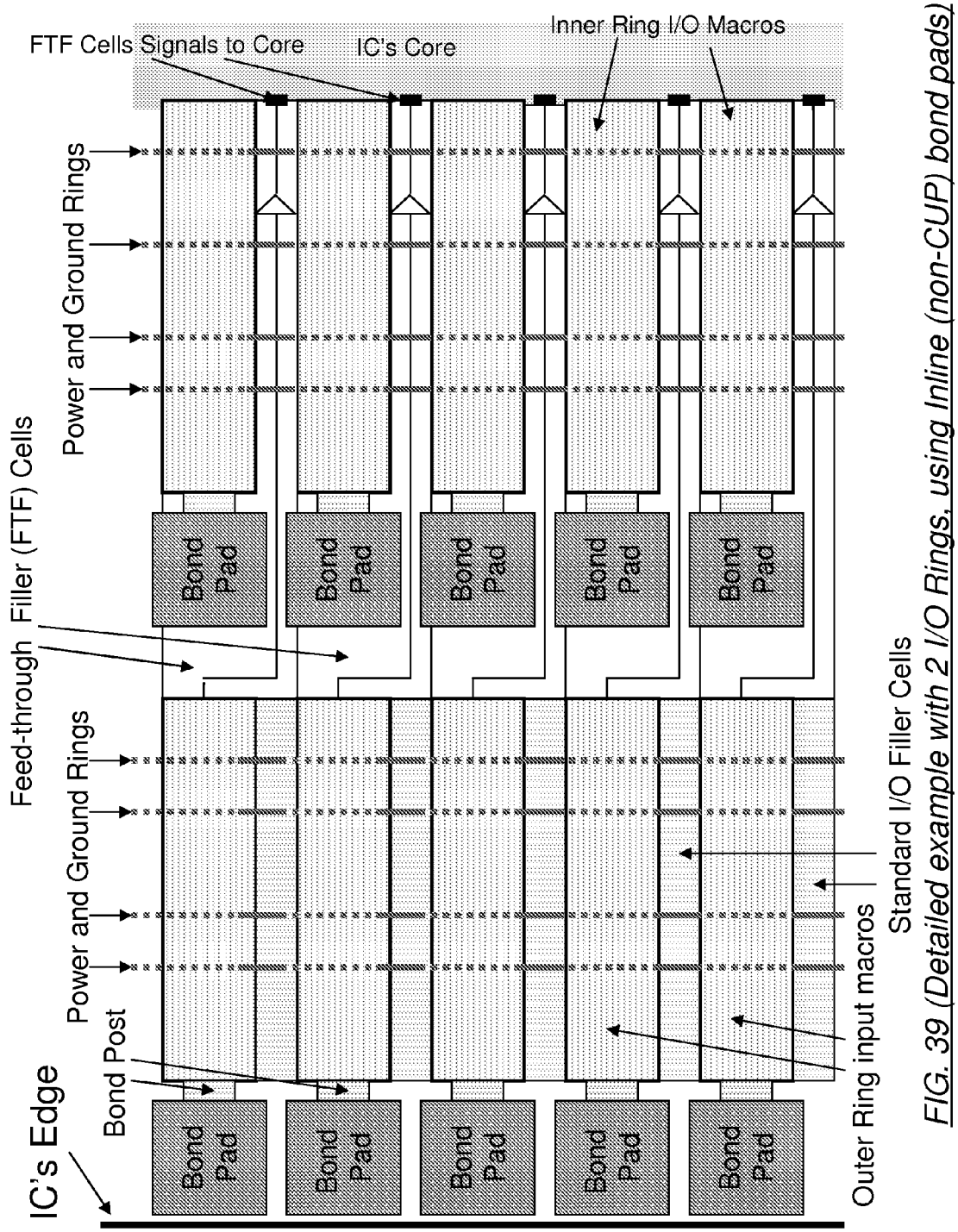
FIG. 39 (Detailed example with 2 I/O Rings, using Inline (non-CUP) bond pads)

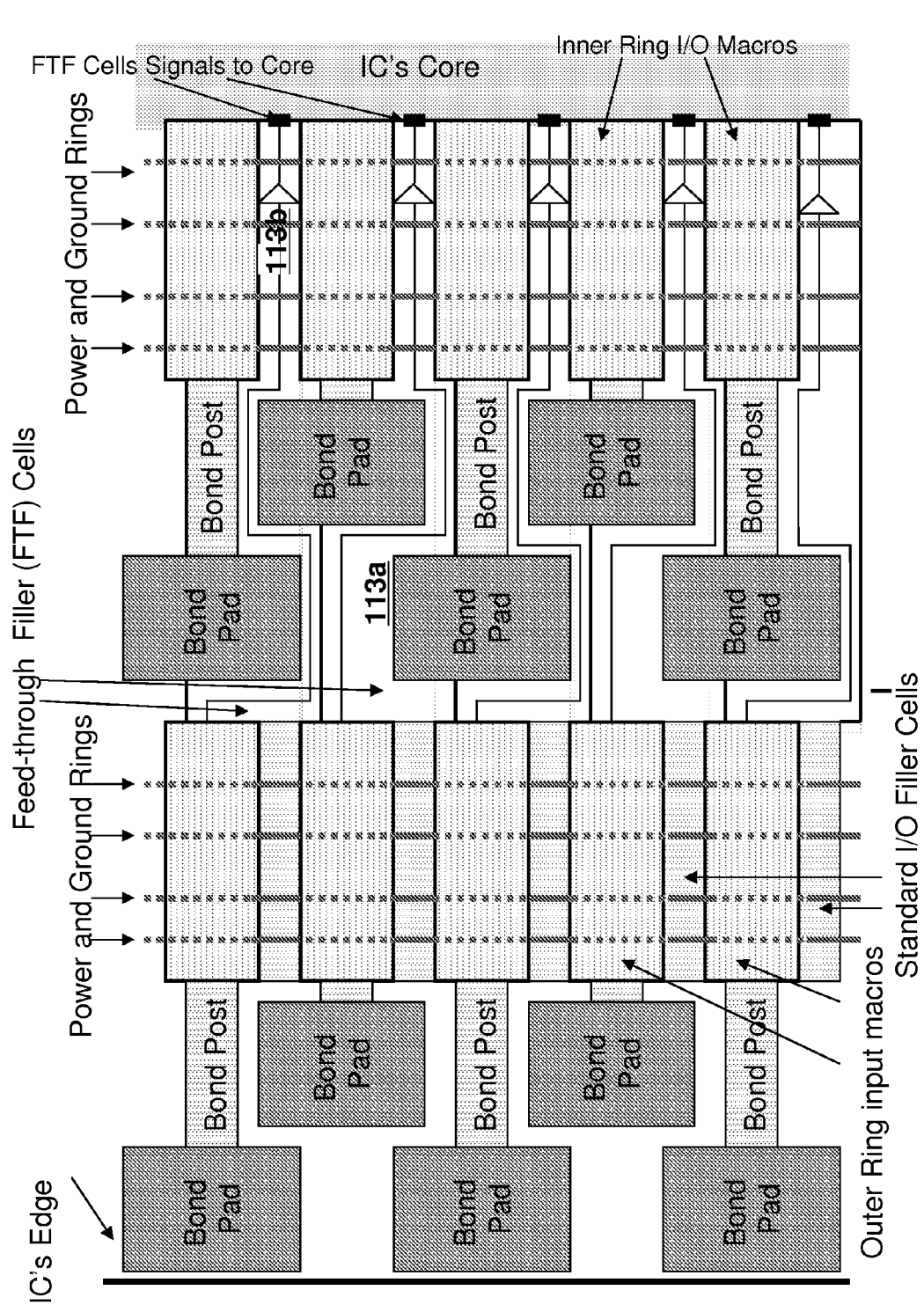
FIG. 40 (Detailed example with 2 I/O Rings, using Staggered (non-CUP) bond pads)

INTEGRATED CIRCUITS WITH MULTIPLE I/O REGIONS

BACKGROUND

Most integrated circuits (IC's) contain two main regions (1) a core region, which contains most of the IC's functional circuitry and (2) an input/output or I/O region. The I/O region provides the electrical interface between the IC's core region and external circuitry.

Further more, most integrated circuits (IC's) designed today are designed using a library of modular circuit descriptions that are arranged by a circuit designer using an EDA (electronic design automation) tool. These modular circuit descriptions are often referred to as circuit macros or cell macros, because they contain logical and physical descriptions of circuitry and traces that design tools utilizes when preparing for actual IC fabrication. Core regions of I/C's may contain various logic, memory, or processor macros, but a number of those macros may be proprietary or custom designed and additional circuitry may be hand designed, reflecting the highly variable nature of the logic or analog functions of an I/C core. The I/O regions of IC's, however, tend to be much more similar in their function and thus a number of I/O cell libraries have become standardized and are widely used in many different IC designs. Thus, an additional aspect of IC design involves the use of readily available library macro cells and standard design flows for at least parts of most ICs, in particular for I/O regions. Commonly used library cells are readily available from vendors.

The I/O region is frequently called an I/O ring because it contains I/O circuit macros (or cells or modules) that are laterally connected together to form a generally continuous rectangle that is wrapped around the perimeter of the core region. The I/O macro lateral connections are used to efficiently distribute I/O and core power and ground supplies to the I/O macros and thus minimize noise and maximize electrostatic discharge (ESD) protection. The I/O macros contain the interface circuitry for higher supply voltage external signals and for lower supply voltage core signals. I/O macros are typically connected to bond pads that in turn are connected to external pins, leads or solder bumps on the IC's package.

Thus, prior art I/O circuit macros are generally understood as a register descriptor language specification (or the circuit area that the RDL describes) for an I/O region that specifies one or more I/O connections (such as to a bond pad) and lateral connections to other I/O macros used to efficiently distribute I/O and core power and ground supplies and interface circuitry to connect higher supply voltage external signals to lower supply voltage core signals. In typical prior art I/O macros, lateral connections are generally made from I/O macro to I/O macro, while connections transverse or perpendicular to the lateral connections involve I/O signals or power signals going from the I/O region to the IC's core circuitry.

IC costs increase as the IC's area increases, so there is strong motivation to reduce IC area and minimize cost. The area of most IC's is often defined by either the area enclosed by the I/O ring or the area of the core region. When the area bounded by the inside perimeter of the I/O ring, which is related to the number and size of I/O macros, exceeds the area occupied by the IC's core region circuitry, the IC is considered I/O limited or pad limited. In this case the IC would have excess or unused core region area. When the perimeter of core area is larger than the inner perimeter of the I/O ring the IC is considered core limited. In this case the I/O ring would need to be expanded to fit around the core area so there would be excess space in the I/O ring. It follows that IC's with large I/O macro counts and relatively small amounts of core circuitry tend to be I/O limited. IC's with relatively large core areas and relatively low I/O macro counts tend to be core limited. As IC technology has advanced and IC feature sizes shrunk, core circuit density has increased faster than the I/O circuit density. This is generally because the interface and current carrying demands of the I/O circuitry limit the extent to which that circuitry can be miniaturized. As a result, for some time, an increasing percentage of the IC designs have become I/O limited.

Older IC packaging technologies rely on wire bonding to make electrical connections from the I/O macro bond pads to the package pins or leads. I/O macros and their corresponding bond pads are often placed in a rectangular I/O ring around the IC's core since this minimizes bond wire lengths and helps prevent bond wires from crossing. FIG. 1 (Prior Art) shows an example of an IC with a traditional I/O Ring that uses a wire bonded package. I/O rings are also used to distribute core power and ground supplies plus I/O power and ground supplies to the I/O macros in the I/O ring. I/O macros that are attached to bond pads generally contain electrostatic discharge (ESD) diodes that are connected to the I/O power or I/O ground supplies provided by the I/O ring. As the number of ESD diodes tied to the I/O power and I/O ground supplies increases, the IC can handle greater amounts of unwanted static charge, thus increasing the IC's reliability. This need for interconnected ESD diodes provides another strong incentive for IC's to use I/O macros that have I/O ring topologies. Corresponding power and ground supplies are connected together by the I/O ring to help minimize supply related nose thus improving signal quality. The power and ground supplies of the I/O macros placed in the I/O ring normally have lateral connections connected by abutment. For example, I/O power and I/O ground supplies plus core power and core ground rings pass laterally through the I/O macros in a chain-like manner around the entire I/O ring. Individual I/O signals that pass from the bond pads to or from the IC's core typically use the most direct path straight to the IC's core, which is normally transverse or perpendicular to the direction of the I/O ring around the IC's core and normally separated from the lateral connections by being placed in a different vertical layer of the I/C. Placing I/O macros in a peripheral I/O ring also removes I/O macros from the IC's core area, so they don't obstruct core signal routing.

Given the benefits of I/O ring implementations, most I/O macros have been designed to be used in I/O rings. The cost and effort to design I/O macros is significant. As a result, much of the IC design community uses readily available I/O macros that have been optimized for use with I/O ring implementations. This design community acceptance further supports the continued wide use of I/O macros designed to support I/O ring topologies.

I/O Filler Cells

Many I/O rings use I/O filler cells to close gaps between I/O macros that are physically separated. Existing I/O filler cells generally contain fixed lateral connection metal routing stripes that are used to make lateral power and ground supply plus well region and if applicable diffusion region connections between the separated I/O macros. For example if the two I/O macros are 5 um (microns) apart, a 5 um wide I/O filler cell is used to fill the gap between the I/O macros and make the appropriate routing, well region and if applicable diffusion region connections. I/O Filler cells are often available in various sizes for example 1 um wide, 5 um wide, 10 um wide and 50 um wide, and generally have a length that is consistent with their neighboring I/O macros. Most available I/O filler cells have integer micron widths, and I/O macros are usually separated by integer micron distances to facilitate placement of I/O filler cells. For example a 7 um I/O macro to I/O macro separation would be filled by one 5 um filler cell plus two 1 um filler cells. I/O libraries typically include a set of I/O filler cells that are designed to be compatible with the I/O macros in the I/O library. I/O filler cells also include sets of power and ground supply ports that match the physical locations of the corresponding ports on neighboring I/O macros. Most existing I/O filler cells support abutment based I/O ring power and ground lateral connections with metal routing in their upper metal layers.

FIG. 2 (Prior Art) provides a high level example of I/O filler cells connecting together the I/O rings of separated I/O macros. FIG. 3 (Prior Art) provides a detailed example of an I/O filler cell that connects I/O ring segments of two separated I/O macros. Wide I/O filler cells may contain decoupling capacitors that help reduce power and ground noise. Narrow I/O filler cells usually don't have enough room to contain decoupling capacitors and contain simple metal I/O ring routing segments and ports.

Flip Chips and RDL

A newer IC packaging technology, which is called flip chip technology, utilizes solder bumps that are placed on the top of the IC, and these bumps in turn are routed in a Redistribution Layer (RDL layer) to corresponding bond pads in the I/O macros. Because the external signals are connected through transmission elements that run vertically to the I/C, flip chip technology supports I/O macro placements throughout the IC. FIG. 4 (Prior Art) provides an example of redistribution layer routing from bond pads on the IC to solder bumps in a flip-chip design. RDL layers are added to IC's after wafer fabrication and involve wide and thick metal layers typically having well over 100× the cross sectional area of typical signal routes in the underlying IC. It follows that RDL layers are suitable for external I/O related connections, for example between an I/O cell and its' associated soldier bump site, as well as various power and ground connections. RDL layers are unsuitable for signal connections that use relatively small drive transistor such the core logic in most IC's. During Flip chip package assembly the IC is flipped upside down and the solder bumps are physically connected to bump pads in the IC package. These bump pads are in turn connected through the package's substrate layers to soldier balls on the underside of the IC package. FIG. 5 (Prior Art) shows a side view a flip chip IC placed in a flip chip package. Flip chip packages support greater numbers of I/O's than wire bonding packages, and flip chip packages that support 2000+ I/O's are commonly available. Flip chip packages usually have lower electrical parasitics than wire bond packages so they can support higher performances. Due to the use of the redistribution layer and solder bumps, flip chip packaging technology doesn't utilize bond wires, so bond wire crossing limitations and maximum bond wire length limitations aren't relevant. It follows that Flip Chip packages can support I/O macro placement anywhere in the IC's core assuming ESD requirements are met and the I/O macros have access to I/O power and ground supplies plus core power and ground supplies. FIG. 6 (Prior Art) shows an example of an IC that has I/O's scattered throughout its' entire area rather than placing the I/O macros in an I/O ring around the perimeter of the core area. This embodiment has been called an area I/O solution. The I/O macro design and the IC design need to resolve power and ground supply distribution issues along with ESD related interconnection requirements when placing I/O macros in a non-I/O ring topology. Although Flip Chip packages can support flexible I/O macro placement, many IC designs in Flip Chip packages use I/O ring topologies because most I/O macros are designed for I/O ring topologies; I/O rings have efficient proven design flows; and core area routing is more efficient when I/O macros are not placed in the core area. While Flip-Chip packages provide some inherent I/O placement flexibility, Flip Chip designs still flexibility in providing multiple I/O regions.

Short Wide, Tall Thin, and Circuit Under Pad (Cup)

Another key aspect of IC design and packaging involves bond pad implementations. Some core limited designs use short wide I/O macros that are connected to in-line bond pads that have smaller widths than the I/O macros. Some I/O limited designs use tall thin I/O macros that are connected to staggered bond pads, where the bond pads are wider than the I/O macros. In this case the bond pads are placed in two parallel staggered rows for attachment to corresponding I/O macros.

A newer I/O pad technology involves circuit under pad (CUP) implementations where the bond pad is placed on top of the I/O macro. The CUP approach also supports staggered bond pad placement so the bond pads can be wider than the I/O macros. FIG. 7 (Prior Art) shows examples of I/O macros connected to bond pads using: in-line, staggered and CUP implementations. Both Wire Bond and Flip Chip packages support use of in-line, staggered and CUP bond pad implementations. The use of CUP bond pads reduces the size of the I/O region area, because the bond pads do not consume additional placement area outside of the I/O macros. Due to this area saving CUP bond pad embodiments are often preferred. In some unusual cases in-line or staggered bond pads may be over CUP bond pads. For example, some IC processes or I/O macro libraries may not support CUP implementations.

PRIOR ART PATENTS

U.S. Pat. No. 6,222,213

The advantages of I/O ring implementations have resulted in various attempts to implement I/O limited flip chip designs while trying to obtain some of the benefits of I/O ring topologies. FIG. 8A (Prior art reference U.S. Pat. No. 6,222,213) shows an example of an I/O limited flip chip design with a complete outer I/O ring plus inner I/O macros placed in a ring like topology where there are large separations between inner I/O macros. In general, U.S. Pat. No. 6,222,213 is highly focused on various diffusion guard band implementations that are used to improve I/O latch-up protection. The present invention, by contrast, provides higher level solutions needed to implement multiple interconnected I/O rings while minimizing I/O region area, minimizing I/O related signal noise, and improving ESD results.

U.S. Pat. No. 6,222,213 differs from the present invention in a number of fundamental areas. First, the inner I/O macros are separated to provide space to hand route signals to route from the outer I/O ring to and from the core area. The present invention, in contrast, provides an automated approach to route outer I/O ring signals to and from the core area. Existing EDA tools and EDA design flows have been optimized to support complete, that is interconnected, I/O rings. Failure to provide complete I/O ring embodiments generally limits EDA tool performance and limit design flow efficiency.

Second, U.S. Pat. No. 6,222,213 refers to using blank cells to produce complete inner I/O macro diffusion rings, which is done to improve latch-up resistance. However, this doesn't address connecting corresponding I/O supply rings across the gaps between I/O macros. If traditional I/O filler cells were used they would block signal routing connections between the outer I/O ring macros and the core area. The only viable option for U.S. Pat. No. 6,222,213 is to route the I/O power and ground rings by hand, which further complicates the design flow.

The third difference involves using macros with in-line bond pads rather than CUP I/O bond pads. The in-line bond pads of the inner I/O ring and the routing space between outer I/O ring macros and inner I/O macros results in having a significant physical separation from outer I/O ring macros to the inner I/O macros. Due to this separation, corresponding outer I/O ring and inner I/O macro power and ground supplies would remain separate that is not connected together. Due to these limitations ESD protection won't be optimized, supply noise won't be minimized, and the I/O area also won't be minimized.

U.S. Pat. No. 7,165,232

FIG. 9 (Prior art reference U.S. Pat. No. 7,165,232) shows an example of placing the I/O macros in separated sets of rows and columns around the core area. This approach supports higher I/O macro counts for I/O limited designs while also supporting routing from the outer sets of I/O macros through the inner sets of I/O macros to and from the IC's core. However, this approach doesn't benefit from using an I/O ring topology.

U.S. Pat. No. 68,360,026

FIG. 10 (Prior art reference U.S. Pat. No. 68,360,026) shows an IC with a core area surrounded by two concentric I/O rings. Based on use of currently available EDA tools and I/O macros in the inner I/O ring, signal routing from the outer I/O ring to and from the IC's core area would be completely blocked by the inner I/O ring macros. One may be able to work around this limitation and hand route signals on a case by case basis under the inner I/O ring but this would result in an overly cumbersome design flow. Since this prior art approach doesn't address connecting outer I/O ring macros to core logic, it only appears to support the functional equivalent of having two separate IC's co-located on one common die. This implementation also references bond pads that are attached to the I/O macros, which implies using either inline or staggered I/O Macros. This use of attached bond pads results in placing bond pads between the inner I/O ring macros and the outer I/O ring macros creating a large gap between the two I/O rings. It follows that the inner and outer I/O rings remain physically separated so their supplies would also be separated. Due to this limitation, ESD protection won't be optimized, supply noise won't be minimized, and the I/O area won't be minimized.

SUMMARY

The present invention, in various embodiments, involves a method and/or devices that support efficient design of multiple I/O regions using automated design tools and a set of novel specialized I/O macro cells. According to specific embodiments, the invention increases the number of I/O macros that can be added around the core area of an IC by enabling the use of multiple I/O rings (or regions) that support passing signals from the outer I/O ring through the inner I/O rings or region and to and from the IC's core area, while minimizing supply noise and minimizing I/O region area. These multiple-integrated I/O rings or regions optimize ESD protection by efficiently connecting ESD diodes in parallel while minimizing supply noise and minimizing I/O region area. In further embodiments this invention supports adding interconnected stripes of I/O macros to IC's. These additional I/O rings and/or I/O macro stripes can also be used to partition an IC's core for voltage and/or noise isolation purposes. The invention is compatible with automated IC design flows for high pin count IC designs and compatible with existing standard or proprietary I/O library macros that have been designed to support I/O ring topologies and the invention can be used in new IC design paradigms. As a result, the invention in specific embodiments enables the design of more complex and flexible I/O structures without requiring redesign of standard I/O macros and allowing for use of existing design tools. In other embodiments, methods and systems of the invention can be incorporated in new design tools and I/C macro libraries to provide the enhanced I/O region flexibility described herein.

Embodiments of the invention can be used in wide variety of IC's including Application Specific Integrated Circuits (ASIC's), programmable devices such as FPGA's and other programmable logic devices, memory devices, analog devices, mixed analog plus digital devices, and large digital microprocessor and/or graphics processor devices. In addition to providing greater flexibility of I/O region design in standard IC, specific embodiments can enhance the I/O macro placement flexibility provided by Flip Chip packaging technology to provide complex I/O structures. The invention can also be used to facilitate the design of I/O regions in ICs with innovative wire bond package solutions and newer technologies such as SiP (System in Package) and CoC (Chip on Chip packaging).

Also note, this invention allows one to interconnect various I/O rings or portions of I/O rings within an IC to form a larger structure. While this larger structure might be regarded as one compound I/O ring, according to specific embodiments, in terms of circuit design and operation, it is more helpfully understood as involving separate I/O structures that are joined but remain separate. By handling these compound structures as joined structures, specific embodiments facilitate use of existing tools and design practices to more easily design and verify novel and complex I/O region designs.

This invention may be used in a variety of applications and situations that require or would benefit from advanced multiple-I/O ring designs and or additional isolation. The present invention may also be incorporated into I/O description libraries, or other systems or methods related to logic circuit design, emulation, testing or production as will be understood in the art.

A further understanding of the invention can be obtained from the detailed discussion of specific embodiments and specific circuit designs incorporating aspects of the invention below. For purposes of clarity, this discussion refers to devices, methods, and concepts in terms of specific examples. However, the methods and systems described herein may operate with a variety of devices and equipment and in a variety of applications. It is therefore intended that the invention not be limited except as specifically provided in the attached claims.

In addition, it is well known in the art that logic systems, circuits and methods such as described herein can include a variety of different functions and different components in a modular fashion. Different embodiments of the invention can include different mixtures of functions and elements and may group various functions as parts of various elements. For purposes of clarity, the invention is described in terms of systems that include many different innovative components and innovative combinations of innovative components and known components. No inference should be taken to limit the invention to combinations containing all of the innovative components listed in any illustrative embodiment in this specification.

Functional aspects of the invention that are implemented on a computer or logic circuitry, as will be understood from the teachings herein, may be implemented or accomplished using any appropriate environment or programming language such as C, C++, Cobol, Pascal, Java, Java-script, assembly, or machine code programming, custom logic circuits and languages for specifying them such as Verilog, VHDL, SPICE, gate level netlist representations, or RTL netlist representations. In some embodiments, methods and/or systems described or claimed herein may be wholly incorporated into a programmed information device, either for simulation, emulation or usage purposes.

In the circuit design art, a number of words or phrases describing aspects of design come to have specific meanings, which sometimes vary from system to system or publication or publication. It is intended that all terms used herein to describe the invention should be given their broadest possible meaning in the art not inconsistent with descriptions provided herein.

When used herein, "the invention" should be understood to indicate one or more specific embodiments of the invention. Many variations according to the invention will be understood from teachings herein to those of skill in the art.

All references, publications, patents, and patent applications cited herein are hereby incorporated by reference in the entirety for all purposes.

BRIEF DESCRIPTION OF DRAWINGS

FIG. 6 illustrates an example of Prior Art showing an IC that has I/O macros and bond pads are across the IC's surface. This example uses a flip chip package and does not have I/O macros arrayed in an I/O ring topology.

FIG. 7 illustrates an example of Prior Art showing examples of I/O macros connected to in-line bond pads, staggered bond pads and CUP (Circuit under Pad) bond pads.

FIG. 8A illustrates an example of prior art, reference U.S. Pat. No. 6,222,213, showing an outer I/O ring plus and inner set of I/O macros that are separated so signals can route between the I/O macros to the IC's core. This example uses a flip chip package.

FIG. 8B is a detailed left side view of FIG. 8A showing an outer I/O ring plus an inner set of I/O macros that are separated so signals can route between the I/O macros to the IC's core. This example uses a flip chip package.

FIG. 9 illustrates an example of Prior Art, reference U.S. Pat. No. 7,165,232 with I/O macros arrayed near the IC's sides that surround the core area. This example doesn't have I/O rings, but it uses a flip chip package.

FIG. 10 illustrates an example of Prior Art reference U.S. Pat. No. 6,836,026 showing an IC with two concentric I/O rings around the IC's core area. The I/O macros are connected to in-line bond pads, and this physically separates the inner and outer I/O rings. No method has been provided to route outer I/O ring signals through the inner I/O ring to or from the IC's core.

FIG. 11 is an example of an IC with 2 concentric integrated I/O rings that rely on feed-through-filler cells to pass signals from the outer I/O ring to and from the IC's core.

FIG. 12 is a detailed side area view of inner and outer I/O rings shown in FIG. 11. Feed through filler cells in the inner I/O ring connect outer I/O ring signals with the IC's core. Circuit under Pad (CUP) bond pads are used to minimize inner and outer I/O ring separation.

FIG. 13 is another example of an IC using 2 concentric integrated I/O rings that rely on feed-through-filler cells to pass signals from the outer I/O ring to and from the IC's core.

FIG. 14 is a detailed view of FIG. 13 showing outer ring input macros that use input feed-through filler cells.

FIG. 15 is a detailed view of FIG. 13 showing outer ring output macros that use output feed-through filler cells.

FIG. 16 is a detailed view of FIG. 13 showing outer ring three-state macros that use three-state feed-through filler cells.

FIG. 17 is a detailed view of FIG. 13 showing outer ring bidirectional macros that use bidirectional feed-through filler cells.

FIG. 18A is a detailed view of FIG. 13 showing a triple capacity FTF cell that configures three bidirectional outer ring I/O macros to have output macro functions.

FIG. 18B is a detailed view of FIG. 13 showing a triple capacity FTF cell that configures three bidirectional outer ring I/O macros to have input, output and bidirectional functions.

FIG. 18C is a detailed view of FIG. 13 showing one bidirectional FTF cell that uses flip flops to dynamically configure a bidirectional outer ring I/O macro's function.

FIG. 19A is a detailed view of FIG. 13 showing Feed-Through Filler cells that have been created from a pair of rectangular sub-cells. This figure also has ground shielded signals.

FIG. 19B is a detailed view of FIG. 11 showing integrated higher level I/O macros that contain FTF cells, I/O filler cells, outer ring I/O macros and inner ring I/O macros.

FIG. 19C is a detailed view of FIG. 13 showing Feed-Through Filler cells and a customized outer ring I/O Filler Cell that taps Core_VSS port and provides a port to connect the ground shield route. This ground shield also taps the inner I/O ring Core_VSS effectively cross connecting inner and outer ring Core_VSS supplies within the FTF cell.

FIG. 20 is a detailed corner view of FIG. 13 showing inner and outer ring I/O macros plus two I/O inter-connection macros and three feed-through filler cells.

FIG. 21 is a detailed view of FIG. 20 showing an I/O inter-connection cell that connects corresponding power and ground supplies between the inner and outer I/O rings.

FIG. 22 is an example IC showing high capacity feed-through filler cells near both left side corners.

FIG. 23A is a detailed corner view of FIG. 22 showing a high capacity corner feed-through cell and an I/O inter-connection macro.

FIG. 23B is a more detailed corner view of FIG. 23A, showing a high capacity corner feed-through filler cell implementation.

FIG. 23C is a graphical example of I/O macro placements along the left side of an IC, that reflect the example reference scripts and netlist that have been provided in the text.

FIG. 24 is an example of an IC showing 2 concentric I/O rings that contain 3 wide parallel LVDS IO macro interfaces that connect to Serdes cores, a PLL is also included.

FIG. 25 is an example of an IC showing 3 concentric I/O rings.

FIG. 26 is an example of an IC showing an I/O ring plus vertical I/O macro stripes added to the left and right sides.

FIG. 27 is an example of an IC showing an outer I/O ring enclosing two inner I/O rings that enclose two separate core areas.

FIG. 28 is an example of an IC that shows an outer I/O ring enclosing: core area #1, plus inner I/O ring #2 enclosing core area #2, plus inner I/O ring #3 enclosing core area FIG. 29 is an example of an IC that shows an outer I/O ring enclosing narrow core area #1, plus an inner I/O ring enclosing core area #2.

FIG. 30 is an example of and IC that shows an outer I/O ring enclosing: core area #1, and core area2, plus a vertical I/O macro stripe that separates core area1 and core area2. The vertical I/O macro stripe is connected to the power and ground rings in the horizontal top and bottom segments of the I/O ring.

FIG. 31A is a detailed view of the top edge of FIG. 30 showing part of the top I/O ring segment and an example T-interconnection cell used to connect power and ground rings to the vertical I/O macro stripe.

FIG. 31B is a detailed view of the bottom edge of FIG. 30 showing a segment of the bottom I/O ring segment and an example three-way corner cell used to connect the power and ground rings to the vertical I/O macro stripe.

FIG. 31C is a detailed view along an I/O stripe separating two core areas that uses core to core FTF cells to pass signals between the two core areas.

FIG. 31D is a detailed view along an I/O stripe separating two core areas where the upper FTF cell has isolation gates and the lower FTF cell has buffers and/or level shifters.

FIG. 32A shows examples of core to core FTF cell functions.

FIG. 32B shows additional examples I/O to core FTF cell functions.

FIG. 32C shows additional examples of core to I/O FTF cell functions.

FIG. 33A shows a detailed examples of a core to I/O FTF cell function with a level shifter and Flip Flop.

FIG. 33B shows a detailed example of an I/O to core FTF cell function with a 2 to 1 mux and level shifters.

FIG. 34 shows a detailed example of an enhanced I/O VSS Supply cell that had an input signal feed-through added to it.

FIG. 35A is an example of an IC showing an isolated voltage control and regulation circuitry that supplies the core area using RDL and or FTF supply routing cells.

FIG. 35B shows an example with 2 FTF supply routing cells that connect two gated supplies from the voltage regulation and generation area to the digital core area.

FIG. 36A shows an example of an IC with an outer I/O ring and an extra strip of I/O's near the left side, which uses a tiered wire bond package that supports outer tier bond wires passing over inner tier bond wires. This is needed to bond to the inner I/O stripe.

FIG. 36B shows an example of an IC with an outer I/O ring plus an extra strip of I/O's near the left side that partitions the core into core area1 and core area2. This example uses tiered wire bond package that supports outer tier bond wires passing over inner tier bond wires. This is needed to bond to the inner I/O stripe.

FIG. 37 shows an example of an IC with inner and outer I/O rings that uses a tiered wire bond package that supports outer tier bond wires passing over inner tier bond wires. This is needed to bond to the inner I/O ring.

FIG. 38A shows an example of a SIP (system in package) solution that has two stacked IC's in one package. This example has a small upper IC located on top of a larger IC. The left and bottom sides of the upper IC have bond-wire connections to I/O stripes in the large lower IC's core area. The top and right sides of the upper IC have bond wire connections to bond posts along the top and right edges of both IC's. These posts can also be bonded to pads on the large IC, and or be connected to external package pins.

FIG. 38B is an example of a SIP (system in package) solution that shows three stacked IC's in one package. This example has two small upper IC's located on top of a larger lower IC. The left and bottom sides of Small IC #1 have bond-wire connections to I/O stripes in the large IC's core area. The top and right sides of Small IC #1 have bond wire connections to bond posts along the top and right edges of both IC's that are connected to external package pins. Small IC #2 only has bond pads along its' lower side, showing two example external bond wire connections to package bond posts.

FIG. 38C is an example CoC (Chip on Chip) package solution that shows two stacked IC's in one package. This example has a small upper IC that is flipped upside down with bond pads that are connected with solder bumps to bond pads in the inner I/O ring of the large lower IC. The bond pad openings of the two IC's must be aligned to make the solder ball connections.

FIG. 39 is a detailed view of FIG. 11 showing an IC with inner and outer I/O rings using in-line bond pads.

FIG. 40 is a detailed view of FIG. 11 showing an IC with inner and outer I/O rings using staggered bond pads.

DETAILED DESCRIPTION OF SPECIFIC EMBODIMENTS

Figure 1:
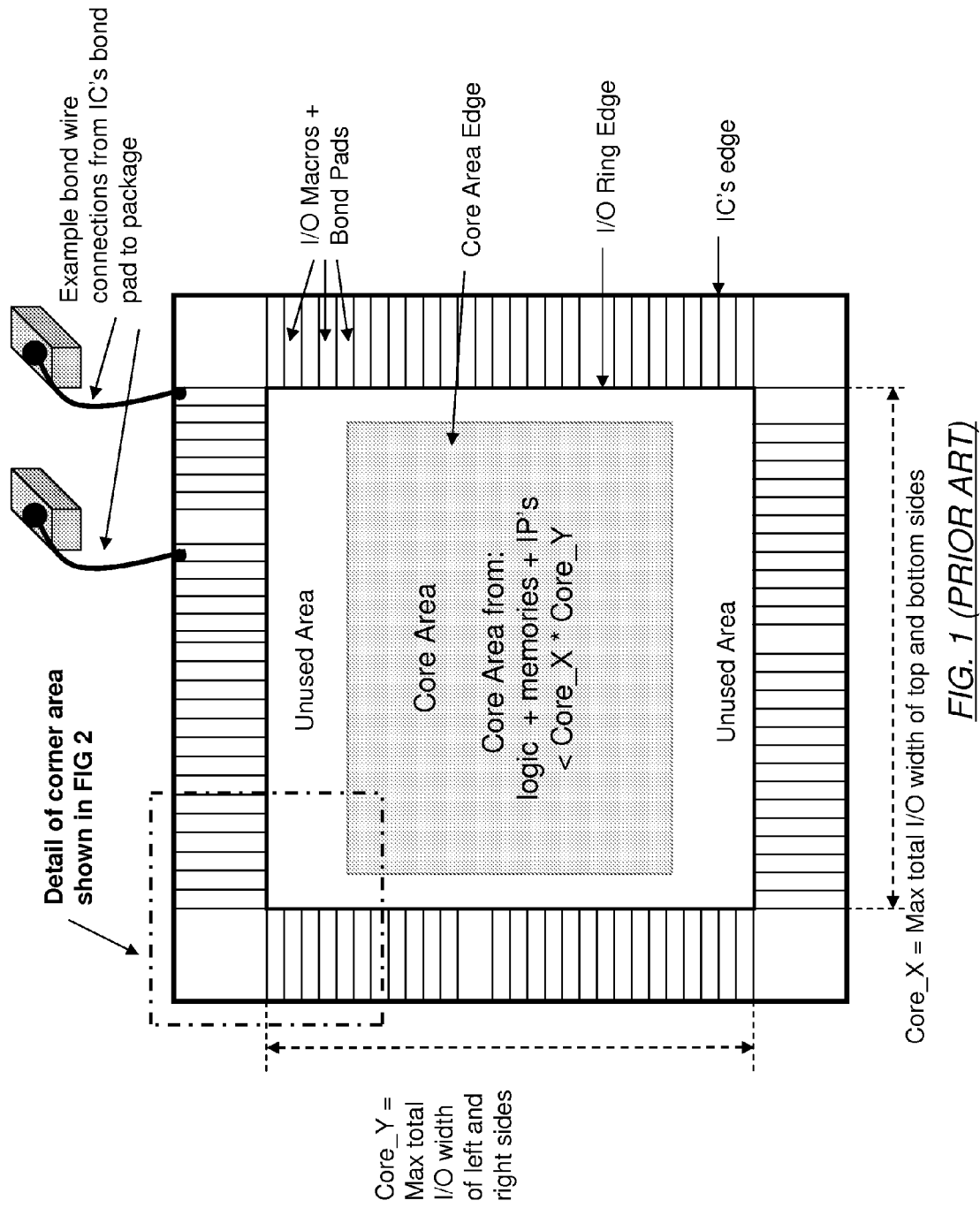
FIG. 1 illustrates an example of prior art showing an I/O limited IC where the area enclosed by the I/O ring exceeds the IC's core area. This example uses wire bonding.
Figure 2:
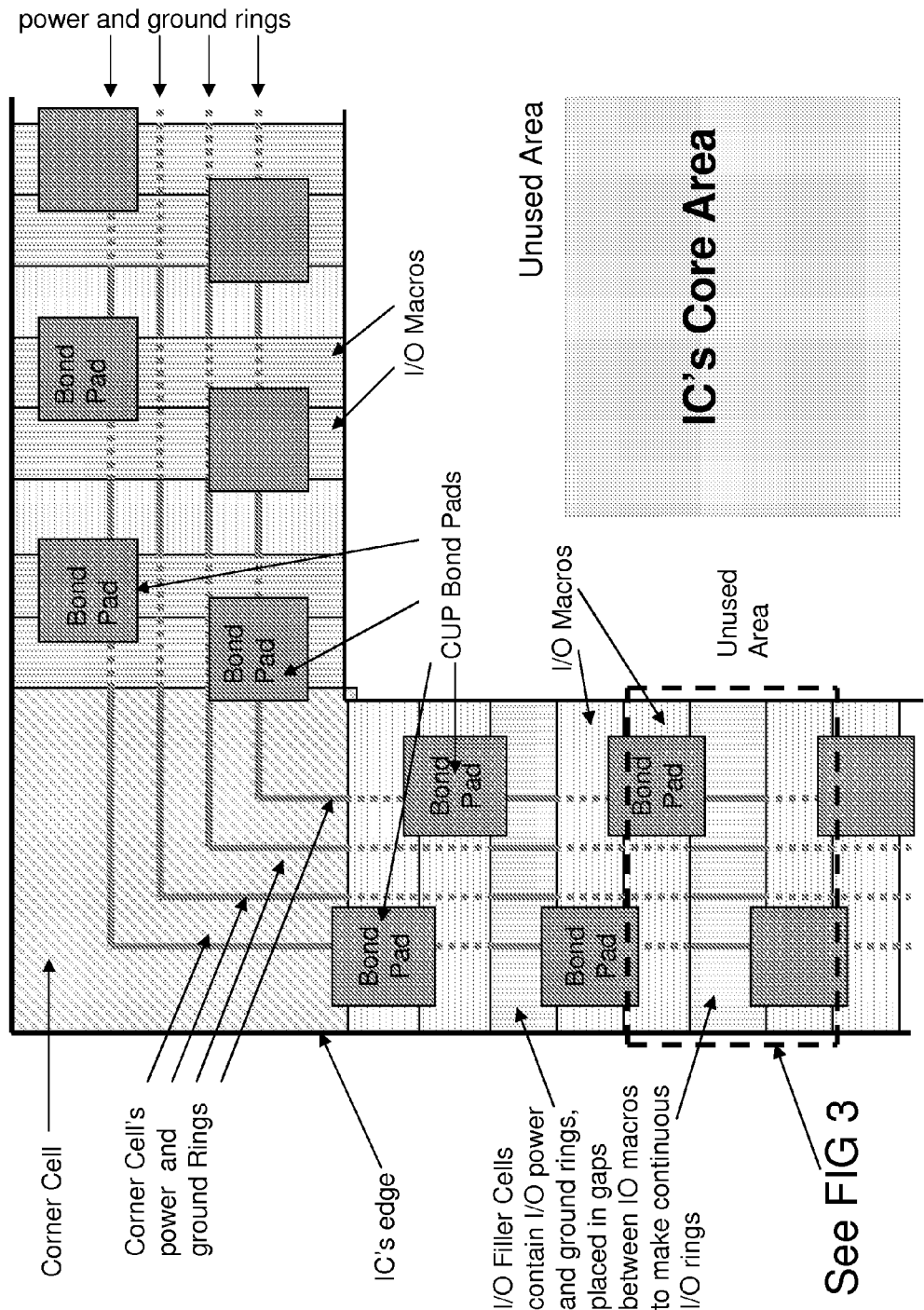
FIG. 2 illustrates a detailed corner area view of prior art shown in FIG. 1.
Figure 3:
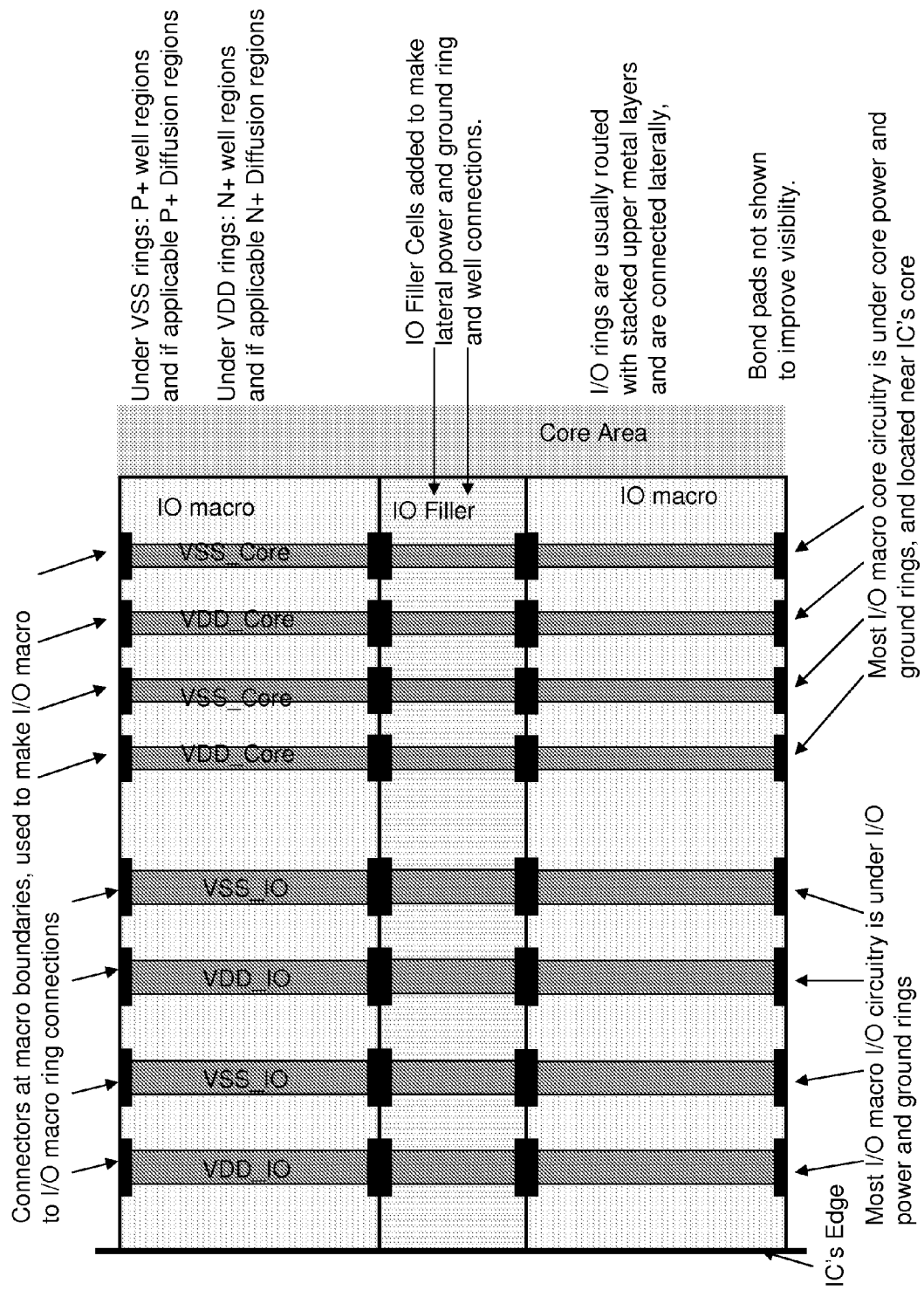
FIG. 3 illustrates a detailed side area view of prior art shown in FIG. 2, illustrating an I/O Filler cell filling the gap between two I/O macros.
Figure 4:
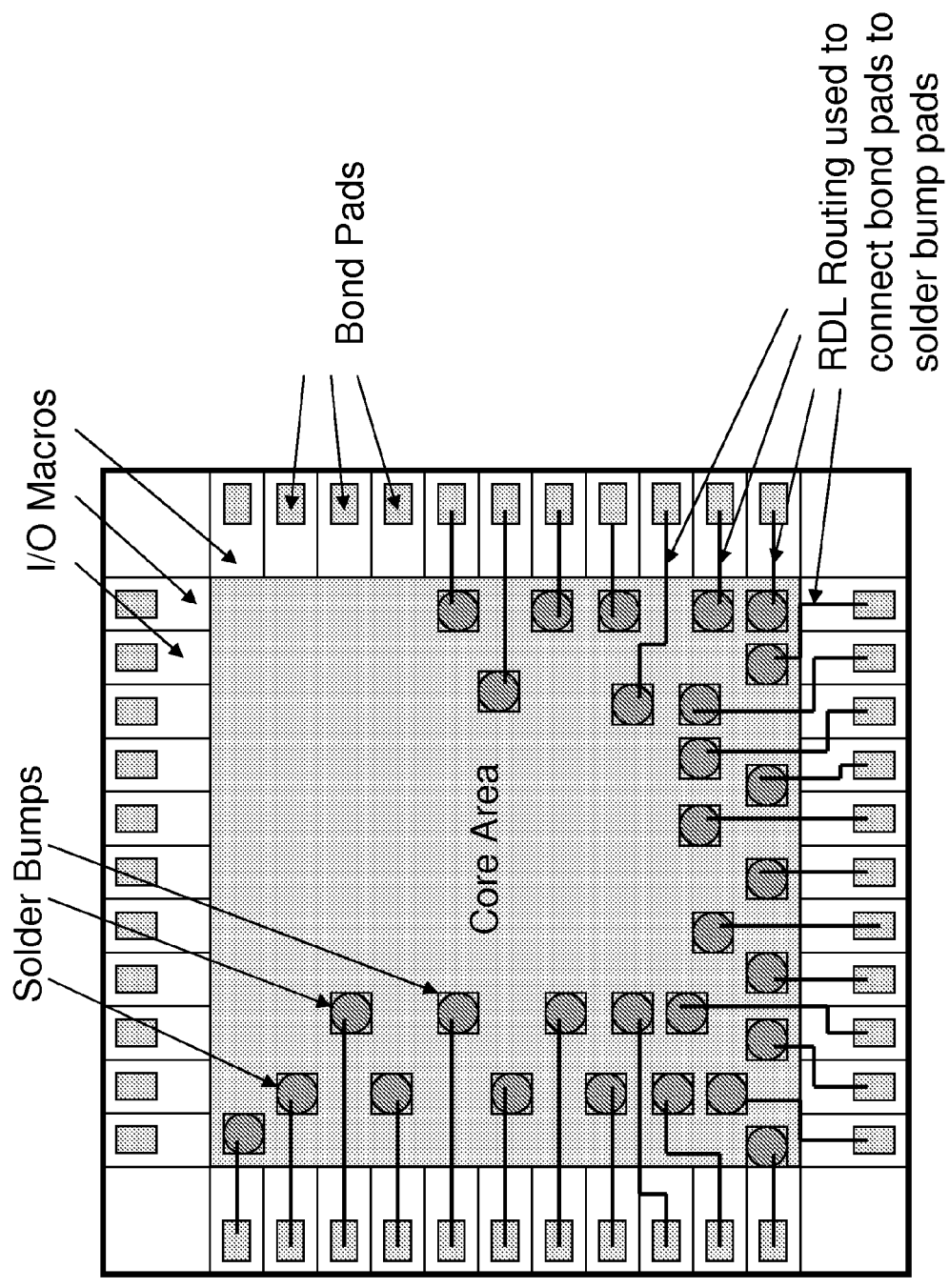
FIG. 4 illustrates a top view example of Prior Art showing a redistribution layer (RDL) that connects IC bond pads to IC solder bumps for connections in flip chip package.
Figure 5:
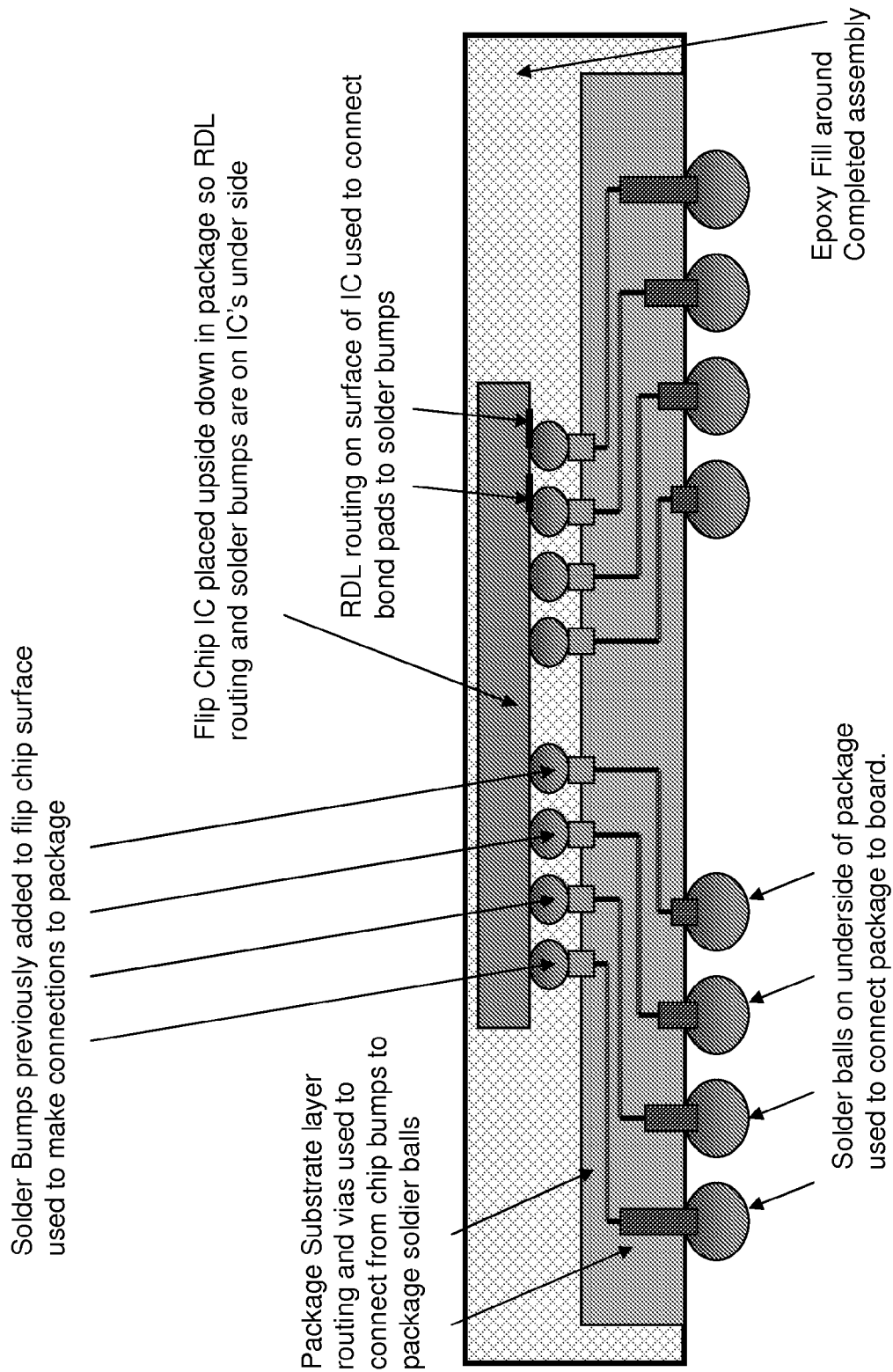
FIG. 5 illustrates an example of Prior Art showing the side view of an IC in a Flip Chip Package. Package substrate layer routing and vias connect the IC's solder bumps to package's solder balls.

The present invention according to specific embodiments enables systems and methods allowing flexible design of multi-region I/O structures using a library of I/O macros. In specific embodiments, a set of I/O region interconnect macros provides noise resistant signal feed-through functions at required locations in inner I/O structures (or outer structures in some embodiments). This family of macros is designed according to specific embodiments of the invention to remain compatible with the inner and outer I/O ring design requirements and to support IC design flows and design practices. These I/O feed through macros also support corresponding outer I/O ring I/O macros, which typically have input, output, three-state, or bidirectional functions.

An important type of I/O region interconnect macros according to specific embodiments of the invention are referred to as Feed-Through Filler or (FTF) macros. FTF's in specific embodiments are largely handled in a similar way to filler cells in I/O libraries. FTF macros, however, provide additional connections in the filler cells, allow flexible design of more complex I/O structures and multiple region I/O structures. FIG. 11 and FIG. 12 together illustrate an example, with FIG. 12 showing a detailed view of the edge of the IC shown in FIG. 11. FIG. 12 illustrates an outer I/O ring 10 with I/O input macros 11. In specific embodiments, I/O ring 10 and macros 11 are constructed largely or entirely from known prior art standard macros and circuit elements. According to specific embodiments, standard macros 11 are laterally connected by abutment to each other and optionally to one or more standard filler macros, such as 13, and are connected at their interface edge to corresponding FTF cells 113 in the inner I/O ring. These FTF cells make abutment based signal feed-through connections from outer ring I/O input macros through the inner I/O ring and to logic in the IC's core area. These FTF cells connect to the outer I/O region macros at the interface connection points provided by the standard I/O macros and in various embodiments occupy narrow areas between the inner and outer ring I/O macros and between inner ring I/O macros. In the example in FIG. 11 and FIG. 12, these FTF macros are "L"-shaped FTF cells, as further described herein. Other FTF cell shapes are also discussed herein. In these figures, the I/O region interconnect macros are shown without shading.

Feed-Through Filler (FTF) cells according to specific embodiments support making continuous inner I/O region connections around the IC's core by bridging gaps in the power and ground rings in the inner I/O regions. In specific embodiments, the target library I/O filler cells are used as a reference point for designing the I/O ring portion of the FTF cells, so that the FTF cell implementations remain as transparent as possible to existing I/O ring layout tools. Aside from connecting the I/O rings, FTF cells also provide signal feed-through capabilities.

In some embodiments of FTF libraries, it is desirable to minimize the number of FTF cell implementations, so the FTF's are generally standardized to support a few key I/O functions that can be used multiple times throughout the inner I/O ring. For example FTF cells in specific embodiments are designed to support input I/O macros, output I/O macros, three-state I/O macros and bidirectional I/O macros. Various design, process and library dependent factors influence the design of the feed through filler (FTF) cells, as discussed below. The initial FTF cell design description provided below assumes that one FTF provides all needed transverse core signal feed through connections for one corresponding outer ring I/O macro. This simplifies the FTF cell design, design description, and the multiple I/O ring design implementation effort. FTF cells in some embodiments may be expanded to handle signals between multiple outer ring I/O macros and the IC's core. Both FTF and ordinary I/O Filler Cells can be used together in the inner I/O ring. According to specific embodiments, a family of FTF cells of differing widths is not required to fill inner I/O ring gaps because existing I/O Filler cells can still be used for this purpose in conjunction with FTF cells placed the inner I/O ring.

Characteristics of One Embodiment

The embodiment shown in FIG. 12 illustrates a number of characteristics that make some embodiments of the invention particularly easy to integrate with existing IC design tools. While some or all of these characteristics may be modified according to specific embodiments, the grouping of characteristics shown in FIG. 12 will be included in a number of important embodiments:

(1) The outer I/O region is comprised mostly or entirely of known standard I/O elements, in this example illustrated as I/O macros 11 and filler macros 13.

(2) The inner I/O region is comprised of known standard I/O macros 111 and of novel I/O region interconnect macros 113.

(3) In specific embodiments, inner 111 and outer 11 I/O macros are similar or identical in dimension, to facilitate alignment, and inner and outer I/O macros may include I/O macros designed for single I/O region designs.

(4) FTF filler cells 113 may have a non-rectangular shape (such as the "L" shaped FTF's shown in the example, or the "T" shaped FTF's discussed below) which allows them to connect with outer I/O region transverse signals through abutment and then route those signals around and then between inner I/O macros.

(5) FTF filler cells 113 generally group with one or more inner I/O macros to form a rectangular subunit that can be more easily handled by automated design tools.

(6) FTF filler cells in combination with one or more inner I/O macros are sized to provide easy alignment with outer I/O macros and filler cells.

(7) In specific embodiments, one or more FTF filler cells 113 and its corresponding one or more inner I/O macros 111 operationally connect to one outer I/O macros 11 and any needed filler cells 13, and these cells together can be grouped as a functional rectangular group.

FTF cells according to specific embodiments provide signal feed-throughs that support all active signals between the corresponding outer ring I/O macro and the IC's core. For example, an outer ring input I/O macro, generally has an output signal that goes to the IC's core. This core signal is unidirectional and according to specific embodiments of the invention the output of the I/O macro drives the input port of an inner I/O ring FTF cell. Within this FTF cell, this core signal then drives a buffer that in turn drives an output port that is connected to the IC's core. In particular embodiments, it is a good design practice for feed through signals passing through macros to drive an input port that drives an internal buffer that then drives an output port. This approach supports creating netlists that have different port names and port directions for the input and output ports, and provides a design embodiment that is well supported by EDA tools. A simple signal feed through that just uses a metal route to go straight through a cell without passing through a buffer can result in a problematic implementation. The metal route would short the two ports together, thus the two ports would have the same name and same signal direction, which is inconsistent with having a unidirectional signal. It follows that feed-throughs implementations that do not buffer signals would cause problems with many EDA tools, and are generally avoided in specific embodiments. Unlike hand routed multiple I/O designs, the present invention, by using predesigned and standardized macros for handling connections through or between I/O regions, can more easily ensure that electrical and design constraints are met in creating multiple I/O region ICs.

An example of two FTF cells located in the inner I/O ring that provide feed-through signals for two corresponding outer I/O ring input macros is shown in FIG. 14, which provides a detailed view of the IC shown in FIG. 13. The buffers in the FTF cells reflect the signal direction going from the outer ring I/O macros through the FTF cells to the IC's core. The outer I/O ring macro port names provided in FIGS. 14, 15, 16, 17, 18A, 18B, 18C and 19A are generic, and used to help illustrate the function and the signal direction. For example, in FIG. 14, Ctl_Pin_a and Ctl_Pin_b represent input control signal ports of outer I/O ring macros. Out_to_core represents an output port that that drives data through the FTF cell to the IC's core. OEN_to_IO, represents an input port that receives an output_enable_not control signal from the core logic. The FTF cells will be abutted against the outer I/O ring macros, so they will block routing to outer ring I/O macro control signal ports. To resolve this issue input FTF cells should provide abutment based connections for all static control signals needed to bias control ports of corresponding outer ring I/O macros. This example shows a common design practice of using tie-high and tie-low cells, which shouldn't cause antenna violations, to generate these static control signals.

These static I/O control signals are commonly used to select input I/O macro configuration options such as enabling pull up resistors etc.

An example of two FTF cells located in the inner I/O ring that provide feed-through signals for two corresponding outer ring output I/O macros is shown in FIG. 15, which provides a detailed view of the IC shown in FIG. 13. The buffers in this example reflect the signal direction from the IC's core through the FTF cells to the outer ring I/O macros. The FTF cells are abutted to the outer I/O ring macros, so they block signal routing to outer ring I/O macro's control ports. To resolve this issue output FTF cells should provide abutment based connections for all static control signals needed to bias control ports of corresponding outer ring I/O macros. This example shows a common design practice of using tie-high and tie-low cells, which shouldn't cause antenna violations, to generate these static control signals. These static I/O control signals are commonly used to select output I/O cell macro configuration options such as output drive strength, slew rate etc.

An example of two FTF cells located in the inner I/O ring that provide feed-through signals for two corresponding outer I/O ring three-state I/O macros is shown in FIG. 16, which provides a detailed view of the IC shown in FIG. 13. The buffers in this example reflect the signal direction from the IC's core through the FTF cells to the outer ring I/O macros. Each FTF cell supports two feed through signals one for the output signal and the other for the OEN signal. The FTF cells have been abutted to the outer I/O ring macros, so they block signal routing to outer ring I/O macro's control ports. To resolve this issue three-state FTF cells should provide abutment based connections for all static control ports of corresponding outer ring I/O macros. This example shows a common design practice of using tie-high and tie-low cells, which shouldn't cause antenna violations, to generate these static control signals. These static I/O control signals are commonly used to select output I/O macro configuration options such as output drive strength, slew rate etc.

A bidirectional FTF cell contains functional elements of both the above three-state and input FTF cells. An example of two FTF cells located in the inner I/O ring that provide feed-through signals for two corresponding outer I/O ring bidirectional I/O macros is shown in FIG. 17, which provides a detailed view of FIG. 13. Two buffers in each FTF cell are for output data and OEN signals, which have a signal direction from the IC's core through the FTF cells to the outer ring I/O macros. The third buffer in the bidirectional FTF cells passes input data to the IC's core. The FTF cells have been abutted to the outer I/O ring macros, so they block signal routing to outer ring I/O macro's control ports. To resolve this issue bidirectional FTF cells should provide abutment based connections for all static control ports of corresponding outer ring I/O macros. This example shows a common design practice of using tie-high and tie-low cells, which shouldn't cause antenna violations, to generate these static control signals. These static I/O control signals are commonly used to select bidirectional I/O macro configuration options such as drive strength, slew rate, pull up resistor enablement and so forth.

The above FTF cell design discussion has focused on having one dedicated FTF cell support a corresponding outer ring I/O macro. Other embodiments where one FTF cell could support multiple outer I/O ring macros are also feasible. For example FIG. 13 and the detailed view shown in FIG. 18A provide an embodiment where a triple capacity FTF cell configures three bidirectional outer macros so that they function as output macros and provides 3 signal feed-throughs for the output signals. In this example, the tie-high cells provide high enable signals to the input_enable control pins and the output_enable_n control pins, thus configuring the 3 outer ring I/O macros to have output functions. The layout in this example shows the 3 outer ring I/O macros tied to an FTF cell that is located below them in the inner I/O ring. Another example is the detailed view of FIG. 13 given in FIG. 18B, that shows an embodiment of a triple capacity FTF cell that configures and connects the static control signals to three bidirectional I/O macros so that the upper macro has an input function, the center macro an output function and the lower macro a bidirectional function. In FIG. 18B the FTF cell is located between the lower and middle I/O macro. By extension embodiments of higher capacity FTF cells that handle four or more outer ring I/O macros are also feasible as are different layout permutations. As the FTF cell capacity increases the routing distances to more distant outer ring I/O macros will increase, and this will impact feed through signal performance. It follows that outside of unusual cases the design practice is to use relatively low capacity FTF cells since this simplifies the design flow and provides more consistent signal timing.

The above FTF cell design discussion focused on having corresponding FTF cells to support outer ring I/O macro functions such as input, output, three-state and bidirectional. Some I/O libraries only contain bidirectional I/O macros, and these could be configured with static control signals to function as input, output or three-state I/O macros. In this case the control signals needed to configure the bidirectional I/O macros would be provided by the corresponding FTF cells, and the buffers inside the FTF cells should support the corresponding I/O macro function. For reference an example implementation of FTF cells needed to configure bidirectional outer ring I/O macros to function as input, output and bidirectional I/O macros is provided in FIG. 18B, where FIG. 18B is a detailed view of FIG. 13. This example uses a triple capacity FTF cell that provides controls signals to configure the upper outer ring I/O macro to have an input function, the middle outer ring macro to have an output function, and the lower outer macro to have a bidirectional function. The FTF cell shown in FIG. 18B could easily be partitioned into 3 separate single capacity FTF cells that configure corresponding bidirectional I/O macros to function as input, output and bidirectional I/O macros.

FTF cells could also use flip flops to bias the control pins of the corresponding outer ring I/O macros, making the I/O functions dynamically configurable. For example, the I/O direction could be selected with an output_enable_not (OEN) pin that is driven by a flip flop's output. The Flip Flop's Clock and data input pins, would need to be driven by FTF cell's signal feed throughs. FIG. 18C, which is a detailed view of FIG. 13, shows an example bidirectional FTF cell that contains two flip flops. The lower flip flop drives the outer I/O ring macro's OEN_to_I/O input port. The upper flip flop drives the outer I/O ring macro's Ctl_Pin_a input port. Embodiments could also utilize fuse, anti-fuse or other fuse like functions inside the FTF cells to bias the control signals and configure corresponding outer ring I/O macro functions. This would be similar to using tie-high and tie-low cells, except the fuse or anti-fuses would be programmed to select the control pin bias after the IC has been fabricated.

FIG. 18A also illustrates an embodiment where one "L" shaped FTF cell and 3 inner I/O macros collectively form one rectangular inner I/O region group. FIG. 18B also illustrates an embodiment where one "T" shaped FTF cell and 3 inner I/O macros collectively form one rectangular inner I/O region group. could easily be partitioned into 3 separate single capacity FTF cells that configure corresponding bidirectional I/O macros to function as input, output and bidirectional I/O macros. This figure also illustrates the alignment between the inner and outer I/O regions is facilitated by selecting widths for FTFs that allow inner I/O region groups to be the same width as outer corresponding I/O region groups.

It will be evident to someone skilled in art that there are other I/O macro functions that have various active signals that need to pass between the outer I/O ring and the IC's core. The logic design for additional FTF cell implementations should follow a similar connection scheme shown in the above input, output, three-state and bidirectional FTF cells. That is signals flowing from the I/O macro to the IC's core should drive buffers in the FTF that drive out to the IC's core. Signals flowing from the IC's core to the I/O macros should drive buffers in the FTF that drive back towards the I/O macro. FTF cells supporting other I/O macro functions should also provide abutment based connections to all static control ports of corresponding outer ring I/O macros. The number of static I/O control signals will vary by I/O macro type and library, but someone skilled in the art will be able to customize the FTF cell designs to meet design specific requirements.

Feed-Through Filler Cell Layout Design

One aspect of FTF cell layout design involves FTF cell sizing. Please refer to FIGS. 14, 15, 16, 17, 18A, 18B, 18C and 19A. These figures are not drawn to scale, because the FFT cell widths have been enlarged to provide enough room to illustrate the signals and buffers. In most cases the width of the section of the FTF cells that is located between the inner ring I/O macros should be less than 25% of the width of neighboring inner ring I/O macros. The relative size of FTF cells versus inner ring I/O macros will vary with I/O macro widths, fabrication technology, number of FTF cell feed-through signals and so forth. Also note, the relative length and width of the FTF cells will reflect the relative length and width of the inner I/O ring macro library. Thus the length of the FTF cell, which is largely based on the length of the inner ring I/O macros, would normally be much larger than the width of the FTF cells which is largely based on the width of the inner ring I/O macros. Making the FFT cells too wide would consume excessive I/O ring area, which would result having less room for I/O macros. However, FTF cells still need to be wide enough to support the necessary logic, signal routing and ports connections. I/O macros and I/O Filler cells are commonly designed to have widths that come in integer micron sizes. This isn't technically necessary, but it supports a more streamlined design flow. To maintain consistency FTF cells in specific embodiments generally are designed to have integer microns widths. For example an FTF cell width of 4.6 um wide may have sufficient space for the required signal routing and buffers, however this width generally is rounded up to 5.0 um to be consistent with integer I/O macro widths. In specific embodiments, standard I/O filler cells can be used in conjunction with inner I/O ring FTF cells to fill gaps in the inner I/O ring. Thus a family of FTF cells having differing widths isn't required. FTF cells in specific embodiments are longer than the inner ring I/O cells because signals from the outer ring I/O macros need to jog around corresponding inner ring I/O macros to reach the IC's core. In specific embodiments, as the number of signal feed-throughs connections increases the FTF cells may need to become longer. In specific embodiments of the invention, a set of FTF cells is length matched to the longest member in the family to support having an inner I/O ring with a consistent depth.

"L" Shaped and Alternative FTF Cells

FTF cells according to specific embodiments can have various shapes and various levels in the design hierarchy. FTF cells as discussed above are generally longer than the inner ring I/O cells so that feed through signals can jog around the inner ring I/O cells, which generally results in having "L" or "T" shaped FTF cells. Many EDA tools and design flows provide better support for cells that have rectangular shapes rather than "L" shapes. For design flows that require rectangular I/O macros there are three general approaches for avoiding "L" shaped FTF cells. Different approaches can be selected in different implementations, based on the design and design flow.

One option is to make the FTF cell larger than the inner ring I/O macro and place the inner ring I/O macro inside the FTF cell design. In this case the inner ring I/O cells would be a level of design hierarchy below the FTF cells. An example is shown in FIGS. 14, 15, where the inner ring I/O macros have dotted line perimeters, signifying they are instantiated inside the FTF cells. The FTF cells also generally should match the corresponding functions of both outer and inner ring I/O macros. For example FTF cells for outer ring output I/O macros may need to contain input, output or bidirectional inner ring I/O macros. This may result in having to design a larger variety of FTF cells. Some I/O libraries only come with bidirectional I/O macros, which could then configured to function as input, output or bidirectional macros. This case would work well with inner ring I/O macros embedded in the FTF cells, because the outer ring I/O macros would have ports at consistent locations. For reference FIG. 18B includes example I/O control signal configurations to convert bidirectional I/O macros to input and output macros. This shows a relatively minor amount of logic customization would be required inside the FTF cells to support common outer ring I/O macro functions.

Another option to support working with rectangular FTF cells is to make FTF cells larger and wider than the I/O macros and place the inner ring I/O cells on top of the FTF cells but not within the FTF cells in the design hierarchy. An example is shown in FIG. 17, where the inner ring I/O macros have dotted perimeter outlines (which are shown slightly off-set along one edge from the FTF outline to see the dotted outline, though at least one edge will generally coincide). In this case the design flow and EDA tools would need to support FTF cell's with power and ground ring ports that are not on the FTF cell's perimeter because the inner ring I/O macros will have I/O ring power and ground ports that would be in the interior of the FTF cells. The EDA tools and design flows would also need to support overlapping macros, in some cases error messages may need to down graded and or ignored to prevent the EDA tools from stalling.

A third option is to construct the "L" shaped FTF cells from two smaller rectangular cells and abut them together. This approach should be compatible with most EDA tools and flows. An example is shown in FIG. 19A, which is a detailed view of FIG. 13, where two pairs of FTF sub-cells are abutted together to form two complete "L" shaped FTF cells. Each sub cell requires a buffer to pass signals, so two serial buffers would be needed for a feed-through signal to pass through this embodiment. By extension another embodiment of this approach has multiple outer ring I/O macros feeding into one high capacity FTF cell made from vertical and horizontal sub cell-segments. For example three outer ring I/O macros could be abutted to tall triple capacity vertical FTF sub cell that in turn is connected by abutment to a horizontal triple capacity FTF sub cell going to the IC's core. Various design and design flow dependent tradeoffs plus additional embodiments that provide similar connectivity and functionality will be evident to one skilled in the art.

Compound Macros

Another approach to FTF cell implementation according to specific embodiments involves integrating an FTF cell with other cells, such as an I/O filler cell plus inner and outer ring I/O macros in a higher level macro. FIG. 19B, which is a detailed view of FIG. 11, uses bold lines to outline the contents of these integrated higher level macros that include an FTF cell, an I/O filler cell, plus inner and outer ring I/O macros. This example has FTF cells and outer ring I/O macros with input functions. Similar higher level macros in specific implementations can be based on outer I/O ring macros with output, three state and bidirectional functions along with corresponding output three state or bidirectional FTF cells. The upper three higher level integrated macros in FIG. 19B contain one each of an FTF cell, an I/O filler cell, an outer ring input I/O macro and an inner ring I/O macro. The lower high level integrated macro in FIG. 19B provides a larger example containing two FTF cells, two I/O filler cells, two outer ring I/O input macros and two inner ring I/O ring macros. In general higher level integrated cells have more fixed functionality making them less flexible than a similar implementation that uses individual I/O macros, FTF cells and I/O Filler cells. By extension, implementations where the FTF cell, I/O filler cell, inner ring I/O macro and outer ring I/O macro that are designed together as one large flat cell rather than designed separately and integrated together as a hierarchical cell are also possible. It will be evident to one skilled in the art that additional implementations with varying levels of hierarchy and integration could be implemented.

I/O Region Interconnections

In further embodiments, one or more additional interconnection I/O macros are provided to connect separate inner and outer I/O region power and ground supplies. In specific implementations, connecting corresponding power and ground supplies of inner and outer I/O regions helps maximize ESD protection and minimize power and ground supply noise. However, there are also design-dependent exceptions were corresponding I/O region supplies should not be connected together. For example, noise sensitive I/O macros such as PLL's may require isolated analog power and or ground supplies, or I/O macro families may use different VDD levels and so forth.

I/O design flow is generally based on placing I/O macros in the layout using small scripts that index through ordered lists of target I/O macros. Script based design flows work well with hard I/O macros, since these can readily be added to the ordered lists. According to specific embodiments, a design flow for connecting corresponding power and ground supplies in the inner and outer I/O regions is also based on using hard I/O macros to make the signal connections. These I/O inter-connection macros are used to tie together corresponding power and ground supplies in the outer I/O region to power and ground supplies in the inner I/O region. Multiple I/O region interconnection cells can be instantiated in the I/O rings to create local interconnections and or decrease the resistance of interconnection paths. FIG. 20 is a detailed view of the corner of an IC that shows two I/O inter-connection macros 121a and 121b that are inter connecting the outer and inner I/O ring supplies. Also note FIG. 20 is a detailed view of the IC shown in FIG. 13. Additionally, FIG. 21 provides a detailed view of an I/O inter-connection macro 121 shown in FIG. 20.

I/O ring interconnection cells have various layout design requirements. The I/O inter-connection macro length generally should be equivalent to the outer I/O ring macros length+ the inter-I/O ring separation distance+inner ring I/O macro length. The I/O ring interconnection cells should also include I/O ring routing and ports that support lateral abutment based connections of power and ground metal, diffusion and if applicable well layers for both the outer and inner I/O rings. The optimal width of I/O ring interconnection cells is design and fabrication technology dependent. There are tradeoffs between the number of available routing layers, routing resistance, and the need to minimize area to help reduce costs. The power and ground supply cross connection routes in the I/O inter-connection macros should be perpendicular to the direction of the power and ground supply routing in the I/O rings. FIG. 21 shows these metal interconnections using parallel routes all on one layer. The I/O power and ground supply rings normally occupy the upper metal layers, so the cross connecting routes in the interconnection cell would normally occupy available lower metal layers. Metal to metal vias should be used to make the connections from the lower layer cross connection routes to the higher layer perpendicular power and ground rings in the I/O ring interconnection cells. In some cases more than one metal layer may be available to make these interconnection routes. When this happens the cross connection signal routing widths can potentially be reduced by stacking parallel metal routes of the same signal. For example, instead of having one layer of 10 um wide metal VSS core supply interconnection route, two 5 um wide stacked VSS core supply interconnection routes could be used to make a connection with a similar resistance. Metal routing layers have resistance based on the routing length times the process dependent metal resistance per square of metal. A designer skilled in the art can optimize the interconnection size and resistivity versus the I/O inter-connection macro area to provide an implementation compatible with various IC design schemes. Specific implementations include a small family of I/O inter-connection cells of varying sizes that provide varying inter-connection resistivities needed to satisfy specific design requirements. Specific implementations can use a narrow I/O ring interconnection cell and instantiate multiple copies of narrow cells in parallel to produce low resistance cross connections where and when needed.

Another approach to inter-connect I/O ring supplies is illustrated in FIG. 19C, which provides a detailed view of FIG. 13. In this example, an outer I/O ring core filler cell has been customized to tap the Core_VSS supply and provide a Core_VSS connection port. This port is connected to the ground shield line in the abutted FTF cell. If this line also taps the inner I/O ring's Core_VSS supply, the ground shield would also connect together the inner and outer ring's Core_VSS supplies. Similarly ground shields tied to Core_VDD could also be used to interconnect outer and inner ring Core_VDD supplies. I/O supplies generally have more signal noise and shouldn't be used to shield core signals. FTF cell based supply interconnections could also be made using dedicated routes rather than with routes that act as shield signals. In order to make a full set of inner and outer ring power and ground supply interconnections using FTF cells, a customized family of I/O Ring Filler cells that taps IO_VSS, IO_VDD, Core_VSS, and Core_VDD and provides ports that connect to FTF cells that are then tied to the corresponding inner I/O ring power or ground supplies. Given that FTF cells should remain relatively narrow, each FTF cell should incorporate a minimal number power or ground interconnection routes. It follows that a large variety of FTF cell designs would need to be designed to support various I/O functions while also providing Core_VSS, Core_VDD, IO_VSS and IO_VDD interconnections. To support this approach, a family of customized IO filler cells that taps Core_VSS, Core_VDD, IO_VSS and IO_VDD supplies and connects them to external ports would also be needed. In theory one could use FTF cells to make all the needed supply interconnections rather than using the IO interconnection cells described above. However, in most cases the additional design effort to create the larger variety of FTF cell designs and create customized IO Filler cell designs would make this a less attractive design alternative.

There are various process dependent metal layer density rules and minimum metal spacing rules that also need to be met when designing I/O inter-connection cell layouts. Various I/O ring interconnection cell models are also used in particular implementations, especially lef or similar files for layout tools. I/O macro interconnection cells normally do not contain active logic, so neither their timing nor their logic functionality needs to be modeled. There may be exceptions where a design flow requires simple place holders or dummy models in this case the designer could reference the modeling approach used by the simple I/O filler macros cells and or antenna cells to see how passive macros have been modeled. If the I/O ring interconnection cell is wide enough, supply decoupling capacitors could also be added to reduce supply noise. The overall implementation approach and tradeoffs needed to interconnect the I/O ring power and ground supplies will be clear to someone skilled in the art.

As will be understood in the art, the various FTF cells and I/O inter-connection cells described above will generally be placed and verified using various EDA tool support files. Sets of related cell files for such tools are generally combined into library files for more convenient use. For example, the timing .lib files for a set of FTF related cells would be combined into a .lib library file. The .lef files would be combined into a lef library file and so forth. Specific implementations according to specific embodiments include appropriate special I/O cell library files to support the intended design requirements, the target I/O library requirements and the intended design tool flows. The specialty I/O cell libraries according to specific embodiments can be used by IC designers in conjunction with design tools and the targeted I/O libraries as is understood in the art to develop IC's with multiple I/O regions. The target I/O libraries can be commonly available I/O libraries or proprietary I/O libraries with limited availability according to specific embodiments.

Timing, Electrical, and Design Implementations

Like any other performance sensitive area in an ASIC design, FTF cells according to specific embodiments are constructed to meet design-specific timing requirements. These timing requirements are related to various design specific factors including: input capacitance loads, buffer drive strength, output capacitance loads, parasitic routing resistance, parasitic routing capacitance, cross couple signal capacitance and so forth. These factors change as the IC foundry and fabrication technologies change. Therefore specific FTF implementations according to specific embodiments of the invention are designed, optimized and validated for different fabrication technologies and design requirements. The IC designer insures that all logic signals are properly driven. Under-driven signals, which would have excessive loads, may be too slow to meet performance requirements and may have signal delay modeling problems. Over-driven signals would have relatively small loads, and may result in cross coupling with neighboring signals and or excessive power consumption. The timing for most logic designs is validated by using parasitic extraction tools and static timing analysis tools such as StarRC-XT, QRC, PrimetimeSI, and CeltIC from either Synopsys Incorporated or Cadence Design Systems. SPICE simulation tools from EDA vendors such as Synopsys Incorporated, Magma Design Automation or Cadence Design Systems, or Mentor Graphics could also be used to validate timing. At advanced process nodes, digital logic signals become susceptible to cross-talk, where signal routes having sufficient capacitive coupling can induce enough charge on neighboring routes to delay signals or temporarily change logic states. Use of stronger buffers and or greater separation of signals susceptible to cross talk are common solutions to this problem. Assuming the FTF is to be used as a standalone macro, it should have a timing model that supports the targeted EDA design flow. The most commonly used digital timing model is known as .lib or library files. The FTF cells contain buffers and or functional logic and most EDA tools also require verilog .v or equivalent functional models to support netlist generation, simulations and so forth. One skilled in the art will be able to design FTF according to specific embodiments to meet timing requirements and generate accurate .lib (or equivalent) models and verilog .v (or equivalent) models for use with targeted EDA tools.

The second major aspect of FTF cell layout design involves providing I/O power ring, I/O ground ring, I/O ring ports, N+ well and P+ well diffusion areas that are consistent with neighboring I/O macros e.g., having FTF cell port locations, port widths, routing widths, route locations, routing layers, well region sizes, well region locations, and diffusion regions (if applicable) match those on neighboring I/O macros and or I/O filler cells. In general, determining specific implementations for FTF cells according to specific embodiments will be straightforward if reference is made to the existing I/O filler cells in the target I/O library. Many ASIC I/O libraries and designs use 6 to 9 metal routing layers. In general the upper I/O macro routing layers are used for I/O ring routing, such as layers 3 and above. The signal feed through routing and if required signal ground shield routing within the FTF cells should utilize available lower metal layers, such as metal layers 2 and below. Availability of metal layers for feed through and shield routing versus power and ground ring routing will be dependent upon the metal layers used in the corresponding I/O library. If diffusion guard rings are present in the reference I/O filler cells analogous versions should also be provided in the FTF cells. These diffusion guard rings can connect through contacts to via stacks to I/O power and ground rings in the upper metal layers. The FTF cell's feed through signals should pass between the contacts and via stacks that are used to bias any underlying diffusion guard rings.

Another aspect of FTF cell layout design involves buffer placement and signal routing issues. FTF cells in specific embodiments provide enough space for signal buffers, signal routing connections, power and ground supply connections, any needed tie-high and/or tie-low cells, any needed power and ground shields for signals and so forth. In most I/O macros the core power and ground rings are located near the IC's core and the I/O power and ground supplies are located near the perimeter of the IC. These power and ground rings for inner I/O macros will also pass through the FTF cells. The FTF cell core power and ground rings should be tapped to supply the buffers and or tie cells and bias underlying N+ well and, P+ well areas. The FTF cell buffers and/or tie cells generally have both n-channel and p-channel transistors so their placement should straddle both the N+ well and P+ well regions, much like logic gate placement in other macros in the IC. There are two locations in the FTF cells where the buffers and/or tie cells can potentially be located in specific implementations. The first location is where the core VDD and core VSS rings bias underlying N+ well and, P+ well areas. This illustrated with the approximate buffers locations shown in FIGS. 14, 15, 16, 17, and 18A. These buffers have been placed between the two power and ground rings closest to the IC's core. One ring supplies core VDD and bias the underlying N+well the other ring would supply core VSS and bias the underlying P+well. Some I/O macros may have two pairs of core VSS and VDD rings, in which case there are two sets of adjacent N+well and P+well areas that can support buffer and/or tie-cell placement under the core power and ground rings. The second location is also illustrated in FIGS. 14, 15, 16, 17, and 18A where the tie-high and tie-low cells are located near the edge of the outer ring I/O macros. This second location wouldn't increase the FTF cell size assuming a substantial separation between the outer and inner ring macros is required to improve isolation and minimize potential I/O ring related noise and assuming I/O ring related noise doesn't impact the operation of buffers and or tie cells. If this is the case, core power and ground supplies are routed to this area and N+well and P+well areas are added to support buffer and/or tie-cell placement. Also note, these power and ground supply routes are used to shield signals in the FTF cells. N+wells and P+wells have substantial separation requirements which may exceed the available area due to I/O ring to I/O ring separation for isolation purposes, in which case the first location for buffer and/or tie-cell location described above should be better for minimizing FTF cell area. The relative merits of buffer and tie-cell placement in these two locations in the FTF cells would be largely design dependent. The buffers and tie-high tie-low cells were separated in FIGS. 14, 15, 16, 17, and 18A to improve figure layout and segregate static from active signal lines. This is not intended to imply optimal placement for buffers and or tie cells is in one potential location versus the other. In another example, FIG. 19A shows buffers co-located with the tie-cells near the outer ring I/O macros and additional buffers below the core power and ground supply rings. One skilled in the art will be able to weigh the design tradeoffs to produce a suitable implementation.

Once an FTF cell has been designed and verified, a physical layout model is generally used to work with most EDA tools and design flows. The most commonly used physical layout models are lef files although depending upon the design flow requirements other similar layout models can be employed. Generally, lef files should include a CLASS property that is used by the EDA tools. In specific embodiments, FTF cell's CLASS property can match the CLASS property of the other I/O macros in the I/O ring, which used CLASS PAD, at the time of this writing. One skilled in the art will be able to complete the layout of an FTF cell and generate an appropriate .lef (or equivalent) layout model files plus the .gds files and corresponding and transistor netlist files to support the targeted EDA tools and design flow of specific implementations according to specific embodiments.

In further embodiments, FTF implementations are designed to account for various electrical issues as will be understood to one of skill in the art. Many existing I/O macros are designed to avoid latch up conditions, in which a lateral parasitic PNP transistor in the I/O ring layout could inadvertently become active. These lateral parasitic PNP structures are more likely to occur where I/O bond pads and thick oxide I/O ring transistors are in close proximity to smaller core oxide transistors. I/O macros that are used in I/O rings typically have thick oxide transistors near the edge of the IC, and thin core oxide transistors are typically near the core of the IC. FIG. 11 shows an IC with two sets of I/O rings where the core oxide transistors of the outer ring I/O macros are in close proximity to the I/O oxide transistors of the inner I/O ring. This results in having I/O ring layouts where parasitic PNP transistors are more common and more susceptible to latch up. Depending upon the particular process technology, the I/O library macros, and latch up prevention techniques used within the library I/O macros, additional latch up prevention techniques may be incorporated in FTF in specific implementations according to specific embodiments. Various approaches are commonly used to prevent latch up, one approach is to increase the spacing between design features, which would weaken the potential strength of the parasitic PNP transistor devices. FIG. 12 shows that some separation is needed between the inner and outer I/O ring macros to allow for signals to jog around the inner ring I/O macro to reach to IC's core area. If needed, this separation can be increased to reduce latch up susceptibility. In other implementations, diffusion guard rings are used to either tie off or shield parasitic devices so that they remain inactive and receive minimal I/O related noise. One skilled in the art will be able to add diffusion guard rings and or space between inner and outer I/O rings to minimize latch up problems in specific implementations.

In general, I/O regions are inherently noisy, and unwanted signal noise in some implementations could compromise the integrity of FTF feed through signals since these would be routed near large I/O transistors and or near I/O bond pads. Commonly available EDA extraction and timing tools are used in specific implementations to evaluate the noise sensitivity of FTF cell feed through signals. If noise sensitivity is found to be a problem, various noise reduction techniques are used to minimize the problem and the FTF cells are modified and re-evaluated to insure signal noise won't cause functional problems. For example, grounded routing shields and or small ground planes placed between the potential noise source and potentially sensitive feed through signals to help reduce I/O noise coupling are used in some implementations. FIG. 19A illustrates as examples two signals that have grounded shielding above them to protect them from I/O ring and bond pad related noise. If needed, grounded shielding can be added along side or even below sensitive signals to shield them from local noise sources. The buffer sizes in the FTF cells could be increased or serial buffers could be employed to help reduce signal susceptibility to I/O related noise. I/O noise, signal sensitivity, and use of noise reduction techniques are highly design dependent.

Once the logic, timing, layout and electrical design of an FTF cell is complete and the cell's performance has been verified, that FTF cell can be placed in a specialized I/O library compatible with the standard I/O library, and used repeatedly in the I/O rings(s) to help streamline the design flow. There are dozens of models and file types that are used by various EDA design tools. There are also many EDA tool dependant design flows. In specific implementations, FTF cell models and files according to specific embodiments are generated and validated to support target EDA tools and design flows in particular implementations.

DESIGN FLOW ISSUES

Overview of an IC Implementation with Double I/O Rings

This initial example is used as a starting point for further implementation discussion. One implementation of Double I/O rings utilizing FTF cells and interconnection cells uses alignment of the inner I/O ring macros with the outer I/O ring macros so that ports on the outer I/O macros remain in consistent locations relative to their corresponding FTF cells and also support alignment and placement of I/O ring interconnection cells, which straddle both the inner and outer I/O rings. If the inner and outer ring I/O macros have inconsistent alignments their relative port locations can vary and abutment based connections become more problematic, so it is generally easier if the design maintains consistent alignment. In some implementations, a designer can support unaligned inner and outer ring I/O macros by designing additional FTF cells with varying sizes and port locations, but this represents a less efficient design approach. FIG. 20, which is a detailed view of FIG. 13, illustrates a detailed corner view of an IC with double I/O rings where the inner and outer ring I/O macros are aligned. The Y-coordinates of outer ring I/O macros on the IC's left side in FIG. 20 are aligned to the Y-coordinates of the inner ring I/O macros. Inner and outer ring I/O macros on the right side would have similar Y coordinate alignments. The X-coordinates of the outer ring I/O macros on the IC's top side in FIG. 20 are aligned to the X-coordinates of the inner ring I/O macros. Inner and outer ring I/O macros on the bottom side would have similar X coordinate alignments. The three example FTF cells shown in FIG. 20 use the same layout and the same port locations to connect to their corresponding outer ring I/O macros.

FIG. 21 illustrates a detailed view of FIG. 20 along the top side of an IC where the inner and outer ring I/O macros have been aligned. In order to help maintain this alignment the I/O filler cells in the outer ring have been width matched to the FTF cell spacing in the inner I/O ring. Width matching the inner ring FTF cells and the outer ring I/O filler cells provides a simple approach for aligning the sets of I/O macros in the inner and outer I/O rings. In some cases I/O macro widths can differ for macros in the inner rings versus the outer rings. When this occurs the designer could compensate by using additional I/O filler cells to adjust the inner and outer ring I/O macro alignments. FIG. 20 also shows how the alignment of inner and outer ring I/O macros has been exploited to support placement of two I/O inter-connection macros. These I/O inter-connection macros span across both inner and outer I/O rings making them very sensitive to macro miss-alignments between the inner and outer I/O rings. Also note, I/O macro orientation depends upon their location on the IC's left, right, top or bottom sides. The orientation of the FTF cells and I/O ring interconnection cells generally should remain consistent with the orientation of neighboring I/O macros.

In specific example embodiments, the perimeter of the outer I/O ring will be larger than the inner I/O ring, so the outer ring I/O macros located near the corners might have their access to the core area blocked by the inner ring's corner cell. This is illustrated in FIG. 22. To work around this issue I/O macros that don't require core access, such as I/O power and ground supply macros, can be placed near the outer ring corners. Another way to resolve this issue would be to sacrifice some of the inner ring I/O macro area next to the inner ring corner cell and design a high capacity corner feed through cells that can pass signals from several outer ring I/Os located behind the inner I/O ring corner cell. FIG. 22 and the detailed views in FIG. 23A and FIG. 23B show an example of this solution. Based on the previous discussion about FTF cell design various additional embodiments of high capacity corner feed-through cells should be evident to one skilled in the art. Due to having larger areas and longer routing lengths, the signal routing delays special high capacity feed through cells would be more suitable for slower general purpose I/O signals. In general, it is a good design practice to locate the high performance outer ring I/O signals where they will have more direct access to the IC's core.

Detailed Double I/O Ring Implementation Example

I/O rings are often generated using automated Place and Route tools from EDA vendors such as Synopsys Incorporated, Magma Design Automation and or Cadence Design Systems. Various I/O macro placement methods are available, but it is a good design practice to use a script based approach, since IC design is an iterative process and scripts can easily be modified and rerun as simple batch jobs if and when the I/O rings need to be regenerated. EDA tools support user input commands written in scripting languages such as TCL, Pearl, and Scheme etc. I/O ring implementation scripts often utilize ordered lists of the I/O macros that are to be placed along each side of the IC. These scripts typically rely on the starting point coordinates for the placement of the first I/O macro. Next the I/O placement scripts index through the ordered I/O macro list to place the I/O macros relative to the position of the previous I/O macro. The I/O macros are usually placed in straight rows along each side of the IC, and I/O macros can be abutted together or they could be separated depending upon design and packaging requirements. Locations of potential signal feed-throughs from the outer I/O ring to the core logic should be carefully controlled and the process of placing these signal feed-throughs in the inner I/O ring should be repeatable.

It generally follows that the FTF cells, which contain the signal feed-throughs, should be placed in inner I/O ring locations aligned with the outer ring I/O macros to make outer I/O ring signal connections to the IC's core. One approach for placement of the FTF cells in the inner I/O ring(s) is script based. In some cases the FTF macros would contain the inner ring I/O macros (see FIGS. 14 and 15) and script handling of FTF cells would be similar to handling of ordinary I/O macros. In other cases the inner ring I/O macros would remain separate from the FTF macros (see FIGS. 16, 17, 18C, 19A). If this approach is used, the FTF macros can be added to existing ordered I/O macro list(s), which would minimize design flow and script changes. As noted earlier, the inner I/O ring and outer I/O macros generally should be aligned, and this alignment can be achieved by adding ordinary I/O filler cells to the outer I/O ring to shift outer ring I/O macros into alignment with inner ring FTF cells and I/O macros. A critical input for place and route tools is the design's netlist, which models the connectivity between the I/O macros and the core logic. In order for the place and route tools to support multiple I/O rings the netlist should include the FTF cell and their signal connections that provide feed-through connections to the IC's core. The most straight forward way to align the inner and outer I/O rings is to determine the outer I/O ring macro placement coordinates first, and use these coordinates to determine suitable inner I/O ring macro and FTF cell placement coordinates. Assuming a large I/O count some design iterations will probably be needed to achieve proper alignment.

Example Netlist

For further reference an example portion of a netlist that embodies elements of this invention is provided below. This netlist is written in the gate level verilog hardware description language. A reference sub-netlist for a bidirectional FTF cell netlist, (see module bidir_ftf_cell), has been provided immediately below. This example bidirectional FTF cell netlist is then used within an example I/O level netlist, refer to module lower_left_ios, which provides an example netlist that connects together inner and outer ring I/O macros along the side of an IC. For further reference an output FTF cell netlist, see module output_ftf_cell, and an input FTF cell netlist, see module input_ftf_cell have been provided. Also note netlist lower_left_ios is used along with a set of reference I/O placement scripts, which are provided afterwards.

```
// Example Bidirectional feed through filler cell module. This contains
     buffers,
// tie-high and tie-low cells plus an inner I/O ring Bidirectional I/O
     cell. This FTF cell can
// be connected by abutment to the targeted outer ring I/O macro.
//
// Netlist uses BUFFLVTDX: buffers with ports I and Z. The DX gives drive
     strength where
// X = 0, 1, 2, 3 etc and should be selected to meet design timing, power
     and noise requirements.
// I: (input) drives buffer
// Z: (output) driven by buffer
//
// Netlist uses tie-high and tie-low cells described below.
// TIEHLVT: Tie-high cell has single output Z, which is always high
// TIELLVT: Tie-low cell has single output ZN, which is always low
//
// Netlist also uses Bidirectional I/O cell, PRS0816CDG_33, which has the
     following ports:
// PAD: (inout) external bidirectional I/O port
// I: (input) data from core to I/O macro
// DS: (input) select output drive strength, if 0 low strength, if 1 high
     strength
// OEN: (input) output enable-not, if 0 = output enabled, if 1 = output
     disabled becomes Hi-Z
// C: (output) data from I/O macro to core
// IE: (input) input enable, if 0 data C to core is Hi-Z, if 1 data C to
     core is enabled
// PE: (input) pull up/down enable, when Hi-Z state, if 0 disabled , if 1
     enabled
// PS: (input) pull up/down select, when Hi-Z state, if 0 select pull
     down, if 1 select pull up
//
// A set of PRS0816CDG_33 I/O macro port names are used in the higher level
     bidirectional
// FTF cell, to make connections to the inner I/O ring macro in the FTF
     cell. Signals and
// instances with an "outer" prefix connect to and control the outer ring
     I/O macro. Signals
// with a "buf" suffix are outputs driven by buffers inside the FTF cell.
//
module bidir_ftf_cell (PAD, I, C, OEN, DS, IE, PE, PS, outer_i, outer_oen,
     outer_ds,
outer_ie, outer_c, outer_pe, outer_ps, outer_i_buf, outer_c_buf,
     outer_oen_buf);
input I, DS, OEN, IE, PE, PS, outer_i, outer_c, outer_oen;
output C, outer_ds, outer_ie, outer_pe, outer_ps, outer_i_buf,
     outer_c_buf, outer_oen_buf;
inout PAD;
//Instantiate an inner ring bidirectional I/O macro within the FTF cell
PRS0816CDG_33 inner_io_macro (.PAD(PAD), .I(I), .DS(DS), .OEN(OEN), .C(C),
     .IE(IE), .PE(PE), .PS(PS));
//instantiate buffers to handle active signals to or from the targeted
     outer I/O macro
BUFFLVTD3 buffer_i (.I(outer_i), .Z(outer_i_buf));
BUFFLVTD3 buffer_c (.I(outer_c), .Z(outer_c_buf));
BUFFLVTD3 buffer_oen (.I(outer_oen), .Z(outer_oen_buf));
// Signal outer_oen is active and controls bidirectional outer ring I/O
     macro's signal direction.
// Use tie-high or tie-low cells to customize outer I/O macro function.
     Could also use one shared
// tie-high and one shared tie-low cell to bias the outer I/O control
     ports, assuming the layout
// supports abutment based connections to targeted outer ring I/O macro
     control ports.
TIEHLVT tie_high_ie (.Z(outer_ie));
TIEHLVT tie_high_ds (.Z(outer_ds));
TIELLVT tie_lo_pe (.ZN(outer_pe));
TIELLVT tie_lo_ps (.ZN(outer_ps));
endmodule
//
// Example of I/O level verilog netlist for placing two columns of I/O
     macros along IC's lower
// left side. A dual I/O ring implementation version would have far more
     I/O macros, but follow
// a similar connection pattern. Signals to the inner I/O ring
     bidirectional I/O macro would
// be connected directly to the IC's core. Buffers and routing could be
     added to paths to/from
// inner I/O ring cells to the delay match signal paths to the outer ring
```

-continued

```
        I/O cells.
//
module lower_left_ios (dataio, i_to_io, c_to_core, oen_to_io, ds_sel,
        ie_sel, pe_sel, ps_sel);
input [11:0] i_to_io, oen_to_io, ds_sel, ie_sel, pe_sel, ps_sel;
output [11:0] c_to_core;
inout [11:0] dataio;
wire [11:0] i_to_io_buf, c_pre_buf, oen_to_io_buf;
//
// Note the PRS0816CDG_33 I/O macros go in the outer I/O ring and receive
        even
// numbered signals. The bidir_ftf_cell macros go in the inner I/O ring
        and pass even
// numbered signals to the outer I/O ring macros. The bidir_ftf_cells
        also connect odd
// numbered signals to their internal bidirectional I/O macros.
//
PRS0816CDG_33 outer_ring_io0 (.PAD(dataio[0]), .I(i_to_io_buf[0]),
        .C(c_pre_buf[0]), .OEN(oen_to_io_buf[0]), .DS(ds_sel[0]), .IE(ie_sel[0]),
        .PE(pe_sel[0]), .PS(ps_sel[0]));
//
bidir_ftf_cell inner_ring_io0 ( .PAD(dataio[1]), .I(i_to_io[1]),
        .C(c_to_core[1]), .OEN(oen_to_io[1]), .DS(ds_sel[1]), .IE(ie_sel[1]),
        .PE(pe_sel[1]), .PS(ps_sel[1]), .outer_i_buf(i_to_io_buf[0]),
        .outer_c_buf(c_to_core[0]), .outer_oen_buf(oen_to_io_buf[0]),
        .outer_i(i_to_io[0]), .outer_oen(oen_to_io[0]),
        .outer_c(c_pre_buf[0]),.outer_ds(ds_sel[0]), .outer_ie(ie_sel[0]),
        .outer_pe(pe_sel[0]), .outer_ps(ps_sel[0]));
//
PRS0816CDG_33 outer_ring_io1 (.PAD(dataio[2]), .I(i_to_io_buf[2]),
        .C(c_pre_buf[2]), .OEN(oen_to_io_buf[2]), .DS(ds_sel[2]), .IE(ie_sel[2]),
        .PE(pe_sel[2]), .PS(ps_sel[2]));
//
bidir_ftf_cell inner_ring_io1 ( .PAD(dataio[3]), .I(i_to_io[3]),
        .C(c_to_core[3]), .OEN(oen_to_io[3]), .DS(ds_sel[3]), .IE(ie_sel[3]),
        .PE(pe_sel[3]), .PS(ps_sel[3]), .outer_i_buf(i_to_io_buf[2]),
        .outer_c_buf(c_to_core[2]), .outer_oen_buf(oen_to_io_buf[2]),
        .outer_i(i_to_io[2]), .outer_oen(oen_to_io[2]),
        .outer_c(c_pre_buf[2]),.outer_ds(ds_sel[2]), .outer_ie(ie_sel[2]),
        .outer_pe(pe_sel[2]), .outer_ps(ps_sel[2]));
//
PRS0816CDG_33 outer_ring_io2 (.PAD(dataio[4]), .I(i_to_io_buf[4]),
        .C(c_pre_buf[4]), .OEN(oen_to_io_buf[4]), .DS(ds_sel[4]), .IE(ie_sel[4]),
        .PE(pe_sel[4]), .PS(ps_sel[4]));
//
bidir_ftf_cell inner_ring_io2 ( .PAD(dataio[5]), .I(i_to_io[5]),
        .C(c_to_core[5]), .OEN(oen_to_io[5]), .DS(ds_sel[5]), .IE(ie_sel[5]),
        .PE(pe_sel[5]), .PS(ps_sel[5]), .outer_i_buf(i_to_io_buf[4]),
        .outer_c_buf(c_to_core[4]), .outer_oen_buf(oen_to_io_buf[4]),
        .outer_i(i_to_io[4]), .outer_oen(oen_to_io[4]),
        .outer_c(c_pre_buf[4]),.outer_ds(ds_sel[4]), .outer_ie(ie_sel[4]),
        .outer_pe(pe_sel[4]), .outer_ps(ps_sel[4]));
PRS0816CDG_33 outer_ring_io3 (.PAD(dataio[6]), .I(i_to_io_buf[6]),
        .C(c_pre_buf[6]), .OEN(oen_to_io_buf[6]), .DS(ds_sel[6]), .IE(ie_sel[6]),
        .PE(pe_sel[6]), .PS(ps_sel[6]));
//
bidir_ftf_cell inner_ring_io3 ( .PAD(dataio[7]), .I(i_to_io[7]),
        .C(c_to_core[7]), .OEN(oen_to_io[7]), .DS(ds_sel[7]), .IE(ie_sel[7]),
        .PE(pe_sel[7]), .PS(ps_sel[7]), .outer_i_buf(i_to_io_buf[6]),
        .outer_c_buf(c_to_core[6]), .outer_oen_buf(oen_to_io_buf[6]),
        .outer_i(i_to_io[6]), .outer_oen(oen_to_io[6]),
        .outer_c(c_pre_buf[6]),.outer_ds(ds_sel[6]), .outer_ie(ie_sel[6]),
        .outer_pe(pe_sel[6]), .outer_ps(ps_sel[6]));
//
PRS0816CDG_33 outer_ring_io4 (.PAD(dataio[8]), .I(i_to_io_buf[8]),
        .C(c_pre_buf[8]), .OEN(oen_to_io_buf[8]), .DS(ds_sel[8]), .IE(ie_sel[8]),
        .PE(pe_sel[8]), .PS(ps_sel[8]));
//
bidir_ftf_cell inner_ring_io4 ( .PAD(dataio[9]), .I(i_to_io[9]),
        .C(c_to_core[9]), .OEN(oen_to_io[9]), .DS(ds_sel[9]), .IE(ie_sel[9]),
        .PE(pe_sel[9]), .PS(ps_sel[9]), .outer_i_buf(i_to_io_buf[8]),
        .outer_c_buf(c_to_core[8]), .outer_oen_buf(oen_to_io_buf[8]),
        .outer_i(i_to_io[8]), .outer_oen(oen_to_io[8]),
        .outer_c(c_pre_buf[8]),.outer_ds(ds_sel[8]), .outer_ie(ie_sel[8]),
        .outer_pe(pe_sel[8]), .outer_ps(ps_sel[8]));
//
PRS0816CDG_33 outer_ring_io5 (.PAD(dataio[10]), .I(i_to_io_buf[10]),
        .C(c_pre_buf[10]), .OEN(oen_to_io_buf[10]), .DS(ds_sel[10]),
        .IE(ie_sel[10]), .PE(pe_sel[10]), .PS(ps_sel[10]));
//
```

-continued

```
bidir_ftf_cell inner_ring_io5 ( .PAD(dataio[11]), .I(i_to_io[11]),
    .C(c_to_core[11]), .OEN(oen_to_io[11]), .DS(ds_sel[11]), .IE(ie_sel[11]),
    .PE(pe_sel[11]), .PS(ps_sel[11]), .outer_i_buf(i_to_io_buf[10]),
    .outer_c_buf(c_to_core[10]), .outer_oen_buf(oen_to_io_buf[10]),
    .outer_i(i_to_io[10]), .outer_oen(oen_to_io[10]),
    .outer_c(c_pre_buf[10]),.outer_ds(ds_sel[10]), .outer_ie(ie_sel[10]),
    .outer_pe(pe_sel[10]), .outer_ps(ps_sel[10]));
//
// Instantiate an example I/O ring interconnection cell and two corner
    cells. These don't have active
// signal ports or active logic, and are connected by abutment during the
    physical design phase.
// Power and ground port connections, usually aren't needed in the port
    lists ( ) below.
IO_INTERCON inter_con_low_left ( );
PCORNERG_33 outer_low_left_corner ( );
PCORNERG_33 inner_low_left_corner ( );
//
endmodule
//
// For further reference an FTF cell netlist example has been provided
    below that supports
// output function outer ring I/O macros. The inner ring I/O macro within
    the FTF cell is
// bidirectional and the outer ring I/O macro is also bidirectional. These
    have been configured
// to function as output macros. The inner ring I/O macro in the FTF cell
    and the outer ring I/O
// macro aren't required to have the same function, but this helps simplify
    this example.
//
module output_ftf_cell (PAD, I, DS, PE, PS, outer_i, outer_ds, outer_pe,
    outer_ps, outer_oen, outer_ie, outer_i_buf);
input I, DS, PE, PS, outer_i;
output PAD, outer_ds, outer_pe, outer_ps, outer_oen, outer_ie,
    outer_i_buf;
// Instantiate an inner ring bidirectional I/O macro within the FTF cell,
    and configure to
// function as an output macro. Input ports tied to VSS or VDD should have
    internal protection
// against antenna violations, otherwise antenna cells should be used for
    the tie offs.
PRS0816CDG_33 inner_io_macro (.PAD(PAD), .I(I), .DS(DS), .OEN(VSS), .C( ),
    .IE(VSS), .PE(PE), .PS(PS));
//instantiate buffers to handle active signals to or from the targeted
    outer I/O macro
BUFFLVTD3 buffer_i (.I(outer_i), .Z(outer_i_buf));
// Use tie-high and tie-low cells to bias outer ring I/O macro control
    signals
TIEHLVT tie_high_ds (.Z(outer_ds));
TIELLVT tie_lo_oen (.ZN(outer_oen));
TIELLVT tie_lo_pe (.ZN(outer_pe));
TIELLVT tie_lo_ps (.ZN(outer_ps));
TIELLVT tie_lo_ie (.ZN(outer_ie));
endmodule
// For further reference an FTF cell netlist example has also been provided
    below that supports
// an input function outer ring I/O macros. The inner ring I/O macro
    within the FTF cell is
// bidirectional and the outer ring I/O macro is also bidirectional. These
    have been configured
// to function as input macros. The inner ring I/O macro in the FTF cell
    and the outer ring I/O
// macro aren't required to have the same function, but this helps simplify
    this example..
//
module input_ftf_cell (PAD, C, IE, outer_c, outer_ie, outer_c_buf,
    outer_ds, outer_pe, outer_ps,
outer_i, outer_oen);
input PAD, IE, outer_i, outer_c, outer_oen;
output C, outer_ds, outer_ie, outer_pe, outer_ps, outer_c_buf;
// Instantiate an inner ring bidirectional I/O macro within the FTF cell
    and configure to
// function as an input macro. Input ports tied to VSS or VDD should have
    internal protection
// against antenna violations, otherwise antenna cells should be used for
    tie offs.
PRS0816CDG_33 inner_io_macro (.PAD(PAD), .I(VSS), .DS(VSS), .OEN(VDD),
    .C(C), .IE(VDD), .PE(VSS), .PS(VSS));
//Instantiate buffers to handle active signals to or from the targeted
```

-continued

```
    outer ring I/O macro.
BUFFLVTD3 buffer_c (.I(outer_c), .Z(outer_c_buf));
// Use tie-high and tie-low cells to bias outer ring I/O macro control
    signals
TIEHLVT tie_high_oen (.Z(outer_oen));
TIEHLVT tie_high_ie (.Z(outer_ie));
TIEHLVT tie_high_ds (.Z(outer_ds));
TIELLVT tie_lo_pe (.ZN(outer_pe));
TIELLVT tie_lo_ps (.ZN(outer_ps));
TIELLVT tie_lo_ds (.ZN(outer_ds));
Endmodule
```

An example step by step design flow based on the above example netlist is provided below. This example reflects placing outer I/O ring macros plus filler cells along the lower left side of an IC. The inner ring bidir_ftf_cell's contain I/O macros and are abutted against the outer I/O ring macros. Scripts written for EDA tools would employ a script language such as TCL to execute required EDA tool commands. In most cases EDA tool scripts would use programming loops and indexing to calculate the appropriate I/O macro placement coordinates. In this example, specific coordinates have been provided to help illustrate alignment of the inner and outer I/O ring macros. The I/O macro placement starts at the lower left corner and moves upward. The lists of ordered I/O macros in this example are based on the example netlist, see module lower_left_ios, provided above. Please refer to FIG. 23C to see a graphical representation of the inner and outer I/O macro placements that is based on these scripts.

```
#Design Assumptions for Example Scripts Below:
#1) Coordinate X=0 and Y=0 is in the lower left corner of the IC
#2) I/O macro depth is 200um (in X), and I/O macro width is 45um (in Y)
#3) FTF cells depth is 210u (in X) and width is 50um (in Y)
#4) Corner cells are 200um X 200um
#5) Design flow assumes inner ring I/O macros are within the FTF cells
#6) All example coordinates below are given in microns
#7) CUP bond pads are used, thus bond pad locations don't impact this
     example
#8) One inner I/O ring FTF cell is placed for each outer ring I/O macro
#9) I/O macro placements coordinates correspond to the macro's lower
     left corner
#10)   I/O macro's default orientation corresponds to placement on left
     side of IC
#11) A 200um X 200um corner cell placed at (0, 0) covers area to (200, 200)
#12) A 45um X 200um I/O cell placed at 0,200, covers area to (245, 200)
#12) The I/O ring interconnection macro is 410uM (in X), and 10um (in Y)
#13) I/O macros placed in straight columns outer ring at X = 0 inner ring at
     X = 200
#14) Outer I/O ring has four 50um filler cells by the inner I/O ring corner
     cell. I/O
# power and I/O ground supply I/O macros don't require signal connections
     to the
# IC's core, and are good candidates for placement by inner ring corner
     cells.

# Example script to place outer ring I/O macros along left side of I/C
# Script indexes through example ordered outer I/O ring macro list provided
     below.
# Placements of outer ring I/O filler cells have been included for
     illustrative purposes,
# Many design flows automatically add filler cells into gaps between I/O
     macros.
Place lower corner cell at            X = 0 Y = 0
Place 50um I/O filler cell. at           X = 0     Y = 200
Place 50um I/O filler cell. at           X = 0     Y = 250
Place 50um I/O filler cell. at           X = 0     Y = 300
Place 50um I/O filler cell. at           X = 0     Y = 350
Place outer I/O macro #0 at           X = 0 Y = 410
Add 5um I/O Filler cell at            X = 0 Y = 455
Place outer I/O macro #1 at           X = 0 Y = 460
Add 5um Filler cell at       X = 0    Y = 505
Place outer I/O macro #2 at           X = 0 Y = 510
Add 5um I/O Filler cell at            X = 0 Y = 555
Place outer I/O macro #3 at           X = 0 Y = 560
Add 5um I/O Filler cell at            X = 0 Y = 605
Place outer I/O macro #4 at           X = 0 Y = 610
Add 5um I/O Filler cell at            X = 0 Y = 655
Place inter_con_low_left at           X =0  Y = 660
Place outer I/O macro #4 at           X = 0 Y = 670
#Ordered list of left side outer ring I/O macro instance names
outer_low_left_corner       (200uM wide, corner cell)
```

-continued

| | |
|---|---|
| I/O_Filler | (50um wide) |
| I/O_Filler | (50um wide) |
| I/O_Filler | (50um wide) |
| I/O_Filler | (50um wide) |
| outer_ring_io0 | (45um wide, Bidir I/O macro) |
| outer_ring_io1 | (45um wide, Bidir I/O macro) |
| outer_ring_io2 | (45um wide, Bidir I/O macro) |
| outer_ring_io3 | (45um wide, Bidir I/O macro) |
| outer_ring_io4 | (45um wide, Bidir I/O macro) |
| inter_con_low_left rings) | (10um wide, occupies both outer and inner I/O |
| outer_ring_io5 | (45um wide, Bidir I/O macro) |

\# Example script to place inner ring I/O macros along left side of I/C
\# Script indexes through example inner ring I/O ring macro list provided
   below
\# The starting coordinate of (210, 210) is determined by the upper right
   corner of the
\# inner I/O ring's lower left corner cell (200, 200) plus (10um, 10um) to
   account for
\# the FTF's cells having 10um more depth than the outer ring I/O macros.

| | | |
|---|---|---|
| Place inner_low_left_corner | X = 210 | Y = 210 |
| Place inner I/O macro #0 at | X = 200 | Y = 410 |
| Place inner I/O macro #1 at | X = 200 | Y = 460 |
| Place inner I/O macro #2 at | X = 200 | Y = 510 |
| Place inner I/O macro #3 at | X = 200 | Y = 560 |
| Place inner I/O macro #4 at | X = 200 | Y = 610 |
| #inter_con_low_left script) | | (placed with outer I/O ring |
| Place inner I/O macro #5 at | X = 200 | Y = 670 |

\#Ordered list of left side inner ring I/O macro instance names

| | |
|---|---|
| inner_low_left_corner | (200uM wide, corner cell) |
| inner_ring_io0 | (50um wide, FTF cell) |
| inner_ring_io1 | (50um wide, FTF cell) |
| inner_ring_io2 | (50um wide, FTF cell) |
| inner_ring_io3 | (50um wide, FTF cell) |
| inner_ring_io4 | (50um wide, FTF cell) |
| inner_ring_io5 | (50um wide, FTF cell) |

A similar approach with appropriate placement coordinates would be used to add additional I/O's to complete an IC's left inner and outer I/O rings. An analogous approach would also be used to place inner and outer ring I/O macros along the top, right and bottom sides of the IC. Filler cells are often added after the functional I/O cells are placed, and are included in the above example to help demonstrate alignment of the inner and outer I/O macros. Also note outer ring I/O macros without signals going to the core don't require corresponding inner ring FTF cells. This approach would result in having I/O placement coordinates that have a regular pattern than those shown in the above example. For complex implementations it is a good design practice to calculate the I/O macro's placement coordinates based on the coordinates of the previous I/O macro plus the previous macro's width and any extra space being added between the I/O macros. Variables would need to be defined and used in the I/O placement script to support these I/O macro placement coordinate calculations. It is also possible to develop an intelligent inner I/O ring placement script that places FTF cells and inner I/O macros based on the outer I/O ring macro placement coordinates. One skilled in the art will be able to develop and customize appropriate I/O macro placement scripts for multiple I/O ring designs using FTF cells and I/O ring interconnection cells.

It is a standard design practice to insure that all designs, including designs with multi I/O rings using FTF and I/O inter-connection macros to pass logical simulations, static timing analysis, LVS, DRC and formal design verification design checks. These checks are needed to insure the simulated behavior of IC design model matches the behavior in actual silicon. It is also a common practice to support JTAG, informally known as boundary scan testing, in IC's. Typical FTF cells contain only buffers, which have little impact on JTAG logic, which largely involves muxes and flip flops. It follows that someone skilled in the art will be able to implement the needed JTAG test circuitry that supports this invention using EDA tools and techniques consistent with other IC designs.

I/O Ring Embodiments with Complex Specialty I/O Macros

In further embodiments, a large variety of complex specialty I/O macros can be placed in I/O rings that require isolated power and or ground supplies. These specialty I/O macros provide mixed analog-digital functions such as high performance Low Voltage Differential Swing (LVDS) I/O macros, PLL (Phase Lock Loop), DLL (Delay Lock Loop) RF I/O functions and so forth. For purposes of example PLL and LVDS I/O's are commonly used and are representative of other specialized I/O macros. Also note, LVDS I/O macros are often connected to high speed serializer-deserializer (Serdes) macros in the adjacent core area. The LVDS I/O macros and the PLL used in the example below are not intended to limit the scope of this invention to IC's with LVDS I/O macros and or PLL's.

FIG. 24 shows a high level example of an IC that has two concentric I/O rings that includes three parallel sets of LVDS macros plus one PLL. The LVDS macros are connected to adjacent Serdes macros in the core area. Assuming specialty I/O macros have timing and or noise sensitive signals going to and from the IC's core these I/O macros should be placed in the IC's innermost I/O ring to provide better signal access to the IC's core. Design implementation guidelines are usually provided along with specialty I/O macros. These guidelines cover various issues such power and or ground supply and isolation requirements, high speed signal routing requirements and so forth and these guidelines would need to be met when designing an IC with either a single I/O ring or multiple I/O rings. For example, some of the specialty I/O macros require local power and or ground supplies that are isolated from neighboring I/O ring supplies. In this case abutment based I/O ring connections between isolated local supplies in the specialty I/O macro and corresponding I/O ring supplies in neighboring I/O macros should be avoided. Supplies to other I/O macros in the I/O ring could use I/O inter-connection macros to divert continuous I/O ring supply connections around the specialty I/O macros.

One skilled in the art will be able to evaluate the design tradeoffs, make interconnection cell modifications and or avoid abutment based I/O ring supply connections to support local supply isolation in specialty I/O macros. The example in FIG. 24 shows two parallel LVDS I/O macros embedded in the inner I/O ring plus one parallel LVDS macro on the right side that is turned sideways and embedded in both the inner and outer I/O rings. The two LVDS I/O macros and the PLL macro placed in the inner I/O ring would block the core access of I/O macros that are behind them in the outer I/O ring. It follows that outer ring I/O macros without core connections could be placed in these blocked areas or a high capacity FTF cell could be designed and used to connect signals from low performance I/O macros in the outer I/O ring around LVDS macros or around PLL's to and from the IC's core. Also note, specialty I/O macros are often much wider than standard I/O macros so the specialty I/O macros would disturb the alignments of neighboring inner and outer ring I/O macros. I/O filler cells can be added to realign outer I/O ring macros to the inner I/O ring macros, and two examples of this are shown on the left and bottom sides of FIG. 24. An alternate design approach, for cases that don't require two fully populated I/O rings, would be to group the LVDS, PLL and or other specialty I/O macro(s) in the inner ring along a side of the IC and not place any outer ring I/O macros behind them. Designers could potentially exploit the increased I/O ring depth when there are two or more I/O rings and use customized I/O macros designed to have signal directions that support this sideways orientation. In this manner a greater number of specialty I/O macros could fit along the side of an IC, occupying space that would otherwise be occupied by the outer I/O ring. The parallel LVDS I/O macro on the right side of FIG. 24 shows an example of a sideways specialty I/O macro orientation.

Additional Multi-IO Ring Embodiments

The initial description of this invention focused on IC's with two concentric I/O rings. The concept of using FTF cells and I/O inter-connection macros can be extended from two I/O rings, to three I/O rings, to four I/O rings and so on to N I/O rings. FIG. 25 shows an example embodiment with three I/O rings. As in the two I/O ring example, the outermost I/O ring can use standard I/O filler cells. The second outermost I/O ring uses FTF cells designed to pass signals for the outer ring I/O macros. The third outermost I/O ring would need FTF cells with enough capacity to pass signals for the outermost I/O and the second outermost I/O rings. In cases having 4 I/O rings, the fourth outermost I/O ring would need FTF cells designed to have the capacity to pass I/O signals to the outermost three I/O rings and so forth. Assuming the innermost I/O ring is number N the corresponding innermost I/O ring FTF cells would need to support core signal connections from N−1 outer I/O macros. The inner I/O rings could be implemented with higher capacity FTF cells or lower capacity parallel FTF cells. The I/O ring interconnection cells would also need to be enlarged to cross connect corresponding supplies from the additional I/O rings. IO inter-connection macro design and architecture would remain similar to the previous description, but these cells would need to be enlarged to connect to the additional I/O rings. I/O ring interconnection cell depth would be given by the sum of the depths of the I/O macros in the N rings plus the sum of the ring to ring spacing. The I/O ring interconnection cell width should remain similar to embodiments that are used with two I/O rings. FIG. 25 doesn't limit the scope of this invention to having more than two I/O rings surrounding only one core area. Additional core areas could be placed between I/O rings rather than having multiple abutted I/O rings. Various permutations of multi-IO ring embodiments are provided below. These embodiments are illustrative and aren't intended to be exhaustive. Additional I/O ring embodiments will be evident to one skilled in the art Aside from placing the I/O macros in rings, it is also possible to design a multiple I/O ring implementation where sides of the IC have differing I/O macro depths. For example, there could be a complete I/O ring around the entire core area plus an extra row of I/O macros along one or more sides of the IC. FIG. 26 shows an example of an IC with an inner I/O ring and extra stripes of interconnected I/O macros have been placed along the outer left and right sides. Similar implementations could have extra I/O ring stripes along the top and or bottom sides.

The concept of having stripes of I/O macros interconnected with the I/O ring(s) can also be extended to I/O rings that traverse the core area, which effectively partitions the core area. FIG. 27 shows an example of an IC with an outer I/O ring surrounding two inner I/O rings that surround two respective core areas. This approach can be very useful isolating core areas that have differing VDD supply voltages. FIG. 28 shows an example of an IC having an outer I/O ring that surrounds a core area plus two additional inner I/O rings that surround two more respective core areas.

These multi I/O ring embodiments could be further extended to embodiments that rely on adding partial I/O rings and or stripes of I/O macros, rather than complete I/O rings. FIG. 29 shows an example of an outer I/O ring that surrounds core area #1 plus an inner I/O ring that surrounds core area #2. The left side of the inner I/O ring effectively partitions the IC's core area into two sections, but core area #1 isn't surrounded by a complete stand alone I/O ring. FIG. 30 shows an example of an outer I/O ring that surrounds two relatively large core areas that have been partitioned by a vertical I/O macro stripe. This example doesn't have inner I/O rings. In FIG. 30 the I/O ring signals in vertical I/O stripe that partition the core area result in having a T shaped intersection with the I/O macros in the upper and lower sides of the I/O ring. FIG. 31A shows a detailed view of the T intersection along the top side of the IC shown in FIG. 30. In this case a T intersection macro is used to connect I/O supply rings in the vertical I/O macro stripe with the I/O supply rings in the horizontal stripe of the upper I/O ring. The design requirements for a T-interconnection cell are similar to the I/O inter-connection cell described above. However, the size and layout of the cell would differ because the vertical I/O stripe would be perpendicular to the I/O ring. It follows that the I/O ring power and ground supply signals would need to jog through right angles to make corresponding connections. The well regions and if applicable the diffusion regions should remain consistent with those in the neighboring vertical and horizontal I/O macros. However, neither the well nor the diffusion regions need to pass between the row of vertical I/O macros and column of horizontal I/O macros, the metal I/O ring connections should be sufficient. A detailed example of this approach is shown in the T-interconnection cell in FIG. 31A. Most EDA tools work well with rectangular macros, but T-interconnection cells would often have L shapes, which could create design flow and or EDA tool problems. The example illustrated in FIG. 31A shows a T-intersection macro based on two perpendicular macros that are both rectangular and connected together by abutment. One macro is embedded in the I/O ring, and the other at the end of the vertical I/O macro stripe. If the I/O stripe crossing the IC's core was horizontal, it would intersect vertical I/O ring macros on the left and right sides of the IC. In this case the T intersection cell design should be the same, but its' placement would be rotated by 90 degrees.

FIG. 31B shows a detailed view of an I/O macro intersection along the bottom side of an IC. Also note, FIG. 31B is a detailed view of FIG. 30. The FIG. 31B implementation is similar to the implementation shown in FIG. 31A, but it relies on I/O ring connections made using a three-way corner cell that connects I/O rings to I/O macros on three adjacent sides. Due to the relatively large size of the corner cells this approach would be less area efficient than the T-interconnection approach shown in FIG. 31A. However, three-way corner cells should be easier to implement since their design is based on pre-existing corner cell designs and they only require one additional I/O ring port interface whose design and layout would be analogous to the existing interfaces. Some pre-existing corner cell designs utilize internal segments with 45 degree routing angles rather than right angle I/O ring routing, one skilled in the art will also be able to adapt the 45 degree routing versions of pre-existing design to produce a three-way corner cell. Also note, like unmodified corner cells, I/O filler cells, and FTF cells, the three-way corner cell and the I/O ring interconnection cells should have well and if applicable diffusion regions that are consistent with their neighboring I/O macros. Refer to the FTF cell layout design materials above for more detailed information. In addition, FIG. 26 provides a high level view abutting an unmodified corner cell against a three way corner cell to support adding an outer I/O stripe to an IC. The design requirements, design tradeoffs, and implementation of T-interconnection cells and Three-way corner cells will be evident to one skilled in the art.

The core areas shown in FIG. 31A and FIG. 31B have been partitioned by a vertical set of I/O macros. The FTF cells in these embodiments need to support a core area to core area interface rather than the previous FTF cell examples, which support I/O macro to core area interfaces. Most I/O macros contain embedded level shifters, so signals coming out of the I/O macros would already be compatible with the destination core voltage in corresponding I/O to core FTF cells. In most cases I/O to core FTF cells should use buffers to pass signal since the voltage levels are compatible. Core to core FTF cells could pass signals between logic with different voltage levels. A detailed view of core to core FTF cells shown in FIG. 31B has been provided in FIG. 31C. Note that FIG. 31C shows an FTF cell with buffers and/or level shifters and/or isolation gates and/or flops passing signals from Core Area 1 to Core Area 2 and an FTF cell with buffers and/or level shifters and/or isolation gates and/or flops passing signals from Core Area 2 to Core Area 1. The signals inside theses core to core FTF cells don't have to jog around I/O macros, so core to core FTF cells can be the same length as their neighboring I/O macros. The width of core to core FTF cells would be dependent upon the number of signals and buffers and/or level shifters and/or isolation gates passing through them, where additional signals would require a larger core to core FTF cell. All signals in the upper core to core FTF cells in FIG. 31C flow from core area 2 to core area 1. All signals in the lower core to core FTF cell flow from core area 1 to core area 2. A core to core FTF cells could also be designed to pass one set of signals from Core Area1 to Core Area2 and a different set of signals from Core Area2 to Core Area 1. A further core to core FTF cell embodiment could support bidirectional signal lines to make feed through connections between the core areas, which would require fewer signal, but more complex control circuitry.

While complex functions such as boundary scan, multiplexing, error checking (parity, one-hot, etc), etc; can also be added to a functional FTF cell, the cell designer should keep in mind that the relatively high noise level and limited number of metal layers available in the FTF cell will often determine which complex functions could be added to a functional FTF cell. Many of the upper metal layers in functional FTF cells would need to be used for I/O ring power and ground routing, other potential ring signal routing and if necessary shielding for sensitive FTF signals in lower metal layers. Additionally while I/O ring inter-connection cells, I/O T-connection cells and 3 way-corner cells could contain functional circuitry, like normal FTF cells, but they will be under even tighter noise and routing constraints then normal FTF cells.

Assuming the partitioned core areas in FIG. 31C have differing VDD core supply voltages, level shifters which are basically modified buffers that use both VDD supply voltages, would needed to handle signals passing from the lower voltage supply core area to the higher voltage supply core area. Assuming these level shifters are placed in corresponding core to core FTF cells, then these core to core FTF cells would need ports that access both the lower and higher VDD supply voltages. From a design view point, level shifters are considered optional for signals passing from higher voltage supply areas to lower voltage supply areas. Level shifters could be added to core to core FTF cells, which provides a simple embodiment, or the core to core FTF cells could contain buffers which then drive level shifters that are placed in the destination core area. FIG. 31C shows an example application, where the I/O labeled Input Macro provides an input signal shown with an arrow to Core Area2, this signal is also being fed through the neighboring FTF cell to go to Core Area1. If Core Area1 uses a lower supply voltage than Core Area2, a level shifter should be used in the upper FTF cell to provide compatible signaling voltage for the branch going to Core Area 1.

Another detailed implementation of the core to core FTF cells shown in FIG. 31B has also been provided in FIG. 31D. In this example assume Core Area 1 always receives an active VDD supply and Core Area 2's VDD supply can be turned on or off. Core Area 2's output signals would float when VDD to Core Area 2 is powered down, and these floating output signals could potentially drive active logic in the Core Area1. Floating signals shouldn't drive active logic because this can cause huge cross over currents. To resolve this problem floating signals that could potentially drive active logic should be replaced with known defined "1" or "0" logic signals by passing them through isolation gates. Isolation gates often utilize a control signal that indicates when the input signal is valid or floating. Based on this control signal, isolation gates pass either valid input signals or replace floating input signals with known defined "1" or "0" signals. The upper FTF cell in FIG. 31D includes two isolation gates that share a common isolation control signal, named Iso_control signal. The lower FTF cell in FIG. 31D doesn't utilize isolation gates since Core Area 1 is always powered on and won't produce floating signals. Isolation gates can be placed inside the FTF cells, so that potentially powered down signals don't drive active buffers in the FTF cells. Some library cell designs combine isolation, level shifter and or buffer functions into a single cell. Core to core FTF cells that meet design specific requirements requiring buffering, level shifting and/or isolation gate functions can be provided according to specific embodiments of the invention. High capacity core to core interface FTF cells can also be designed according to the teachings of this invention to pass greater numbers of signals between the two partitioned core areas. These can be similar to the example shown in FIG. 23B, but use straight signal routing rather than having to jog around an obstructing corner cell.

According to specific embodiments of the invention, FTF cells between the outer ring I/O macros and the inner ring I/O macros can include further circuitry to support additional functions or can include space specifically reserved to allow placement of additional macros or hand routed signals for customized designs. As an example, pipeline flip flops may be located inside the FTF cells so the flip-flops are in close proximity to corresponding I/O macros and help improve I/O signal performance. In another example, JTAG boundary scan logic that supports the outer I/O ring macros can be placed in nearby FTF cells to improve performance and off-load boundary scan routing overhead from the core area. The JTAG boundary scan chains are connected together by abutment when the inner and outer I/O rings are implemented. The logical implementation of the JTAG test circuitry should match a core area based JTAG logical implementation. In other embodiments, placing double data rate (DDR) flip flops and interface logic in the corresponding FTF cells can be used to support high performance outer I/O ring DDR I/O macros. DDR interfaces speed up data throughput by using both the positive and negative clock edges to clock data into memory rather than transferring data on a single clock edge. Interface logic is used to convert the positive and negative clocked data into parallel streams of data using the same clock edge. Newer versions of DDR memory such as DDR3 may double the clock rate while using both clock edges, thus transferring data at an 8× rate. The FTF cell interface with the outer ring I/O macro going to DDR memory provides a single stream of data at the higher clock rate, while the FTF cell's core interface provides a wider data stream at the single edge core clock rate. As a general rule, logic functions that have relatively little connectivity to the core area or analog functions that should be isolated from the core area are good candidates for placement in FTF cells or between the I/O rings to improve isolation. FIGS. 32A, 32B and 32C show examples of FTF cells that support different I/O interface functions. FIG. 33A shows a detailed core to I/O FTF cell that registers data with a flip flop and level shifter located on the left side of the FTF cell. FIG. 33B shows a detailed I/O to core FTF cell with buffers, level shifters and a 2 to 1 Mux located on the right side of the FTF cell. The locations of the buffers, level shifters, logic cells, flip flops etc. within the FTF cells is largely dependent upon power supply availability, signal noise, transistor sizes, signal count, FTF cell area minimization, and so forth. Additional core to I/O and I/O to core FTF cell functions will be understood by those of skill in the art having the benefit of the teachings provided herein.

In addition to designing and using dedicated FTF cells some low complexity inner I/O cells could potentially be enhanced to accommodate feed through signals is a manner similar to using FTF cells. This could be done to help further optimize the I/O ring layout, although in most cases the use of the dedicated FTF cells as described above is more likely to support greater design flexibility. As noted earlier I/O macros with active functions such as input, output, and bidirectional are poor candidates for adding signal feed-throughs due to lack of routing resources. Less complex I/O macros such I/O power and I/O ground supply macros or other macros with relatively little internal circuitry may have sufficient available space for signal feed-throughs without requiring a major redesign and re-verification efforts. FIG. 34 is a detailed example of an I/O VSS supply cell that also provides an input signal feed-through signal with a buffer and ports. One skilled in the art will be able to evaluate design tradeoffs for adding feed through signals to existing I/O cell library cells and FTF like functions that are likely to provide reasonable design embodiments. This approach provides an alternative to the previously described use of dedicated FTF cells.

Embodiments with Power Supply Feed Throughs

Aside from supporting multiple I/O rings this invention can be extended to support designs with interconnected I/O stripes. FIG. 35A shows an example of an IC with a voltage control and regulation area that has been isolated from the main core area that is within an inner I/O ring. The main core area could have voltages islands, areas with differing VDD supply levels, and or power islands areas in which the power could be turned on or off. The voltage control and regulation area can provide various independent power supplies to the main core area. These power supplies could use FTF supply cells for power distribution.

An example of this approach is provided in FIG. 35B, which is a detailed view of FIG. 35A, where FTF supply cells are used to connect the voltage control and regulation gated power supplies to the digital core area. In this example the two FTF cells are connecting different core supply voltages, but the two FTF cells could connect the same core supply voltage if needed. In any event, the gated core supply signals would need to be much wider than ordinary digital signals, since power supply routes have ample current and require low resistance. Specific design requirements and solutions are design dependent and will be evident to someone skilled in the art. The gated core supply routes should also be in the lower routing layers so they don't block the inner I/O ring power and ground rings. Additional similar approaches and embodiments will be evident to one skilled in the art.

Embodiments with Wire Bond Packages

Portions of the above description use as an example a flip chip package that supports flexible I/O macro placement and flexible bond pad to package connections. Advanced wire bond packages are becoming more adaptable, and in specific embodiments the invention can also be used in multi-tiered wire bond packages. Some multi-tiered packages allow crossing bond wires, assuming the package's outer tier bond posts are physically raised well above the inner tier bond posts, so that the crossing outer and inner bond wires do not touch. FIG. 36A shows an example of an IC in a wire bond package with an additional stripe of inner I/O macros that border the outer I/O ring on the left side. FIG. 36A also shows two example bond wire connections along the IC's upper left side. FIG. 36B is similar to FIG. 36A but narrow core area 2 has been added and it separates the inner I/O macro stripe from the outer I/O ring macros on the left side. Furthermore, two three-way corner cells of the invention are used to interconnect the vertical stripe of I/O macros in FIG. 36B to the outer I/O ring. In effect this forms one continuous I/O ring topology that has an extra branch that traverses the core area. FIG. 36B also shows two example bond wire connections along the upper left side of the IC that go to a higher-outer and a lower-inner bond post. A third bond wire connection is shown on the lower left side and connects an I/O stripe macro to an outer I/O ring macro. FIG. 37 shows an example of an IC with complete inner and outer I/O rings that is in a two tiered wire bond package in which four bond wire connections have been illustrated. Many additional bond wire connections would normally be made in actual designs, but the number is reduced in these illustrations for the purposes of clarity.

A new packaging solution called SIP (system in package) can support stacked die arrangements, where a small IC can be placed upon a large IC inside a common package. An upper stacked IC with bond pads on four sides would be difficult to accommodate using existing technology because I/O macros on two sides of the upper IC would be located far from the outer edge of the lower IC. The I/O region stripe described above can be used to support bonding connections to upper IC's in SIP packages that have bond pads on more than two sides. FIG. 38A shows an example of a stacked die, where the upper IC has bond pads along all four sides. To support this configuration the lower IC has a partial I/O ring in its' core area that uses three way corner cells for integration with the outer I/O ring. Using this integrated topology helps minimizes I/O noise and improves ESD protection. This example shows external bond wire connections to I/O macros on the top and right sides of both IC's. The bond pads on the left and bottom sides of the upper IC are have bond wire connections to the I/O macros in the I/O stripes in the core of larger IC that lies underneath. This example also shows bond pads along the top sides of both the upper and lower IC's that have bond wires going to shared bond posts for access to common external signals. The bond pads along the right sides of both the upper and lower IC's show example bond wire connections to separate bond posts for separate external signal connections. In general, if the upper IC has mixed analog and digital signals, the analog signals frequently require separate off chip connections through the package. Many common digital signals would be shared between the two stacked IC's and these could be connected directly between the upper and lower IC without using external package pins. The flexibility of adding I/O macro stripes to the lower IC supports having greater numbers of inter-chip bond wire connections as well making bond wire connections to upper IC's that have I/O's on more than two sides. Additional configurations of upper chip to lower chip bond wire connections will be evident to one skilled in the art. FIG. 38B is similar to FIG. 38A, but small IC #2 has been added, and it is also located on top of the large IC #1. Small IC #2 only has bond pads along one side, which is similar to solutions available in the current art. However, the combination of a SIP package containing a large ASIC plus small IC #1 with bond wire connections to all four sides and small IC #2 using bond connections along one side represents an additional embodiment of this invention that combines both new and prior art. It will be evident to one skilled in the art that this invention can be extended to cover further SIP package embodiments that contain greater numbers of stacked IC's requiring bond wires connected around the periphery of the large IC as well as within the core of the large IC.

Embodiments Using COC Packages

In further embodiments, I/O region interface cells facilitate multi-region I/O designs that can be used to enhance advanced CoC (Chip on Chip) packaging designs. Chip on Chip involves turning small upper IC(s) upside down and using solder bumps to make direct connections to a large lower IC. By supporting flexible placement of I/O macro rings and or I/O stripes in the core area, specific embodiments enable the lower IC to have I/O macros and solder bump locations that physically match the I/O macro and solder bump locations of the targeted upper IC(s). In specific implementations, only the lower IC might have multiple I/O regions to support and match solder ball connection locations to the upper IC. FIG. 38C shows an example. The large lower IC has a complete inner I/O ring that is integrated with a complete outer I/O ring using three way corner cells according to specific embodiments. This inner I/O ring is used to make lower IC I/O ring-macro to upper IC I/O ring-macro connections using solder bumps on the bond pads openings. FIG. 38C also shows an example bond wire connections being made between the outer ring of the lower IC and the package bond pad posts. Also note, the lower IC in FIG. 38C has a complete inner I/O ring whose power and ground supplies are cross-connected to corresponding supplies in outer I/O ring. This effectively combines the I/O rings of the upper and lower IC's, which improves the ESD protection of the lower IC, which has the external package connections. The large IC in FIG. 38A represents a different approach, which contains a partial inner I/O ring rather than a complete inner I/O ring. Three-way corner cells are used to directly connect the power and ground rings of the partial inner I/O ring to the power and ground rings of the outer I/O ring.

Embodiments with In-Line and Staggered I/O Macros

As discussed above, the invention in specific embodiments involves implementations with I/O macros connected to CUP (circuit under pad) bond pads. Other embodiments involve in-line and or staggered bond pads. For reference FIG. 7 (prior art), shows examples of in-line, staggered and CUP bond pads that have been attached to I/O macros. FIG. 39 is a detailed side view of the IC shown in FIG. 11. FIG. 39 illustrates inner and outer I/O ring macros using in-line bond pads along with FTF macros designed to route outer ring signals around the inner in-line bond pads to the IC's core. FIG. 12 is also a detailed view of FIG. 11, but FIG. 12 reflects a similar design with I/O macros that use CUP bond pads. A comparison of the detailed embodiments in FIG. 39 and in FIG. 12 helps illustrate the design differences involved using FTF macros with in-line bond pads versus CUP bond pads. FIG. 40 is a detailed side view of the IC in FIG. 11. FIG. 40 shows inner and outer I/O ring macros using staggered bond pads along with FTF macros designed to route outer ring signals around the inner staggered bond pads to the IC's core. These outer I/O ring signal wires will need to detour around the inner ring staggered bond pads. This results in having to offset the FTF cells relative to the inner ring I/O macros in order to provide room for these routing signal detours. The example in FIG. 40 aligns the FTF cells to the bond posts of the inner ring I/O macros. A comparison of the embodiments in FIG. 40 and in FIG. 12 helps show the design differences involved in using staggered bond pads versus CUP bond pads. A comparison of the implementations in FIG. 39 and FIG. 40 versus FIG. 12 helps illustrate why CUP bond pad embodiments are usually more area efficient than in-line bond pad and staggered bond pad embodiments. CUP bond pads reduce the size of the I/O region area, minimize the physical separation between the inner and outer I/O ring macros, and provide shorter-cleaner signal connections through the FTF cells to and from the IC's core. If CUP bond pads are unavailable in the target IC fabrication process, than embodiments of this invention could be designed to utilize in-line and or staggered bond pads along with appropriately designed FTF cells. In most cases the CUP bond pad implementations of this invention would be more optimal, but there may be unusual special case embodiments that are more optimal when implemented with mixtures of in-line, staggered, and or CUP bond pads.

Embodiments for Field Programmable Gate Arrays (FPGAs)

The previous material focused on design solutions with outer I/O ring macros that have known fixed functions, as would be the case for most ASIC's (application specific IC's), memory IC's (SRAM's, DRAM's, ROM's etc), Analog IC's, mixed signal IC's, RF (radio frequency) IC's, MPU (microprocessor unit) IC's, GPU (graphics processor unit) IC's and so forth. FPGA's (Field Programmable Gate Arrays), however, are known to contain I/O macros that are configured during a programming step that occurs after fabrication. FPGA I/O macros often have programmable rather than fixed I/O functions and these programmable FPGA I/O macros are often designed to support bidirectional operation. During programming these bidirectional I/O macros can be configured to support input, output or three-state or bidirectional functions.

According to specific embodiments, FTF cells can be used in an FPGA implemented with multiple I/O rings. The FPGA's FTF macros in this embodiment support bidirectional outer ring I/O macro operation. Like the standard FPGA I/O macros, the FPGA's FTF are configured during programming to select the functions of corresponding bidirectional outer ring I/O macros. FIG. 18C, which is a detailed view of FIG. 13, shows an example FTF cell containing dynamically configurable flip flops. In a similar manner, FTF cells in FPGA's according to specific embodiments of the invention include flip flops or similar circuit elements that can be programmed by an FPGA user to dynamically select outer ring I/O macro functions. In alternative embodiments, flip flops that program the outer I/O ring I/O macro functions can be located in the FPGA's core and control signals passed through the FTF cells are used to configure and connect corresponding outer ring I/O macros. In other embodiments, flip flops in the FTF cells are replaced with other analogous programmable logic circuits to control outer ring I/O macro functions.

As described above, special I/O cells according to specific embodiments can be developed as provided herein to be fully compatible with the target I/O library's 's implementation and are validated for the target fabrication process. The target I/O library may be supplied by a third party vendor, which means it would be commonly available. The target I/O library could also be a proprietary I/O library with very limited availability and special I/O cells according to specific embodiments can be designed and supplied internally as part of or supplemental to a proprietary I/O cell library.

This invention is not limited to CMOS or any other specific IC fabrication technology and can be applied to any IC technology, by an I/O cell designer skilled in the art of that technology and then used by a chip designer also skilled in the art of that technology.

Embodiment in a Programmed Digital Apparatus

The invention may be embodied in a fixed media or transmissible program component containing logic instructions and/or data that when loaded into an appropriately configured computing device cause that device to perform in accordance with the invention.

As will be understood to practitioners in the art from the teachings provided herein, the invention can be implemented in hardware and/or software. In some embodiments of the invention, different aspects of the invention can be implemented in either client-side logic or server-side logic. As will be understood in the art, the invention or components thereof may be embodied in a fixed media program component containing logic instructions and/or data that when loaded into an appropriately configured computing device cause that device to perform according to the invention. As will be understood in the art, a fixed media containing logic instructions may be delivered to a user on a fixed media for physically loading into a user's computer or a fixed media containing logic instructions may reside on a remote server that a viewer accesses through a communication medium in order to download a program component.

Figure 41:
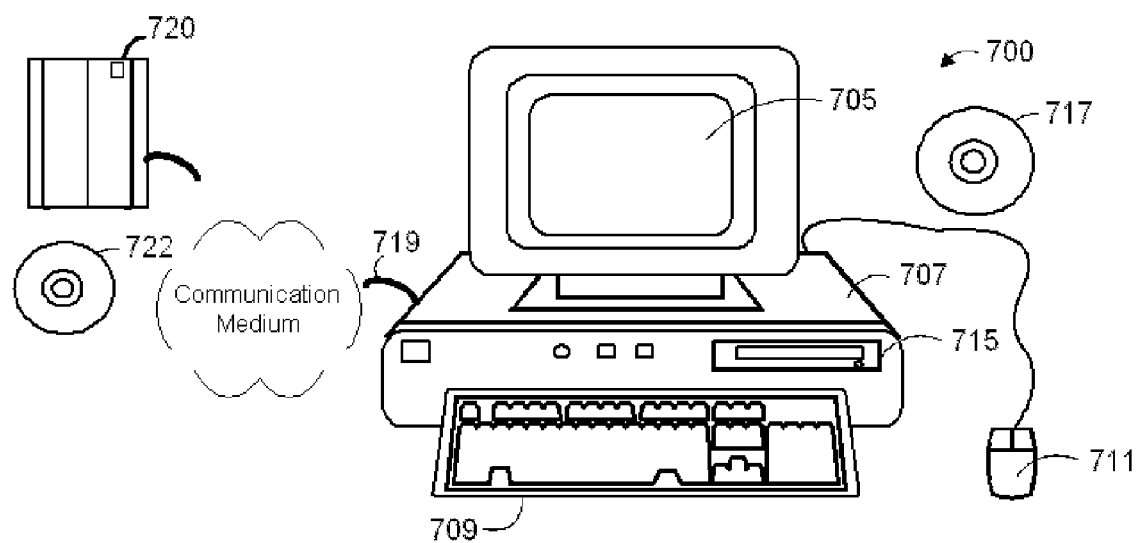
FIG. 41 shows an information appliance that can be used to perform various circuit design functions according to specific embodiments of the invention.

FIG. 41 shows an information appliance (or digital device) 700 that may be understood as a logical apparatus that can read instructions from media 717 and/or network port 719, which can optionally be connected to server 720 having fixed media 722. Apparatus 700 can thereafter use those instructions to direct server or client logic, as understood in the art, to embody aspects of the invention. One type of logical apparatus that may embody the invention is a computer system as illustrated in 700, containing CPU 707, optional input devices 709 and 711, disk drives 715 and optional monitor 705. Fixed media 717, or fixed media 722 over port 719, may be used to program such a system and may represent a disk-type optical or magnetic media, magnetic tape, solid state dynamic or static memory, etc. In specific embodiments, the invention may be embodied in whole or in part as software recorded on this fixed media. Communication port 719 may also be used to initially receive instructions that are used to program such a system and may represent any type of communication connection.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be an Intel (e.g., Pentium or Core 2 duo) or AMD based computer, running Windows XP or Linux, or may be a Macintosh computer.

The invention claimed is:

1. A method for enabling a computer system to create an integrated circuit (IC) design with multiple I/O regions comprising at least one outer I/O region and one inner I/O region, the method comprising:
   providing a plurality of interconnect macros describing electronic circuits, the interconnect macros on a tangible computer readable media readable by the computer system, the interconnect macros providing at least one lateral power or ground path for laterally connecting power or ground signals in an I/O region, said interconnect macros also providing at least one interconnect signal path for connecting signals between or through I/O regions;
   providing a set of I/O macros describing electronic circuits, the I/O macros and readable by the computer system;
   so that the computer system is able to place one or more of the set I/O macros into at least one outer I/O region and one inner I/O region;
   so that the computer system is able to place at least one interconnect macro in at least one inner I/O region: and
   wherein a macro is a descriptor of a cell of an integrated circuit and wherein the set of I/O macros includes filler macros with lateral connections between abutting I/O macros; and the set of interconnect macros comprising one or more interconnect macros with at least one flow-through filler portion having a width roughly equal to the width of a filler macro and containing lateral and transverse connections and at least one inter-region portion that lies between outer I/O region macros and inner I/O region macros and that routes signals from the edge of an inner I/O region around to transverse connections in a flow-through filler portion.

2. The method of claim 1 further comprising:
   providing one or more automated electronic design tools for executing on the computer system for placing said I/O macros and said interconnect macros.

3. The method of claim 2 further comprising:
   using the computer system to place I/O macros into at least two I/O regions comprising an outer I/O region and an inner I/O region;

wherein said two I/O regions provide a compound I/O structure selected from the group:
- a compound I/O structure having two concentric IO rings;
- a compound I/O structure having three or more concentric I/O rings;
- a compound I/O structure having an outer I/O ring surrounding two inner I/O rings that surround two core areas;
- a compound I/O structure having an outer I/O ring surrounding a separate core area plus two inner I/O rings that surround two core areas;
- a compound I/O structure having an outer I/O ring that surrounds a separate core area plus an inner I/O ring surrounding another core area;
- a compound I/O structure having additional I/O Stripes along sides;
- a compound I/O structure having I/O stripes in the core area;
- a compound I/O structure having interconnected partial I/O ring in the core area; and
- a compound I/O structure providing an IC partitioned to have multiple core areas for supply isolation, analog circuitry isolation, and high-speed signal isolation etc.

4. The method of claim 2 further comprising:
using the computer system to place I/O macros into at least two I/O regions comprising an outer I/O region and an inner I/O region; and
connecting one or more I/O macros in said inner I/O region to bond-pads of a chip-on-chip sub-chip.

5. The method of claim 2 further wherein the computer system uses a script processing module.

6. The method of claim 1 further comprising:
providing one or more interconnect macros that have a width of a filler macro of the set of I/O macros.

7. The method of claim 6 further comprising:
providing one or more interconnect macros of an "L" or "T" shape and that have a vertical width of a filler macro of the set of I/O macros.

8. The method of claim 1 further wherein:
flow-through filler portions and inter-region portions can be separately placed macros and can also be grouped into "L" or "T" macros of various capacities.

9. The method of claim 1 further comprising:
the one or more interconnect macros comprises interconnect macros large enough to contain I/O macros.

10. The method of claim 1 further comprising:
placing an inner I/O macro inside an interconnect macro.

11. The method of claim 1 further comprising:
providing one or more interconnect macros selected from the group:
input interconnect macros;
output interconnect macros;
tri-state interconnect macros;
bidirectional interconnect macros;
dynamically configurable interconnect macros;
high capacity interconnect macros;
corner feed-through interconnect macros;
power interconnect macros;
power supply interconnect macros;
I/O ring inter-connection I/O macros;
T-connection interconnect macros;
3 way-corner interconnect macros.

12. The method of claim 1 further comprising:
providing one or more interconnect macros selected from the group:
flow-through macros;
I/O region connector macros.

13. The method of claim 1 further comprising:
providing one or more interconnect macros comprising at least one lateral signal path and at least one transverse power signal path for connecting power lateral signals between an inner I/O region and an outer I/O region.

14. The method of claim 1 further comprising:
grouping one or more interconnect macros and one or more I/O macros into a rectangular unit for placement by the computer system.

15. The method of claim 1 further comprising:
aligning I/O macros in the inner and outer I/O regions with filler cells and interconnect macros as needed.

16. The method of claim 1 further wherein:
a majority of inner region I/O macros and outer region I/O macros are selected from a common set of macros, with the interconnect macros providing necessary spacing and interconnections to allow a common set of I/O macros to be used in inner and outer I/O regions.

17. The method of claim 1 further wherein:
a majority of inner region I/O macros and outer region I/O macros are selected from a common set of I/O macros designed for simple I/O structures without modifications to allow them to be used in compound I/O region designs.

18. A semiconductor integrated circuit of a type constructed using a set of repeated I/O cells in an I/O region and at least one core area, wherein a portion of the I/O region comprises multiple laterally abutting I/O cells, the integrated circuit being of a type having an outer I/O region, the semiconductor integrated circuit comprising:
at least one additional I/O region comprising abutting I/O cells with lateral connections; and
at least one of the repeated I/O cells configured to pass I/O signals through the additional I/O region while also making lateral connections in the additional I/O region and providing at least one lateral power or ground path for laterally connecting power or ground signals in an I/O region and also providing at least one interconnect signal path for connecting signals between or through I/O regions;
at least one of the repeated I/O cells configured with at least one flow-through filler portion having a width roughly equal to the width of a filler macro and containing lateral and transverse connections and at least one inter-region portion that lies between outer I/O region macros and inner I/O region macros and that routes signals from the edge of an inner I/O region around to transverse connections in a flow-through filler portion.

19. The semiconductor integrated circuit of claim 18 further comprising:
at least one of said I/O cells being one or more selected from the group:
input interconnect cells;
output interconnect cells;
tri-state interconnect cells;
bidirectional interconnect cells;
dynamically configurable interconnect cells;
high capacity interconnect cells;
corner feed through interconnect cells;
power interconnect cells;
power supply interconnect cells;

O/O ring inter-connection I/O cells;
T-connection interconnect cells; and
3 way-corner interconnect cells.

20. The semiconductor integrated circuit of claim 18 further wherein:
the additional I/O region is an I/O ring substantially surrounding at least a portion of the core.

21. The semiconductor integrated circuit of claim 18 further wherein:
the additional I/O region is an I/O stripe, receiving at least one signal from an interconnect cell.

22. The semiconductor integrated circuit of claim 18 further wherein:
the outer I/O region is one or more I/O stripes.

23. The semiconductor integrated circuit of claim 18 further wherein:
the additional I/O region is an I/O ring substantially surrounding at least a portion of said core.

24. The semiconductor integrated circuit of claim 18 further wherein:
the additional I/O region provides I/O connections to one or more CoC (Chip on Chip) chips.

25. The semiconductor integrated circuit of claim 18 further wherein:
the IC has I/O regions provide a compound I/O structure selected from the group:
a compound I/O structure having two concentric IO rings;
a compound I/O structure having three or more concentric I/O rings;
a compound I/O structure having an outer I/O ring surrounding two inner I/O rings that surround two core areas;
a compound I/O structure having an outer I/O ring surrounding a separate core area plus two inner I/O rings that surround two core areas;
a compound I/O structure having an outer I/O ring that surrounds a separate core area plus an inner I/O ring surrounding another core area;
a compound I/O structure having additional I/O Stripes along sides;
a compound I/O structure having I/O stripes in the core area;
a compound I/O structure having interconnected partial I/O ring in the core area; and
a compound I/O structure providing an IC partitioned to have multiple core areas for supply isolation, analog circuitry isolation, and high-speed signal isolation etc.

26. The semiconductor integrated circuit of claim 18 further wherein
a plurality of the I/O cells provide lateral I/O macro connections to efficiently distribute I/O and core power and ground supplies to the I/O cells and thus minimize I/O signal noise and maximize electrostatic discharge (ESD) protection;
a plurality of the I/O cells contain interface circuitry for higher supply voltage external signals and for lower supply voltage core signals; and
a plurality of the I/O cells are typically to bond pads that in turn are connected to external pins, leads or solder bumps on the IC's package.

27. The semiconductor integrated circuit of claim 18 further wherein:
at least one of said I/O regions contains one or more programmable I/O cells; and
at least one interconnect macro contains programmable circuitry.

* * * * *